United States Patent
Luby

(10) Patent No.: US 10,191,808 B2
(45) Date of Patent: Jan. 29, 2019

(54) SYSTEMS AND METHODS FOR STORING, MAINTAINING, AND ACCESSING OBJECTS IN STORAGE SYSTEM CLUSTERS

(71) Applicant: QUALCOMM Incorporated, San Diego, CA (US)

(72) Inventor: Michael George Luby, Berkeley, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/661,819

(22) Filed: Jul. 27, 2017

(65) Prior Publication Data

US 2018/0039543 A1    Feb. 8, 2018

Related U.S. Application Data

(60) Provisional application No. 62/371,071, filed on Aug. 4, 2016.

(51) Int. Cl.
| | |
|---|---|
| H03M 13/00 | (2006.01) |
| G06F 11/10 | (2006.01) |
| H03M 13/15 | (2006.01) |
| G06F 3/06 | (2006.01) |

(52) U.S. Cl.
CPC .......... *G06F 11/1076* (2013.01); *G06F 3/064* (2013.01); *G06F 3/067* (2013.01); *G06F 3/0619* (2013.01); *G06F 3/0659* (2013.01); *G06F 3/0689* (2013.01); *H03M 13/154* (2013.01)

(58) Field of Classification Search
CPC .... G06F 11/1076; G06F 3/0619; G06F 3/064; G06F 3/0659; G06F 3/067
See application file for complete search history.

(56) References Cited

U.S. PATENT DOCUMENTS

| | | | |
|---|---|---|---|
| 7,882,425 B2 * | 2/2011 | Lee ..................... | G06F 11/1092 714/804 |
| 7,979,635 B2 * | 7/2011 | Bates .................. | G06F 11/1092 711/114 |
| 8,738,582 B2 * | 5/2014 | De Schrijver ...... | G06F 11/1076 707/652 |
| 8,935,221 B1 * | 1/2015 | Lazier ............... | G06F 17/30303 707/690 |

(Continued)

*Primary Examiner* — Esaw T Abraham
(74) *Attorney, Agent, or Firm* — Norton Rose Fulbright LLP

(57) ABSTRACT

Systems and methods providing for storing fragments for one or more source objects at storage nodes of multiple cluster instances comprising a cluster set are disclosed. Repair of the stored data is operated within cluster instances autonomously or semi-autonomously of other cluster instances of the cluster set according to embodiments. Embodiments may provide a storage process operable to generate fragments for a first source object to be stored in a storage system using a first encoding, wherein a different plurality of fragments of the generated fragments are stored at different cluster instances of a cluster set. A repair process may be enacted at each cluster instance of the cluster set, wherein a repair process enacted at a cluster instance is used to maintain the recoverability of the fragments of the first source object stored at that cluster instance using a second encoding.

30 Claims, 31 Drawing Sheets

(56) References Cited

U.S. PATENT DOCUMENTS

| | | | |
|---|---|---|---|
| 9,021,296 B1* | 4/2015 | Kiselev | H03M 13/154 |
| | | | 714/6.23 |
| 9,244,761 B2* | 1/2016 | Yekhanin | G06F 11/10 |
| 9,378,084 B2* | 6/2016 | Calder | G06F 11/10 |
| 9,400,607 B1* | 7/2016 | Daud | H04L 67/1097 |
| 9,658,983 B1* | 5/2017 | Barber | G06F 15/167 |
| 9,727,522 B1* | 8/2017 | Barber | G06F 9/5016 |
| 9,830,221 B2* | 11/2017 | Slik | H03M 13/3761 |
| 2005/0229023 A1* | 10/2005 | Lubbers | G06F 11/1076 |
| | | | 714/6.1 |
| 2007/0177739 A1 | 8/2007 | Ganguly et al. | |
| 2012/0166726 A1 | 6/2012 | De et al. | |
| 2013/0275390 A1 | 10/2013 | Ozzie et al. | |
| 2014/0040702 A1* | 2/2014 | He | G06F 11/1076 |
| | | | 714/766 |
| 2016/0062834 A1 | 3/2016 | Benight et al. | |
| 2017/0060469 A1 | 3/2017 | Luby et al. | |

* cited by examiner

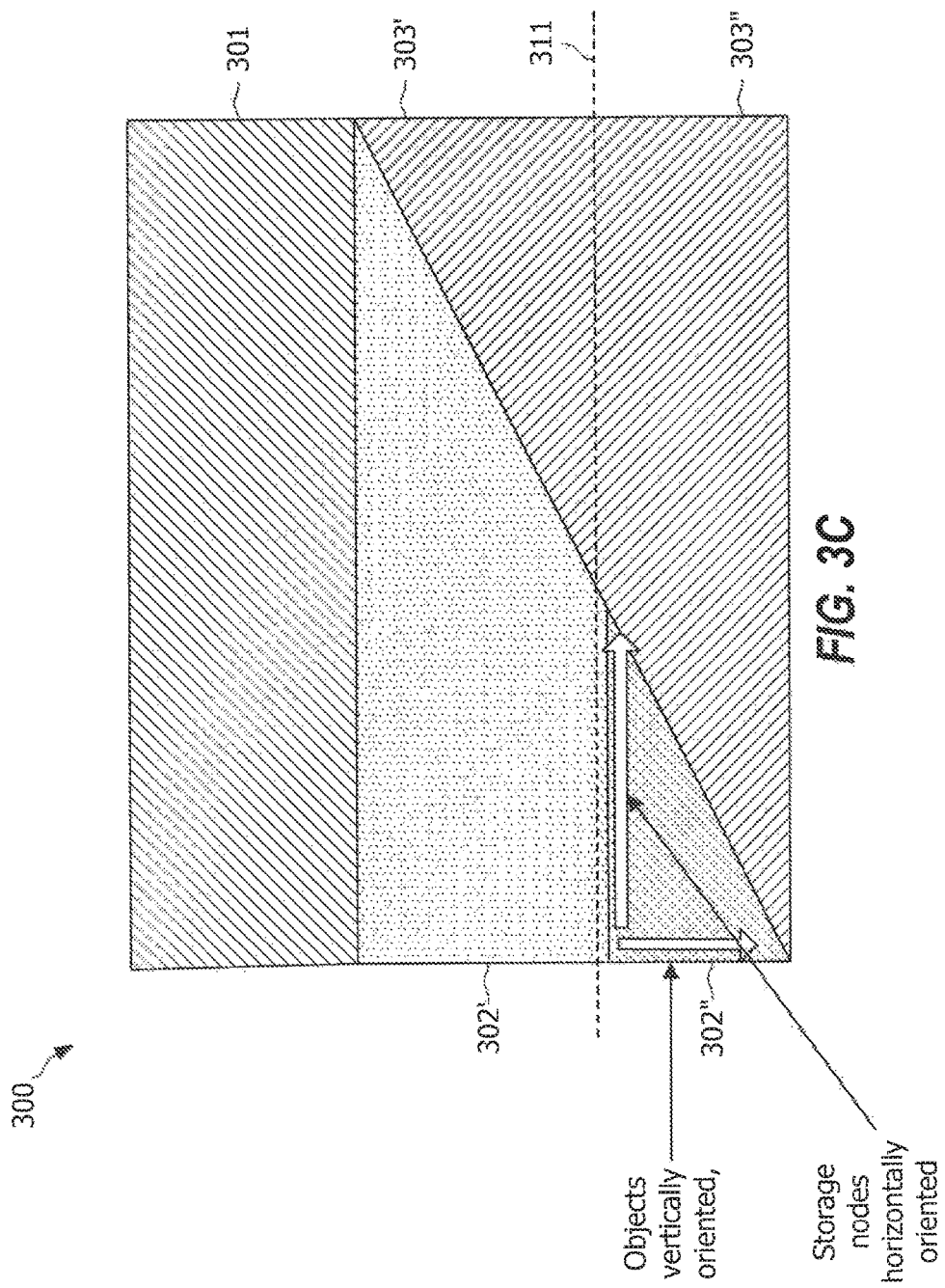

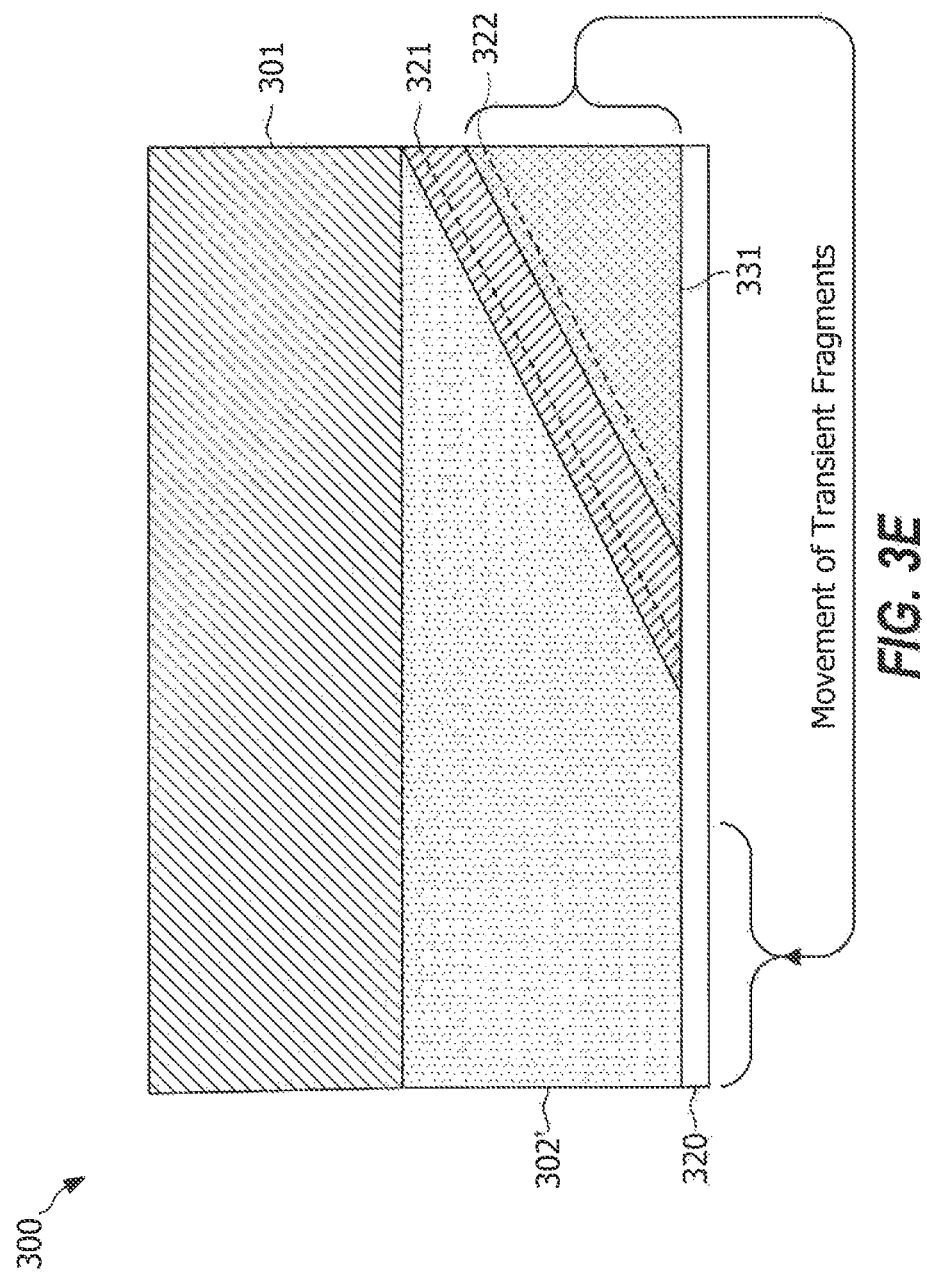

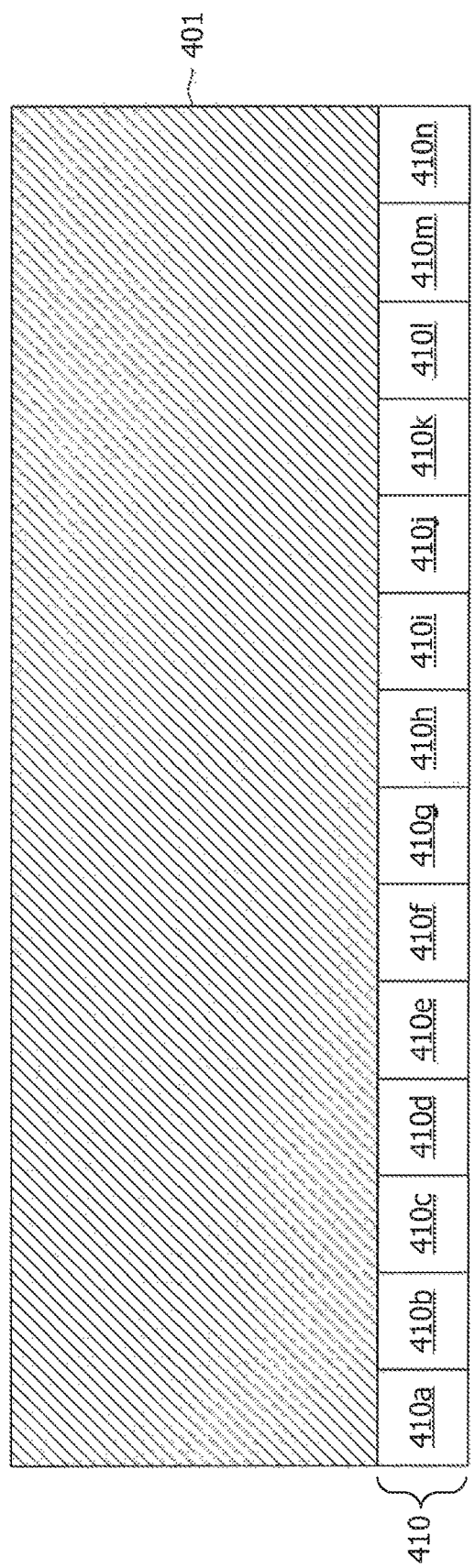

SYSTEMS AND METHODS FOR STORING, MAINTAINING, AND ACCESSING OBJECTS IN STORAGE SYSTEM CLUSTERS

PRIORITY AND RELATED APPLICATIONS STATEMENT

This application claims the benefit of U.S. Provisional Patent Application No. 62/371,071, entitled, "SYSTEMS AND METHODS FOR STORING, MAINTAINING, AND ACCESSING OBJECTS IN STORAGE SYSTEM CLUSTERS", filed on Aug. 4, 2016, the disclosure of which is expressly incorporated by reference herein in its entirety.

DESCRIPTION OF THE RELATED ART

The creation, management, storage, and retrieval of electronic data has become nearly ubiquitous in the day-to-day world. Such electronic data may comprise various forms of information, such as raw data (e.g., data collected from sensors, monitoring devices, control systems, etc.), processed data (e.g., metrics or other results generated from raw data, data aggregations, filtered data, etc.), produced content (e.g., program code, documents, photographs, video, audio, etc.), and/or the like. Such data may be generated by various automated systems (e.g., network monitors, vehicle on-board computer systems, automated control systems, etc.), by user devices (e.g., smart phones, personal digital assistants, personal computers, digital cameras, tablet devices, etc.), and/or a number of other devices.

Regardless of the particular source or type of data, large quantities of electronic data are generated, stored, and accessed every day. Accordingly sophisticated storage systems, such as network attached storage (NAS), storage area networks (SANs), and cloud based storage (e.g., Internet area network (IAN) storage systems), have been developed to provide storage of large amounts of electronic data. Such storage systems provide a configuration in which a plurality of storage nodes are used to store the electronic data of one or more users/devices, and which may be stored and retrieved via one or more access servers.

FIG. 1A shows an exemplary implementation of storage system 100A in which access server 110 is in communication with end user (EU) device 120 to provide storage services with respect thereto. Access server 110 may comprise one or more servers operable under control of an instruction set to receive data from devices such as EU device 120, and to control storage of the data and to retrieve data in response to requests from devices such as EU device 120. Accordingly, access server 110 is further in communication with a plurality, M, of storage nodes (shown here as storage nodes 130-1 through 130-M). Storage nodes 130-1 through 130-M may comprise a homogeneous or heterogeneous collection or array (e.g., redundant array of independent disks (RAID) array) of storage media (e.g., hard disk drives, optical disk drives, solid state drives, random access memory (RAM), flash memory, etc.) providing persistent memory in which the electronic data is stored by and accessible through access server 110. Each such storage node may be, for example, a commodity web server. Alternatively, in some deployments at least some storage nodes may be personal devices interconnected over the Internet. EU device 120 may comprise any configuration of device that operates to generate, manage, and/or access electronic data. It should be appreciated that although only a single such device is shown, storage system 100A may operate to serve a plurality of devices, some or all of which may comprise devices in addition to or in the alternative to devices characterized as "end user" devices.

FIG. 1B shows an exemplary implementation of storage system 100B in which access servers 110-1 through 110-14 may communicate with one or more EU devices of EU devices 120-1 through 120-3 to provide storage services with respect thereto. It should be appreciated that storage system 100B shows an alternative configuration to that of 100A discussed above wherein, although the access servers, EU devices, and storage nodes may be embodied as described above, the storage nodes of storage system 110B are deployed in a cluster configuration, shown as storage node cluster 130. In operation of storage system 100B, a cluster of access servers have access to the cluster of storage nodes. Thus, the EU devices may connect in a variety of ways to various access servers to obtain data services. In some cases, the access servers may be distributed around the country such that no matter where the EU device is located it may access the data stored in the storage node cluster. Storage nodes of such a configuration may be distributed geographically as well.

Application data units of electronic data are typically organized into and stored in storage systems such as storage systems 100A and 100B as objects. Such application data units, and thus the corresponding objects into which they are organized and stored by the storage systems, may comprise individual files, collections of files, data volumes, data aggregations, etc. and may be quite large (e.g., on the order of megabytes, gigabytes, terabytes, etc.). The objects are often partitioned into smaller blocks, referred to as source fragments, for storage in the storage system. For example, an object may be partitioned into k equal-sized fragments (i.e., the fragments comprise blocks of contiguous bytes from the source data) for storage in storage systems 100A and 100B. Each of the k fragments may, for example, be stored on a different one of the storage nodes.

In operation, storage systems such as storage systems 100A and 100B are to provide storage of and access to electronic data in a reliable and efficient manner. For example, in a data write operation, access server 110 may operate to accept data from EU device 120, create objects from the data, create fragments from the objects, and write the fragments to some subset of the storage nodes. Correspondingly, in a data read operation, access server 110 may receive a request from EU device 120 for a portion of stored data, read appropriate portions of fragments stored on the subset of storage nodes, recreate the object or appropriate portion thereof, extract the requested portion of data, and provide that extracted data to EU device 120. However, the individual storage nodes are somewhat unreliable in that they can intermittently fail, in which case the data stored on them is temporarily unavailable, or permanently fail, in which case the data stored on them is permanently lost (e.g., as represented by the failure of storage node 130-2 in FIG. 1C).

Erasure codes (e.g., tornado codes, low-density parity-check codes, Reed-Solomon coding, and maximum distance separable (MDS) codes) have been used to protect source data against loss when storage nodes fail. When using an erasure code, such as MDS erasure codes, each object is typically considered as a source block of an erasure code, each source fragment of an object typically consists of a single source symbol of the source block, and erasure encoding is applied to the k source fragments (i.e., the k fragments into which an object is partitioned) of an object to generate repair fragments for that object, wherein the resulting repair fragments (each repair fragment typically consisting of a single repair symbol of the erasure code) are of equal size with the source fragments. In operation of the storage system, the source fragments and corresponding repair fragments are each stored on a different one of the storage nodes.

The erasure code may provide r repair fragments for each source object, whereby the total number of fragments, n, for a source object may be expressed as n=k+r. Thus, the erasure code may be parameterized as (n, k r) where k is the number of source symbols in a source block, n is the total number of encoded symbols, and r=n−k is the number of repair symbols. A property of MDS erasure codes is that all k source symbols can be recovered from any k of the n encoded symbols (i.e., the electronic data of the source block may be retrieved by retrieving any combination (source and/or repair fragments) of k fragments). Although providing data reliability, it should be appreciated that where desired data is not directly available (e.g., a fragment is unavailable due to a failed storage node), to recreate the missing data k fragments must be accessed to recreate the missing data (i.e., k times the amount of data must be accessed to recreate the desired but missing data). This can result in inefficiencies with respect to the use of resources, such as communication bandwidth, computing resources, etc.

In providing reliable storage of the electronic data, storage systems such as storage systems 100A and 100B implementing erasure coding of the data (e.g., access server 110 of FIG. 1C operational to provide repair server functionality) have a repair process or policy running in the background to determine the number of fragments available with respect to the objects (e.g., to detect objects which are missing one or more fragments, such as due to a failed storage node). For objects with some level of missing fragments (e.g., as the number of available fragments approaches k) logic of the storage system repair process will read k remaining fragments for that object and recreate the object and write additional fragments to the storage system (e.g., on other of the storage nodes which remain available). Typically, the objects for which the fewest fragments are available are the ones that are repaired first, before objects that have more fragments available (assuming an equal number of fragments for the objects), according to such repair policies.

It should be appreciated that, although the example of FIG. 1C illustrates a repair server as being implemented by access server 110, repair servers operable to provide repair services herein may be provided in various configurations. For example, one or more repair servers may be provided separately from access servers of a storage system according to embodiments. As another example, repair servers and or access servers may be implemented by storage nodes 130-1 through 130-M.

The aforementioned intermittent node failures are far more typical than permanent node failures (e.g., 90% of the node failures are intermittent), and a repair policy is not needed to recover the data that is temporarily unavailable on these nodes as eventually this data will become available again when the node comes back online. Accordingly, when fragments become unavailable a repair process may detect and delay repairing the data for some period of time, T (e.g., intermittent failure threshold time), to determine whether the failure is intermittent or permanent.

The erasure code solutions that have been implemented with respect to storage systems have been small erasure code solutions due to their suitability for relatively rapid recreation of missing source data. An (n, k, r) erasure code solution is said to be a small erasure code solution if n<<M (i.e., for each source object there are fragments at a small fraction of the storage nodes). Such a small erasure code configuration (e.g., k=10) generally comprises a correspondingly small number of repair fragments (e.g., r=4, thus n=14). Accordingly, for a small erasure code solution it is beneficial to use a reactive repair policy (i.e., when a fragment of an object is lost due to a permanent node failure then a repair policy immediately or as quickly as possible replaces the lost fragment with another fragment in light of the total number of fragments, n, being so near the minimum number of fragments, k, needed to recover the data). Because a large amount of data is stored on each node (typically many terabytes), and all data comprising fragments stored on a node typically needs to be replaced when the node permanently fails, a repair process reads and writes a large amount of data after a node permanently fails. This reading and writing of large amounts of data generally results in the consumption of large amounts of bandwidth in the storage system by a repair policy and, when coupled with a reactive repair policy, can result in disruptive spikes in storage system bandwidth utilization (e.g., delaying or preventing primary data access services by the storage system). That is, a repair policy implemented with respect to a small erasure code configuration may act somewhat erratically whereby it utilizes a large amount of bandwidth for periods of time when attempting to repair data immediately upon determining fragments are unavailable due to a permanently failed node.

It is sometimes advantageous for a storage system to spread fragments generated from objects across geographically distributed (referred to herein as geo-distributed) locations. A geographic location (referred to herein as a geo-location) may, for example, comprise a storage system service provider facility (e.g., a computer server room within a building, a computing services building, a localized campus of computing services buildings, etc.), wherein a geo-distributed storage system configuration may comprise a plurality of geo-locations (e.g., across town, in different cities, in different states, in different countries, etc.) physically separated by distances suitable for providing some level of isolation between the components of the storage system with respect to external events. One reason for this is that the storage system infrastructure components (e.g., storage nodes) of geo-distributed locations are less likely to experience catastrophic failures (e.g., resulting from external events such as natural disasters, utility or infrastructure failure, acts of violence or terrorism, etc.) at the same time than are co-located storage system infrastructure components (i.e., storage system infrastructure components that are not physically separated by distances suitable for providing isolation between the components with respect to external events), and thus spreading fragments over geo-distributed locations can provide much higher levels of durability and reliability for the underlying data objects. Furthermore, the amount of overall storage overhead required for such solutions can be significantly less than that required for solutions for which all fragments are stored in one geographic location.

However, the cost of transporting data between geo-distributed locations (e.g., over relatively large physical distances) can be much higher than the cost of transporting data internally within a geo-location (e.g., between co-located components). In some cases, the difference in the costs for transporting data between geo-distributed locations can be greater than the cost for transporting data internally within a geo-location by several orders of magnitude. Moreover, the amount of bandwidth available for transporting data between geo-distributed locations can be significantly lower than the amount of bandwidth available for transporting data internally within a geo-location. For example, bandwidth availability may be proportional to, or a function of, the cost of transporting data. Accordingly, in some cases, the difference in the amount of bandwidth available for transporting data between geo-distributed locations can be lower than the bandwidth for transporting data internally within a geo-location by orders of magnitude.

Although spreading fragments over geo-distributed locations can provide much higher levels of durability and reliability for the underlying data objects (e.g., rendering the data less susceptible to the aforementioned external events), inefficiencies resulting from erasure code solutions implemented with respect to such geo-distributed storage systems can be significant. For example, where desired data is not directly available (e.g., a fragment is unavailable due to a failed storage node), to recreate the missing data k fragments must be accessed to recreate the missing data (i.e., k times the amount of data must be accessed to recreate the desired but missing data). Thus, the repair traffic may consume significant amounts of the bandwidth between the geo-distributed locations, wherein this bandwidth may be quite expensive and/or very limited.

SUMMARY

In one aspect of the disclosure, a method implemented by processor-based logic of a storage system storing source objects as a plurality of erasure coded fragments upon storage nodes of a plurality of cluster instances of storage system infrastructure components comprising a cluster set, wherein each cluster instance of the plurality of cluster instances operates as a unit for providing reliable storage of a different portion of a source object stored by the storage system, is provided. The method of embodiments includes generating a plurality of first encoding fragments from the source object using a first encoding and partitioning the plurality of first encoding fragments into a plurality of disjoint sets of first encoding fragments, wherein each set of first encoding fragments of the plurality of disjoint sets includes a plurality of first encoding fragments. The method of embodiments further includes assigning a first set of first encoding fragments of the plurality of disjoint sets to a first cluster instance of the plurality of cluster instances, wherein the first set of first encoding fragments comprise a portion of the plurality of first encoding fragments of the source object to be stored upon the storage nodes of the first cluster instance of the plurality of cluster instances, and assigning a second set of first encoding fragments of the plurality of disjoint sets to a second cluster instance of the plurality of cluster instances, wherein the second set of first encoding fragments comprise a different portion of the plurality of first encoding fragments of the source object to be stored upon the storage nodes of the second cluster instance of the plurality of cluster instances. The method of embodiments also includes generating a plurality of second encoding fragments from the first set of first encoding fragments using a second encoding, wherein the plurality of second encoding fragments include the plurality of first encoding fragments of the first set of first encoding fragments and one or more repair fragments generated from the first encoding fragments of the first set of encoding fragments, and generating a plurality of third encoding fragments from the second set of first encoding fragments using a third encoding, wherein the plurality of third encoding fragments include the plurality of first encoding fragments of the second set of first encoding fragments and one or more repair fragments generated from the first encoding fragments of the second set of encoding fragments.

In an additional aspect of the disclosure, an apparatus of a storage system storing source objects as a plurality of fragments upon storage nodes of a plurality of cluster instances of storage system infrastructure components comprising a cluster set, wherein each cluster instance of the plurality of cluster instances operates as a unit for providing reliable storage of a different portion of a source object stored by the storage system, is provided. The apparatus of embodiments includes one or more data processors and one or more non-transitory computer-readable storage media containing program code. The program code of embodiments is configured to cause the one or more data processors to generate a plurality of first encoding fragments from the source object using a first encoding and to partition the plurality of first encoding fragments into a plurality of disjoint sets of first encoding fragments, wherein each set of first encoding fragments of the plurality of disjoint sets includes a plurality of first encoding fragments. The program code of embodiments is further configured to cause the one or more data processors to assign a first set of first encoding fragments of the plurality of disjoint sets to a first cluster instance of the plurality of cluster instances, wherein the first set of first encoding fragments comprise a portion of the plurality of first encoding fragments of the source object to be stored upon the storage nodes of the first cluster instance of the plurality of cluster instances, and to assign a second set of first encoding fragments of the plurality of disjoint sets to a second cluster instance of the plurality of cluster instances, wherein the second set of first encoding fragments comprise a different portion of the plurality of first encoding fragments of the source object to be stored upon the storage nodes of the second cluster instance of the plurality of cluster instances. The program code of embodiments is also configured to cause the one or more data processors to generate a plurality of second encoding fragments from the first set of first encoding fragments using a second encoding, wherein the plurality of second encoding fragments include the plurality of first encoding fragments of the first set of first encoding fragments and one or more repair fragments generated from the first encoding fragments of the first set of encoding fragments, and to generate a plurality of third encoding fragments from the second set of first encoding fragments using a third encoding, wherein the plurality of third encoding fragments include the plurality of first encoding fragments of the second set of first encoding fragments and one or more repair fragments generated from the first encoding fragments of the second set of encoding fragments.

In a further aspect of the disclosure, an apparatus of a storage system storing source objects as a plurality of fragments upon storage nodes of a plurality of cluster instances of storage system infrastructure components comprising a cluster set, wherein each cluster instance of the plurality of cluster instances operates as a unit for providing reliable storage of a different portion of a source object stored by the storage system, is provided. The apparatus of embodiments includes means for generating a plurality of first encoding fragments from the source object using a first encoding and means for partitioning the plurality of first encoding fragments into a plurality of disjoint sets of first encoding fragments, wherein each set of first encoding fragments of the plurality of disjoint sets includes a plurality of first encoding fragments. The apparatus of embodiments further includes means for assigning a first set of first encoding fragments of the plurality of disjoint sets to a first cluster instance of the plurality of cluster instances, wherein the first set of first encoding fragments comprise a portion of the plurality of first encoding fragments of the source object to be stored upon the storage nodes of the first cluster instance of the plurality of cluster instances, and means for assigning a second set of first encoding fragments of the plurality of disjoint sets to a second cluster instance of the plurality of cluster instances, wherein the second set of first encoding fragments comprise a different portion of the plurality of first encoding fragments of the source object to be stored upon the storage nodes of the second cluster instance of the plurality of cluster instances. The apparatus of embodiments also includes means for generating a plurality of second encoding fragments from the first set of first encoding fragments using a second encoding, wherein the plurality of second encoding fragments include the plurality of first encoding fragments of the first set of first encoding fragments and one or more repair fragments generated from the first encoding fragments of the first set of encoding fragments, and means for generating a plurality of third encoding fragments from the second set of first encoding fragments using a third encoding, wherein the plurality of third encoding fragments include the plurality of first encoding fragments of the second set of first encoding fragments and one or more repair fragments generated from the first encoding fragments of the second set of encoding fragments.

In a still further aspect of the disclosure, a non-transitory computer-readable medium comprising codes for a storage system storing source objects as a plurality of fragments upon storage nodes of a plurality of cluster instances of storage system infrastructure components comprising a cluster set, wherein each cluster instance of the plurality of cluster instances operates as a unit for providing reliable storage of a different portion of a source object stored by the storage system, is provided. The codes of embodiments further cause one or more computers to generate a plurality of first encoding fragments from the source object using a first encoding and to partition the plurality of first encoding fragments into a plurality of disjoint sets of first encoding fragments, wherein each set of first encoding fragments of the plurality of disjoint sets includes a plurality of first encoding fragments. The codes of embodiments further cause one or more computers to assign a first set of first encoding fragments of the plurality of disjoint sets to a first cluster instance of the plurality of cluster instances, wherein the first set of first encoding fragments comprise a portion of the plurality of first encoding fragments of the source object to be stored upon the storage nodes of the first cluster instance of the plurality of cluster instances, and to assign a second set of first encoding fragments of the plurality of disjoint sets to a second cluster instance of the plurality of cluster instances, wherein the second set of first encoding fragments comprise a different portion of the plurality of first encoding fragments of the source object to be stored upon the storage nodes of the second cluster instance of the plurality of cluster instances. The codes of embodiments also cause one or more computers to generate a plurality of second encoding fragments from the first set of first encoding fragments using a second encoding, wherein the plurality of second encoding fragments include the plurality of first encoding fragments of the first set of first encoding fragments and one or more repair fragments generated from the first encoding fragments of the first set of encoding fragments, and to generate a plurality of third encoding fragments from the second set of first encoding fragments using a third encoding, wherein the plurality of third encoding fragments include the plurality of first encoding frag-ments of the second set of first encoding fragments and one or more repair fragments generated from the first encoding fragments of the second set of encoding fragments.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

FIGS. 3A-3E show repair queue organization of fragments stored within a storage system storage nodes according to embodiments of the present disclosure.

DETAILED DESCRIPTION

Figure 1A:
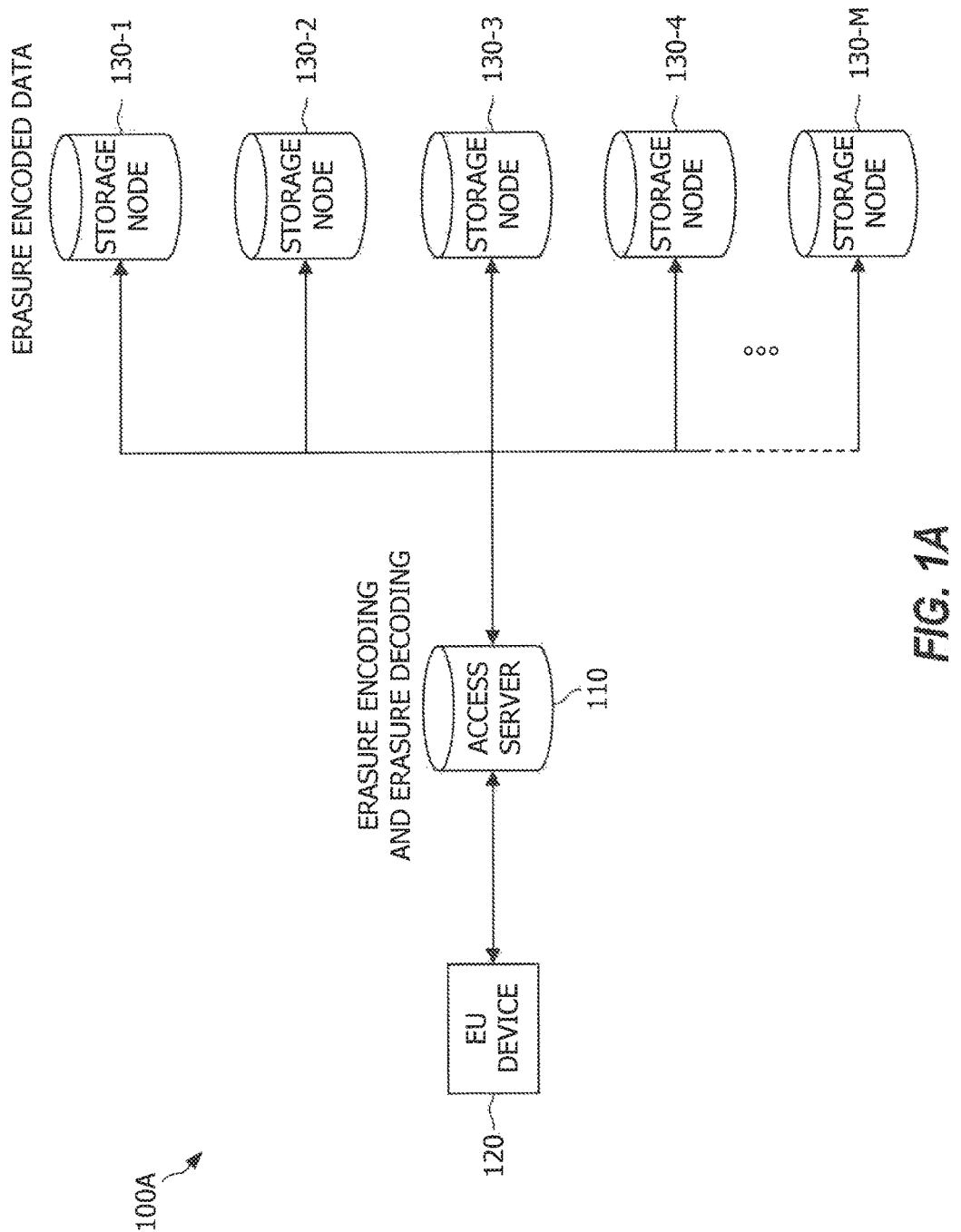
FIGS. 1A and 1B show exemplary implementations of storage systems as may be adapted to provide fragment pre-storage techniques according to embodiments of the present disclosure.
Figure 1B:
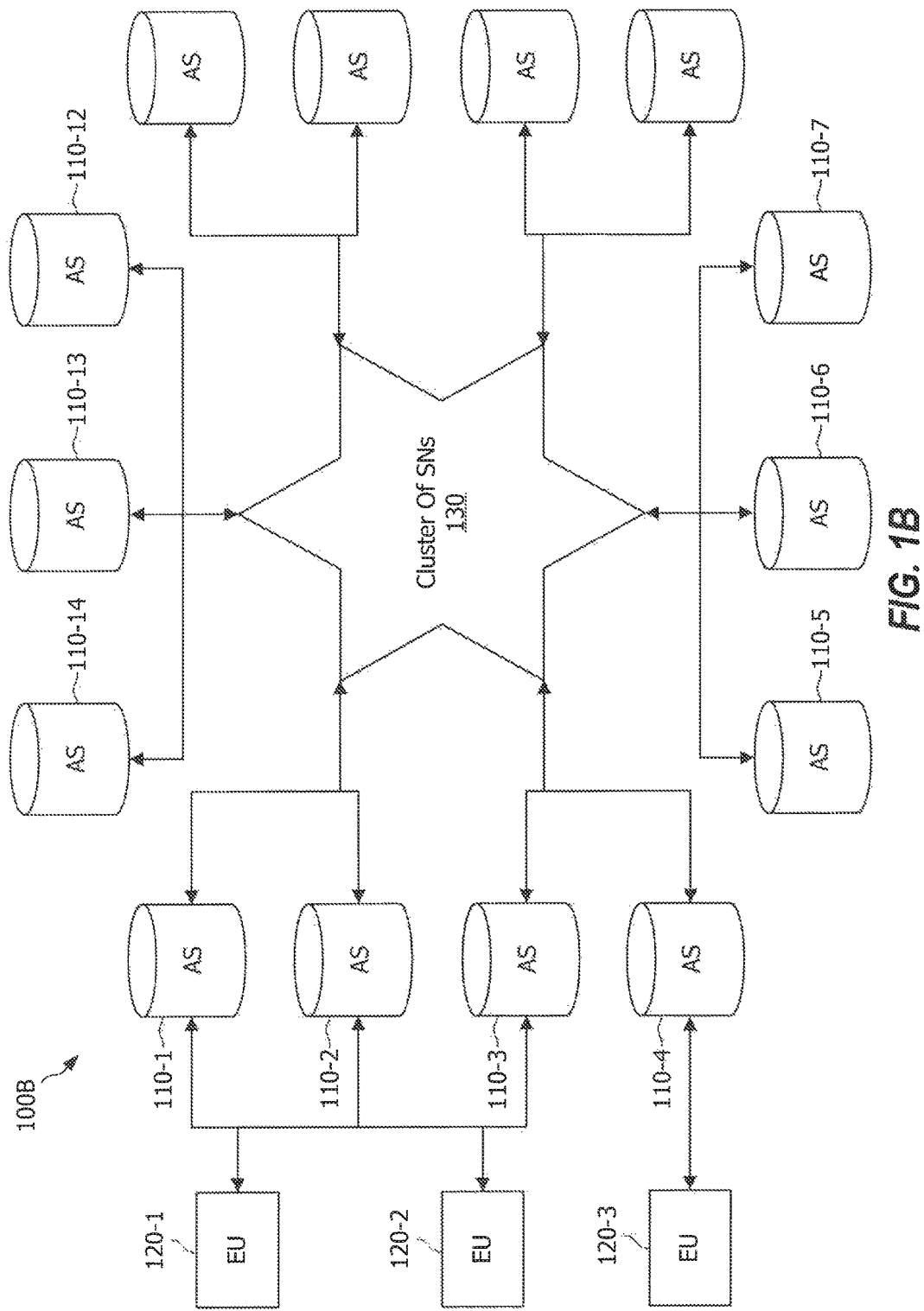
Figure 1C:
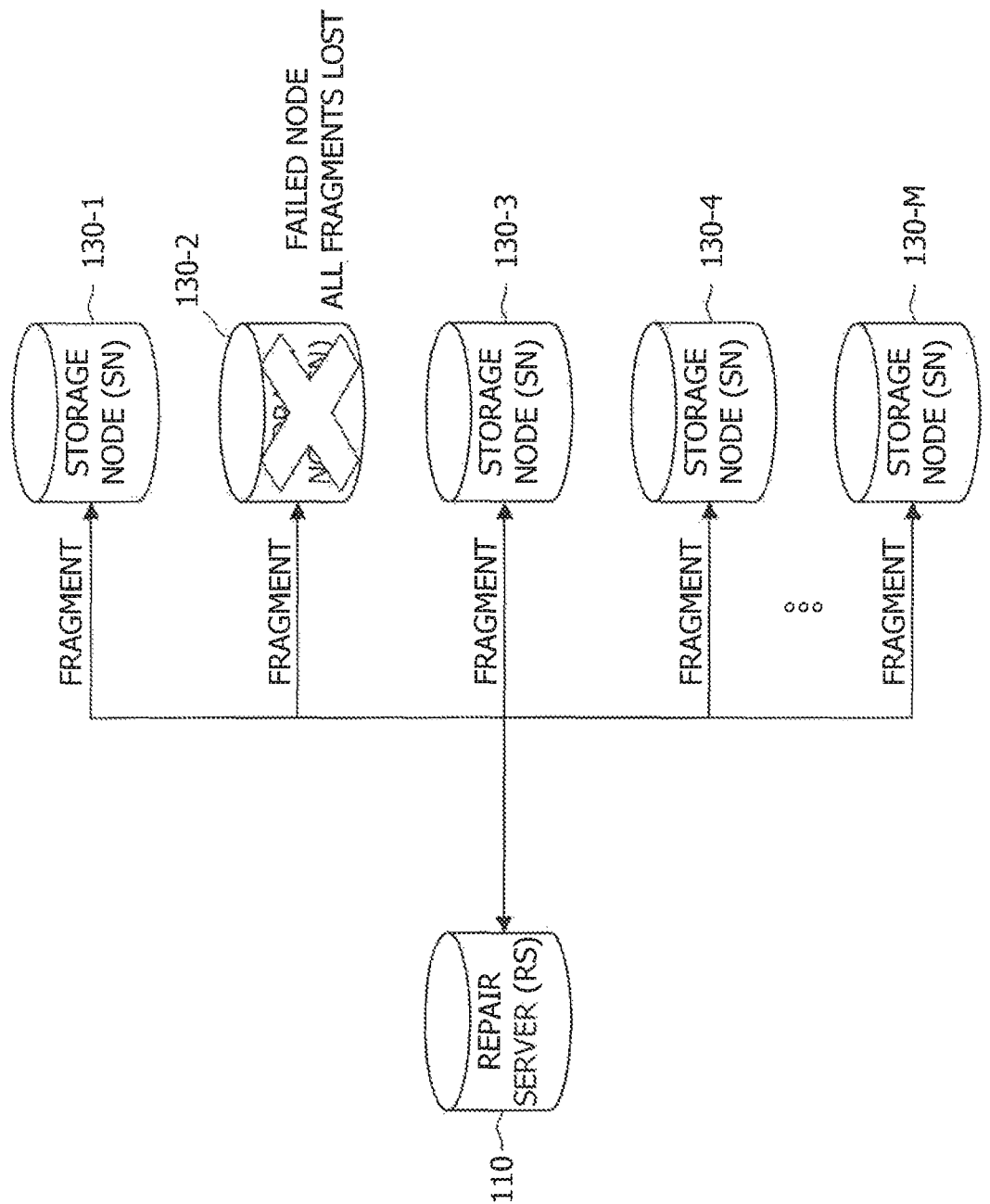
FIG. 1C shows failure of a storage node as may be experienced in the storage systems of FIGS. 1A and 1B.

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

As used in this description, the terms "data" and "electronic data" may include information and content of various forms, including raw data, processed data, produced content, and/or the like, whether being executable or non-executable in nature. Such data may, for example, include data collected from sensors, monitoring devices, control systems, metrics or other results generated from raw data, data aggregations, filtered data, program code, documents, photographs, video, audio, etc. as may be generated by various automated systems, by user devices, and/or other devices.

As used in this description, the term "fragment" refers to one or more portions of content that may be stored at a storage node. For example, the data of a source object may be partitioned into a plurality of source fragments, wherein such source objects may comprise an arbitrary portion of source data, such as a block of data or any other unit of data including but not limited to individual files, collections of files, data volumes, data aggregations, etc. The plurality of source fragments may be erasure encoded to generate one or more corresponding repair fragments, whereby a repair fragment comprises redundant data with respect to the corresponding source fragments. The unit of data that is erasure encoded/decoded is a source block, wherein k is the number of source symbols per source block, Bsize is the source block size, Ssize is the symbol size (Bsize=k·Ssize), n is the number of encoded symbols generated and stored per source block, and r is the number of repair symbols (r=n−k), and wherein the symbol is the atomic unit of data for erasure encoding/decoding. Although the symbol size (Ssize) may be different for different source blocks, the symbol size generally remains the same for all symbols within a source block. Similarly, although the number of source symbols (k), the number of repair symbols (r), and the number of encoded symbols generated may be different for different source blocks, the values generally remain the same for all source blocks of a particular object. Osize is the size of the source object and Fsize is the size of the fragment (e.g., where k is both the number of source symbols per source block and the number of fragments per source object, Osize=k·Fsize).

As used in this description, the terms "component," "database," "module," "system," "logic" and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

As used herein, the terms "user equipment," "user device," "end user device," and "client device" include devices capable of requesting and receiving content from a web server or other type of server and transmitting information to a web server or other type of server. In some cases, the "user equipment," "user device," "end user device," or "client device" may be equipped with logic that allows it to read portions or all of fragments from the storage nodes to recover portions or all of source objects. Such devices can be a stationary devices or mobile devices. The terms "user equipment," "user device," "end user device," and "client device" can be used interchangeably.

As used herein, the term "user" refers to an individual receiving content on a user device or on a client device and transmitting information or receiving information from to a website or other storage infrastructure.

As used herein, the term "cluster instance" refers to an occurrence of a plurality of storage system infrastructure components, such as may comprise a plurality of storage nodes and associated infrastructure (e.g., access server, repair server, etc.), operable as a cooperative unit for providing reliable storage of a portion of data stored by a storage system. For example, a cluster instance may correspond to one or more zones for which cooperative operation of storage system components to provide data storage is desired or advantageous. A zone may, for example, comprise a fault zone (e.g., where failures are independent or largely independent between different fault zones), a networked zone (e.g., where there is more available bandwidth between infrastructure within the same networked zone than there is between infrastructure in different networked zones), a geographic zone (e.g., where there is a collection of storage nodes that are close in physical distance to one another, or for which there is an abundant amount of network interconnectivity bandwidth between the storage nodes, as compared to the amount of network interconnectivity between storage nodes at different cluster instances, wherein a geographic zone of some embodiments may comprise a geo-location, a plurality of geo-locations, a geographic area encompassing a geo-location but which is larger than the geo-location, etc.), etc., as well as combinations thereof (e.g., a zone that is both a networked zone and a fault zone). Examples of a cluster instance include an entire data center of nodes, a collection of data centers in one locale, a portion of a data center that is operated independently of other portions of the same data center, and a partition of the storage devices supported within a node that operate at some level independently of the other partitions of storage devices supported within the same node.

As used herein, the term "cluster set" refers to a plurality of cluster instances that aggregate to provide reliable storage of a data collection of which the portion of data stored by each cluster instance that is a member of the cluster set forms a part. For example, a cluster set may comprise a geo-distributed storage system having a plurality of cluster instances, wherein the cluster instances comprise zones (e.g., fault zones, networked zones, geographic zones, etc.). Failures amongst storage system infrastructure components, such as storage nodes, in different cluster instances of a cluster set may be more independent than failures amongst storage system infrastructure components within the same cluster instance.

Embodiments according to the concepts of the present disclosure provide solutions with respect to storing and accessing source data in a reliable and efficient manner within a storage system of unreliable nodes (i.e., nodes that can store data but that can intermittently fail, in which case the data stored on them is temporarily unavailable, or permanently fail, in which case the data stored on them is permanently lost). In particular, embodiments herein provide methodologies, as may be implemented in various configurations of systems and methods, for storing fragments for one or more of the source objects at storage nodes of multiple cluster instances comprising a cluster set, wherein repair of the stored data is operated within cluster instances autonomously or semi-autonomously of other cluster instances of the cluster set. For example, embodiments may provide a storage process operable to generate fragments for a first source object to be stored in a system using a first encoding, wherein different fragments of the generated fragments (e.g., different subsets of the first encoding fragments each having a plurality of first encoding fragments) are stored at different cluster instances of a cluster set. In operation according to embodiments, a repair process is enacted at each cluster instance of the cluster set, wherein a repair process enacted at a cluster instance is used to maintain the recoverability of the fragments of the first source object stored at that cluster instance using a second encoding. Embodiments additionally or alternatively provide an access process operable to recover at least some fragments for the first source object from one or more cluster instances using a decoding corresponding to the second encoding, wherein the first source object is recovered from at least some of the recovered fragments using a decoding corresponding to the first encoding.

In accordance with some embodiments, the fragments generated for a first source object using the aforementioned first encoding stored by a cluster instance using a second encoding are directly usable interchangeably to recover first encoding fragments of the plurality of first encoding fragments using a decoding corresponding to the second encoding and to recover source fragments of the source object using a decoding corresponding to the first encoding. That is, fragments stored by a first cluster instance using a second encoding may be used as stored by the storage nodes of the first cluster instance to recover, using a decoding corresponding to the second encoding, at least some fragments of the subset of first encoding fragments stored by the first cluster instance. Further, fragments stored by the first cluster instance using the second encoding may be used as stored by storage nodes of the first cluster instance to recover, using a decoding corresponding to the first encoding, at least some source fragments of the source object. As will be better understood from the discussion that follows, the foregoing recovery of the source fragments of the source object using the decoding corresponding to the first encoding and the fragments stored by the first cluster instance according to embodiments further uses one or more fragments stored by a second cluster instance, such as using a third encoding as may also be directly usable to recover source fragments of the source object using a decoding corresponding to the first encoding.

As can be appreciated from the foregoing, a cluster instance of embodiments comprises a logically connected portion of storage infrastructure for which repair may be operated (e.g., using the aforementioned second encoding) without repair traffic associated with such repairs being transported between cluster instances of the cluster set (e.g., at a cluster level). Additionally, repair may be instituted with respect to a cluster set (e.g., at a cluster set global level) according to embodiments, wherein repair traffic associated with such global level repairs is transported between cluster instances of the cluster set. However, such global level repairs may be reserved for particular events or situations (e.g., where a cluster instance is unable to provide recovery/repair of its fragments, where data redundancy within the storage system is at or below a particular threshold, where data loss is otherwise imminent, etc.). For example, cluster level repairs (e.g., implemented independently by the above exemplary first and second cluster instances using decoding corresponding to a respective second and third encoding) may provide a primary repair process and global level repairs (e.g., implemented using a decoding corresponding to the first encoding and one or more fragments stored by the above exemplary first and second cluster instances directly usable by the decoding corresponding to the first encoding) may provide a secondary or crises repair process.

The encoding (e.g., the aforementioned first encoding and/or second encoding) utilized according to embodiments may comprise Maximum Distance Separable (MDS) codes, such as Reed-Solomon erasure codes as specified in IETF RFC 5510, and/or codes that may not be MDS codes but have properties similar to MDS codes, such as the large erasure codes known as RAPTOR Forward Error Correction (FEC) code as specified in IETF RFC 5053 and RAPTORQ Forward Error Correction (FEC) code as specified in IETF RFC 6330, of which software implementations are available from Qualcomm Incorporated. The decoding corresponding such encoding may, for example, comprise reverse processing according to the particular code used for encoding. Although, large erasure codes have generally not been considered with respect to solutions for reliably and efficiently storing and accessing source data within a storage system of unreliable nodes due to potential demands on repair bandwidth and potential inefficient access when the desired data is not directly available, embodiments described in U.S. patent application Ser. Nos. 14/567,203, 14/567,249, and 14/567,303, each entitled "SYSTEMS AND METHODS FOR RELIABLY STORING DATA USING LIQUID DISTRIBUTED STORAGE," each filed Dec. 11, 2014, the disclosures of which are hereby incorporated herein by reference, utilize a lazy repair policy (e.g., rather than a reactive, rapid repair policy as typically implemented by systems implementing a short erasure code technique) to control the bandwidth utilized for data repair processing within the storage system. The large erasure code storage control of embodiments operates to compress repair bandwidth (i.e., the bandwidth utilized within a storage system for data repair processing) to the point of operating in a liquid regime (i.e., a queue of items needing repair builds up and the items are repaired as a flow), thereby providing large erasure code storage control in accordance with concepts herein.

In some embodiments, repair can be executed in such a way that if a first object has less available fragments than a second object, then the set of encoded symbol IDs (ESIs) associated with the available fragments for the first object is a subset of the set of ESIs associated with the available fragments for the second object, i.e., all the available fragments for the first object are in common with the available fragments for the second object, and thus the ESIs of the available fragments for the first object are nested within the ESIs of the available fragments for the second object, in which case the available fragments for the first source object are referred to herein as commonly available for the first and second source objects. In this case, if an object with the least number of available fragments is decodable (recoverable) then all other objects are decodable (recoverable), and thus decodability of all the objects can be verified by verifying that decoding is possible from the (unique) set of ESIs associated with an object with the least number of available fragments, since all of the fragments available for an object with the least number of available fragments are common to the set of available fragments for any other object. More generally stated, a set of fragments is commonly available for a set of one or more source objects if each fragment in the set of fragments (e.g., as identified by its ESI) is available for each source object in the set of source objects. Thus verifying decodability with respect to a set of commonly available fragments (e.g., based on their ESIs) can be used to verify decodability of all source objects in the set of source objects. Thus, even if the ESIs for a set of source objects do not have the nesting property described above, a set of commonly available fragments for the set of source objects may still be determined and used to verify decodability of all source objects in the set of source objects. For example, a first source object may have available fragments identified by ESIs 0, 1, 2, 3, 4, 5, 6, whereas a second source object may have available fragments identified by ESIs 2, 3, 4, 5, 6, 7, 8, and thus even though this pair of source objects do not have the nesting property described above, the commonly available fragments for this pair of source objects can be identified by the ESIs 2, 3, 4, 5, 6, and if decodability is possible using only these commonly available fragments then decoding is possible for both source objects. Thus verifying decodability with respect to a set of commonly available fragments (e.g., based on their ESIs) can be used to verify decodability of all source objects in a set of source objects.

It should be appreciated that there are various metrics by which to evaluate a storage system solution. Such metrics include reliability, storage efficiency, repair bandwidth efficiency, and access efficiency.

Reliability provides a measure of the amount of time that all source data can be stored without loss of any of the data. Reliability is usually measured as a mean time to source data loss, and typically measured in years. The reliability metric used in accordance with some embodiments herein is the mean time to loss of any source data, or mean time to data loss (MTTDL). MTTDL is sometimes estimated, for example, by calculating a mean time to loss of a particular piece of source data and multiplying that metric by the number of pieces of source data in the storage system. However, the accuracy of this estimate method relies upon the assumption that each piece of source data is lost independently of other pieces, and this assumption may not be true for some systems.

Storage efficiency provides a measure of the fraction of the available storage within the storage system that can be used to store source data. Storage efficiency ($\alpha$) measures the ratio of the total size of source objects in the system to the total target amount of data used to store the source objects, and the storage overhead or storage redundancy ($\beta$) is $1-\alpha$. That is, storage overhead or storage redundancy is the ratio of the total target amount of repair data for all objects divided by the total target amount of source and repair data for all objects in the storage system when using a systematic erasure code to store the objects. Thus, the storage overhead is the target fraction of the used storage that is not for source data. The storage efficiency ($\alpha$), being the target fraction of storage usable for source data, may thus be represented in terms of the storage overhead as $\alpha=1-\beta$.

Repair bandwidth efficiency provides a measure of the amount of network bandwidth used for repairing lost data from failed storage nodes. It should be appreciated that repair bandwidth may be a shared resource with the access bandwidth and/or storage bandwidth (e.g., each taken from the available data communication bandwidth). Accordingly, an upper bound on a repair bandwidth (R) may be provided according to embodiments herein. Since available bandwidth between cluster instances of a cluster set can be limited, it can be important to minimize the amount of repair bandwidth used between cluster instances when fragments generated from the same object are stored at different cluster instances of the cluster set, whereas repair bandwidth used within a cluster instance may be more plentiful.

The ratio of an amount of data that is read from storage nodes to a resulting amount of repair data that is generated and stored on storage nodes is one measure of repair bandwidth efficiency. Accordingly, repair bandwidth efficiency may be measured by the ratio of the number of fragments that need to be read to decode the source data to the number of fragments that are generated for repair. Thus, the larger the number of fragments generated for a particular source object by a repair process, the higher the repair bandwidth efficiency. Another measure of repair bandwidth efficiency may be the amount of repair bandwidth used between cluster instances of a cluster set, where ideally the amount of repair bandwidth used between cluster instances is minimized (e.g., no repair bandwidth between cluster instances of a cluster set is used).

Access efficiency provides a measure of the amount of data that needs to be read from the storage system to retrieve a given portion of source data (e.g., f(A) is the amount of read data from the storage nodes to access A bytes of source data, wherein when f(A) is greater than A the data access is inefficient). It should be appreciated that the amount of time to access source data is related to the access efficiency. Accordingly, when the amount of data read from the storage nodes to access a particular portion of source data is larger than that portion of source data, not only is more bandwidth than minimally necessary used to access the data but the amount of time it takes to access the source data can be longer than minimally necessary. Accordingly, embodiments herein are adapted to provide implementations wherein very nearly f(A)=A.

Permanent failure of the nodes is often modeled by a Poisson process parameterized by $\lambda$, which denotes the failure rate of each node according to an exponential distribution. In some extreme cases, a significant portion of the nodes (e.g., most or all of the nodes) at a cluster instance may permanently fail nearly concurrently (e.g., if there is a fire, explosion, or some other event that destroys, or at least temporarily makes inoperable, a portion or all of the infrastructure of a given cluster instance). There are also intermittent failures of nodes (e.g., a node that is not available for some small interval of time but which comes back online and is fully available again). As previously mentioned, such intermittent node failures are far more typical than permanent node failures. Accordingly, a repair policy is not needed to recover the data temporarily unavailable on these nodes as eventually this data will become available again when the node comes back online and thus when nodes fail there is some period of time, as may be denoted by an intermittent failure threshold, T, until it is determined whether the failure is intermittent or permanent. Nodes can be added to the storage system to replace nodes that have failed permanently. When replacement nodes are available for permanently failed nodes, a repair policy can repair an object that has lost fragments on failed nodes by reading fragments for the object from other nodes, erasure decode the object from the read fragments, erasure encode additional fragments from the object, and store these additional fragments on replacement nodes.

A repair bandwidth metric, R, utilized according to some embodiments of the present disclosure is an amount of bandwidth provisioned to be used by a repair policy to ensure a provided MTTDL, whereby a repair policy may use this amount of repair bandwidth at each point in time, or more generally a repair policy may use this amount of repair bandwidth when averaged over a longer window of time. A repair bandwidth provisioned to a repair process may be respected on an instantaneous basis (i.e., a repair process may use repair bandwidth at a steady rate that is at or below the provisioned repair bandwidth). Alternatively, a repair bandwidth provisioned to a repair process may be considered as an average over a long window of time that is sufficient for a repair process to achieve a provisioned MTTDL, and thus a repair process may decide to use a repair bandwidth in, for example, a scheduled manner independent of the timing of storage node failures. For example, a repair process may be scheduled to run periodically for an hour or two each day, for a few hours each week, or for a few hours each month or couple of months, such that the average repair bandwidth used by a repair process over these windows of times averages to the provisioned repair bandwidth.

A repair policy may use such a provisioned repair bandwidth in a way that avoids interference with other processes sharing the same bandwidth resources, such as an access process that is accessing data stored on the storage nodes, or a storage process that is storing data to the storage nodes. For example, a repair policy may detect that another process needs to use a significant part of the shared bandwidth for some period of time, and a repair process may suspend or significantly slow down its usage of repair bandwidth during this period of time and then use more repair bandwidth again after the other processes bandwidth needs have reduced. In this example, a repair policy is essentially running as a background process with respect to bandwidth consumption (e.g., the repair policy backs off on its usage of bandwidth in response to other processes increased bandwidth usage). As another example, a repair policy may have scheduled times when it uses repair bandwidth, and refrain from using repair bandwidth at other times, wherein the scheduled times of repair bandwidth usage are for example times when other processes that share the bandwidth resources are typically quiescent (e.g., a repair process uses repair bandwidth from 1 A.M. to 3 A.M. each morning when there is very little access or storage activity within the storage system). In these cases, the usage of repair bandwidth by a repair server is largely independent of the timing of data loss within the storage system (e.g., the timing of permanent or intermittent storage node failures).

When storing fragments for objects spread across multiple cluster instances of a cluster set, it can be advantageous to use bandwidth sparingly between the cluster instances (e.g., more sparingly than the bandwidth within the cluster instances due to differences in cost and availability). For example, the amount of bandwidth used for storing and accessing objects might be reasonable when storing fragments for the objects across multiple cluster instances, especially if objects are only accessed very infrequently (e.g., the objects comprise so-called "cold data"). However, the amount of bandwidth that would be required for transporting fragments between cluster instances of a cluster set during a repair process might be prohibitively high (e.g., storage nodes can fail at a high enough rate that there would be an excessive amount of expensive traffic between cluster instances of a cluster set if fragments are generated from objects and sent between cluster instances to replace fragments lost from failed storage nodes).

Accordingly, repair processes of embodiments may be provisioned to operate within each cluster instance of a cluster set autonomously (or nearly autonomously) of other cluster instances. Thus, each repair process operates within a cluster instance, and may adjust depending on conditions within that cluster instance, independent of other cluster instances of a cluster set. The recoverability of a source object may be dependent on the overall performance of repair policies acting semi-autonomously within the different cluster instances, and may not be solely dependent on one repair policy operating within one cluster instance. For example, there may be 10 cluster instances in a cluster set, and a first encoding (e.g., an MDS code such as a Reed-Solomon erasure code) may be used to generate first encoding fragments for a source object, and these first encoding fragments may be partitioned between and assigned to the 10 cluster instances. A separate repair process may operate semi-autonomously at each of the 10 cluster instances to maintain the recoverability of a set of the first encoding fragments assigned to that cluster instance using a second encoding (e.g., a non-MDS code having properties similar to MDS codes, such as a RAPTOR FEC code). The set of first encoding fragments assigned to any particular cluster instance may thus be recovered so long as some number of second encoding fragments remain available at the cluster instance, wherein the set of first encoding fragments assigned to the particular cluster instance may be repaired using a decoding corresponding to the second encoding. However, for a variety of reasons, including catastrophic failure of all or most of the infrastructure within a cluster instance, it may be that recoverability of the set of first encoding fragments assigned to at least one cluster instance are no longer recoverable. Accordingly, the set of first encoding fragments may be constructed in such a way that the source object can be recovered from the set of first encoding fragments assigned to any 9 out of the 10 cluster instances, for example.

The access efficiency metric may be considered with respect to a plurality of situations. For example, the access efficiency metric may be considered with respect to the case where there are no node failures (intermittent or permanent) amongst the storage nodes that are used to store the source data, and the case where there are node failures (intermittent or permanent) amongst the storage nodes that are used to store the source data. The amount of data read from storage nodes in order to access a chunk of source data is an important component of access efficiency because this largely determines the speed at which a chunk can be accessed. Ideally, the amount of data read to access a chunk should be equal to the size of the chunk.

Previous solutions for storing and accessing source data within a storage system have primarily focused on using a reactive repair policy with respect to data determined to be unavailable. In operation according to such reactive repair policies, data is scheduled for repair as soon as any data is lost on a permanently failed node, and as much bandwidth as necessary is used to perform repair in a burst. A Markov chain analysis is typically applied to individual objects in the storage system for the reliability analysis of a reactive repair policy. The analysis assumes that the number of objects that need repair is always nearly zero, which is justified if a repair policy can always work quickly enough.

With a reactive repair policy, the overall amount of repair traffic generated is proportional to at least $k+1$ times the amount of data lost on permanently failed nodes, where k is the number of source symbols used by the erasure code. This is because each time a fragment of an object is lost on a permanently failed node, at least k fragments for that object are read by a repair policy to generate at least one repair fragment that is stored on replacement nodes.

Large erasure code solutions in combination with a lazy repair policy achieve better trade-offs in storage efficiency, repair bandwidth efficiency, and reliability than is possible for any small erasure code solution. In particular, the use of a large erasure code according to embodiments provides a number of advantages, such as advantages associated with spreading the data for a particular object over many nodes and providing improved repair and access properties. Such large erasure codes that are not inherently MDS cannot, however, guarantee code performance. That is, although large erasure codes provide very high data recovery reliability of a source object from k fragments (e.g., in the range of 99%), recovery is nevertheless not guaranteed. The use of some additional number of fragments, x, increases recovery reliability (e.g., source object data recovery using k+x fragments, where x=1 provides data recovery in the range of 99.99% and where x=2 provides data recovery in the range of 99.9999%). However, no amount, x, of additional fragments is provably sufficient to guarantee recovery of the source data. Nevertheless, embodiments utilizing large erasure codes provide smoothness and efficiency of repair bandwidth, wherein efficiency may arise from an overhead operating point implemented and diminishing efficiency returns may be realized from operating near k available fragments. Additionally, embodiments realize improved accessibility through operating with a minimum redundancy, Y, (e.g., a minimum number of available redundancy fragments) providing network and device multiplexing gains on latency, wherein accessibility is benefited from a larger number of available redundancy fragments. Moreover, the large erasure codes utilized according to embodiments provides good, albeit probabilistic, data recovery performance along with superior encoding and decoding performance (as compared to small erasure codes).

Figure 2A:
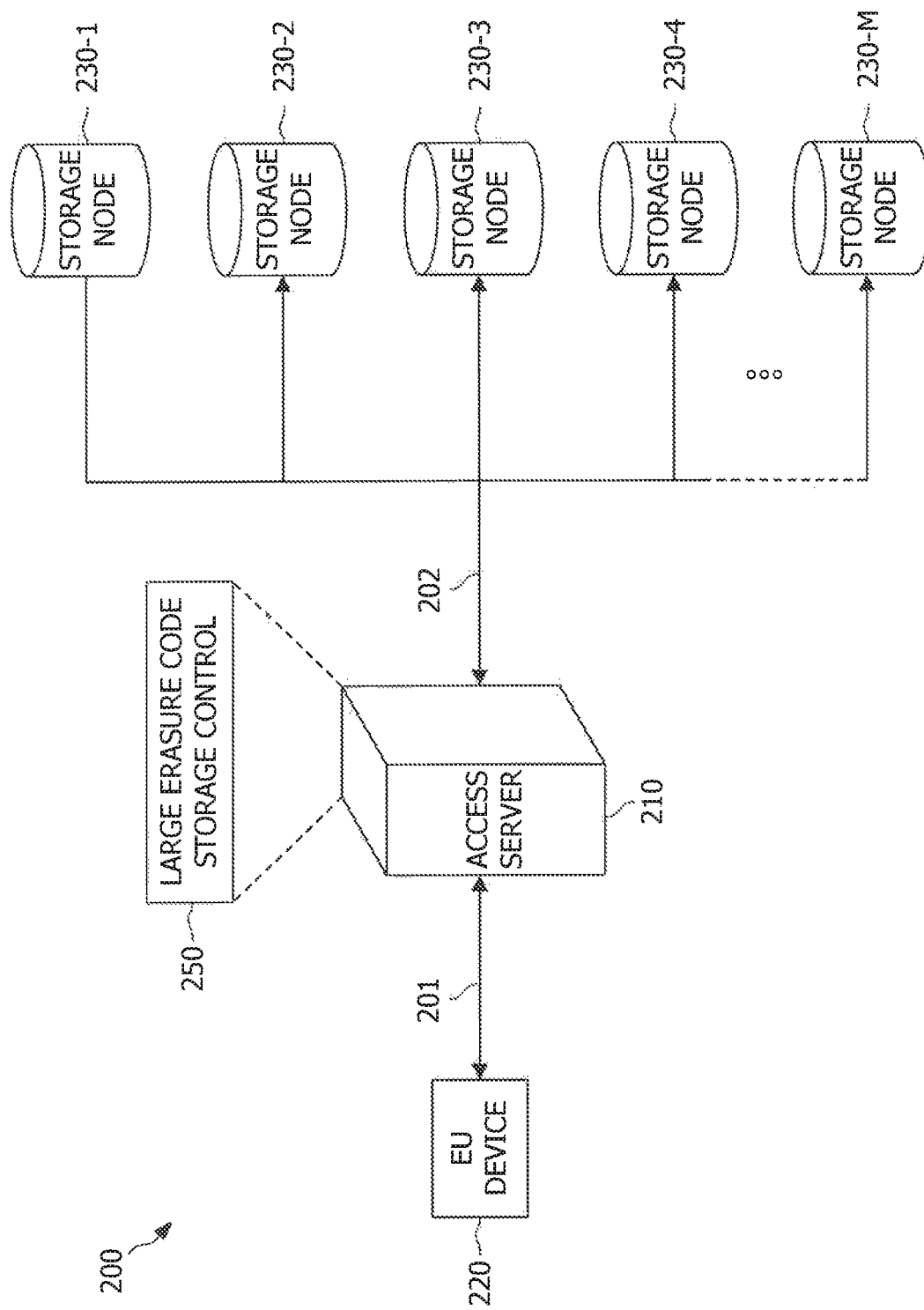
FIGS. 2A and 2B show detail with respect to exemplary implementations of storage systems adapted to provide fragment pre-storage techniques according to embodiments of the present disclosure.
Figure 2B:
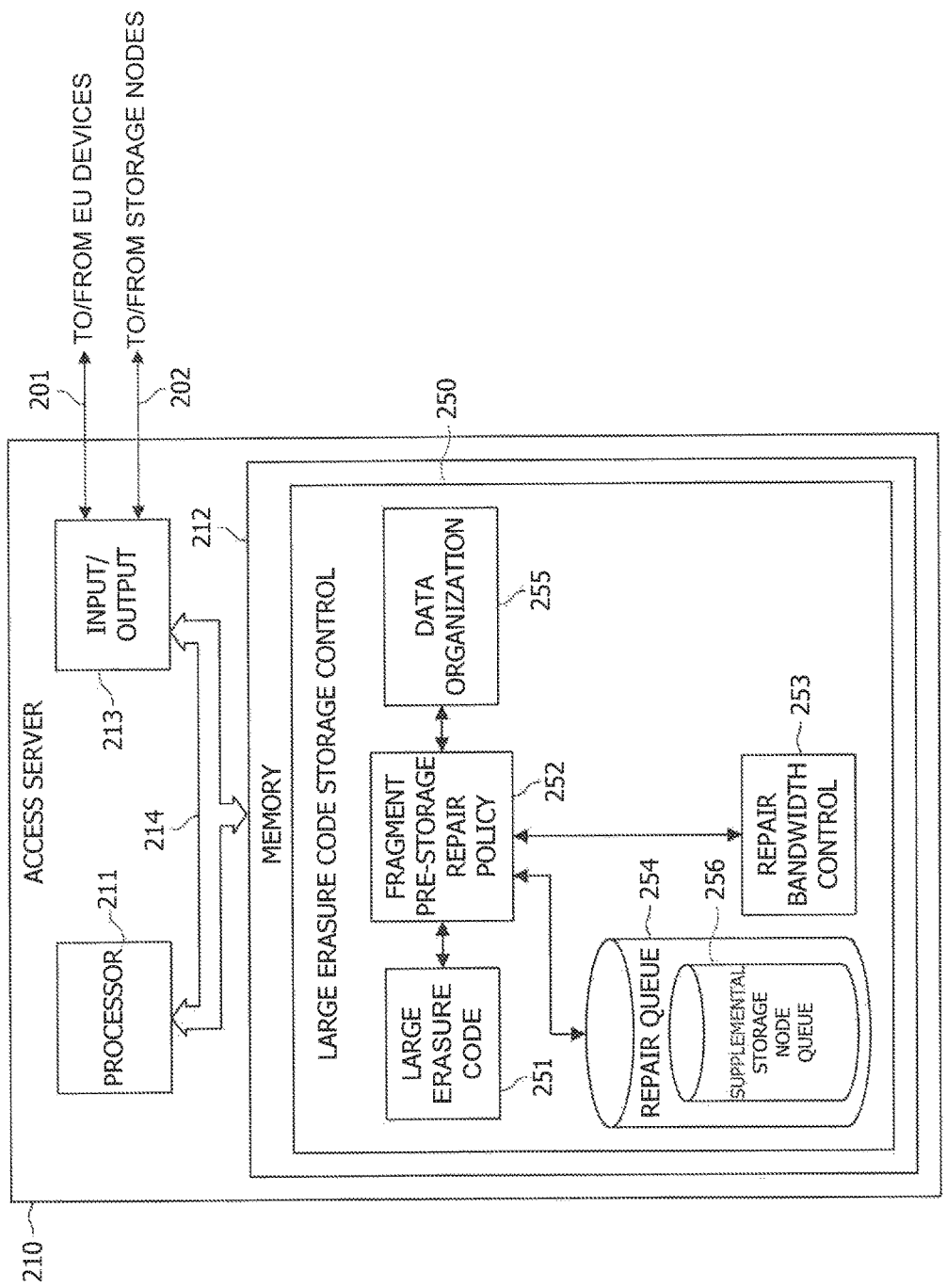

FIGS. 2A and 2B show storage system 200 adapted to provide large erasure code storage control according the concepts disclosed herein. Large erasure control according to embodiments provides pre-generation and pre-storage of fragments in storage system 200. For example, embodiments of a fragment pre-storage technique herein operates to generate a number of fragments for a particular source object that is greater than the number of storage nodes used to store the fragments (e.g., greater than the number of storage nodes in the storage system for certain large erasure codes). The fragments generated which do not have a corresponding assigned storage node for their storage at the time of their generation are thus "pre-generated" and "pre-stored" (e.g., in unused space then being utilized as "supplemental" storage) for later moving to an assigned storage node (e.g., a storage node subsequently added to the storage system). Such pre-generated and pre-stored fragments are thus referred to as transient fragments (until the time they are moved to an assigned storage node, at which point they are referred to as fragments). Although transient fragments may be available for use in data recovery, the transient fragments of embodiments may_not be used for data access (e.g., at least until moved from supplemental storage to an assigned storage node), whereas in other embodiments such transient fragments may be used for data access. Implementation of fragment pre-storage techniques, providing for the pre-generation and pre-storage of transient fragments, provides for reduced storage overhead, operation emulating larger storage overhead than is actually provided, improved repair rates, and/or reduced repair bandwidth according to embodiments herein.

In facilitating the foregoing, the exemplary embodiment of FIG. 2A comprises access server 210, having large erasure code storage control logic 250 according to the concepts herein, in communication with EU device 220 to provide storage services with respect thereto. Source data for which storage services are provided by storage systems of embodiments herein may comprise various configurations of data including blocks of data (e.g., source blocks of any size) and/or streams of data (e.g., source streams of any size). The source objects corresponding to such source data as stored by storage systems of embodiments, may comprise individual files, collections of files, data volumes, data aggregations, etc., as well as portions thereof, as may be provided for storage processing (e.g., encoding, writing, reading, decoding, etc.) as blocks of data, streams of data, and combinations thereof. Thus, source objects herein may comprise application layer objects (e.g., with metadata), a plurality of application layer objects, some portion of an application layer object, etc. Such source objects may thus be quite small (e.g., on the order of hundreds or thousands of bytes), quite large (e.g., on the order of megabytes, gigabytes, terabytes, etc.), or any portion of data that may be separated into fragments or portions of fragments as described herein.

Access server 210 may comprise one or more servers operable under control of an instruction set to receive data from devices such as EU device 220, and to control storage of the data and to retrieve data in response to requests from devices such as EU device 220, wherein the HTTP 1.1 protocol using the GET and PUT and POST command and byte range requests is an example of how an EU device can communicate with an access server 210. Accordingly, access server 210 is further in communication with a plurality, M, of storage nodes (shown here as storage nodes 230-1 through 230-M), wherein the HTTP 1.1 protocol using the GET and PUT and POST command and byte range requests is an example of how an access server 210 can communicate with storage nodes 230-1 through 230-M. The number of storage nodes, M, is typically very large, such as on the order of hundreds, thousands, and even tens of thousands in some embodiments. Storage nodes 230-1 through 230-M may comprise a homogeneous or heterogeneous collection or array (e.g., RAID array) of storage media (e.g., hard disk drives, optical disk drives, solid state drives, RAM, flash memory, high end commercial servers, low cost commodity servers, personal computers, tablets, Internet appliances, web servers, SAN servers, NAS servers, IAN storage servers, etc.) providing persistent memory in which the electronic data is stored by and accessible through access server 210. EU device 220 may comprise any configuration of device (e.g., personal computer, tablet device, smart phone, personal digital assistant (PDA), camera, Internet appliance, etc.) that operates to generate, manage, and/or access electronic data. It should be appreciated that although only a single such device is shown, storage system 200 may operate to serve a plurality of devices, some or all of which may comprise devices in addition to or in the alternative to devices characterized as "end user" devices. Any or all of the foregoing various components of storage system 200 may comprise traditional (e.g., physical) and/or virtualized instances of such components, such as may include virtualized servers, virtualized networking, virtualized storage nodes, virtualized storage devices, virtualized devices, etc.

FIG. 2B shows additional detail with respect to access server 210 of embodiments. Access server 210 of the illustrated embodiment comprises a plurality of functional blocks, shown here as including processor 211, memory 212, and input/output (I/O) element 213. Although not shown in the representation in FIG. 2B for simplicity, access server 210 may comprise additional functional blocks, such as a user interface, a radio frequency (RF) module, a display, etc., some or all of which may be utilized by operation in accordance with the concepts herein. The foregoing functional blocks may be operatively connected over one or more buses, such as bus 214. Bus 214 may comprises the logical and physical connections to allow the connected elements, modules, and components to communicate and interoperate.

Processor 211 of embodiments can be any general purpose or special purpose processor capable of executing instructions to control the operation and functionality of access server 210 as described herein. Although shown as a single element, processor 211 may comprise multiple processors, or a distributed processing architecture.

I/O element 213 can include and/or be coupled to various input/output components. For example, I/O element 213 may include and/or be coupled to a display, a speaker, a microphone, a keypad, a pointing device, a touch-sensitive screen, user interface control elements, and any other devices or systems that allow a user to provide input commands and receive outputs from access server 210. Additionally or alternatively, I/O element 213 may include and/or be coupled to a disk controller, a network interface card (NIC), a radio frequency (RF) transceiver, and any other devices or systems that facilitate input and/or output functionality of client device 210. I/O element 213 of the illustrated embodiment provides interfaces (e.g., using one or more of the aforementioned disk controller, NIC, and/or RF transceiver) for connections 201 and 202 providing data communication with respect to EU device 220 and storage nodes 230-1 through 230-M, respectively. It should be appreciated that connections 201 and 202 may comprise various forms of connections suitable for data communication herein, such as provided by wireline links, wireless links, local area network (LAN) links, wide area network (WAN) links, SAN links, Internet links, cellular communication system links, cable transmission system links, fiber optic links, etc., including combinations thereof.

Memory 212 can be any type of volatile or non-volatile memory, and in an embodiment, can include flash memory. Memory 212 can be permanently installed in access server 210, or can be a removable memory element, such as a removable memory card. Although shown as a single element, memory 212 may comprise multiple discrete memories and/or memory types. Memory 212 of embodiments may store or otherwise include various computer readable code segments, such as may form applications, operating systems, files, electronic documents, content, etc.

Access server 210 is operable to provide reliable storage of data within storage system 200 using large erasure code storage control, such as may be configured to provide liquid distributed storage control. Accordingly, memory 212 of the illustrated embodiments comprises computer readable code segments defining large erasure code storage control logic 250, which when executed by a processor (e.g., processor 211) provide logic circuits operable as described herein. In particular, large erasure code storage control logic 250 of access server 210 is shown in FIG. 2B as including a plurality of functional blocks as may be utilized alone or in combination to provide various aspects of storage control (e.g., liquid distributed storage control operation) for reliably storing data within storage system 200. Further detail regarding the implementation and operation of liquid distributed storage control by a storage system is provided in U.S. patent application Ser. Nos. 14/567,203, 14/567,249, and 14/567,303 each entitled "SYSTEMS AND METHODS FOR RELIABLY STORING DATA USING LIQUID DISTRIBUTED STORAGE," and each filed Dec. 11, 2014, the disclosures of which are hereby incorporated herein by reference.

Large erasure code storage control logic 250 of the illustrated embodiment includes large erasure code logic 251, fragment pre-storage repair policy 252, repair bandwidth control logic 253, and data organization logic 255. It should be appreciated that embodiments may include a subset of the functional blocks shown and/or functional blocks in addition to those shown.

The code segments stored by memory 212 may provide applications in addition to the aforementioned large erasure code storage control logic 250. For example, memory 212 may store applications such as a storage server, useful in arbitrating management, storage, and retrieval of electronic data between EU device 210 and storage nodes 230-1 through 230-M according to embodiments herein. Such a storage server can be a web server, a NAS storage server, a SAN storage server, an IAN storage server, and/or the like.

In addition to the aforementioned code segments forming applications, operating systems, files, electronic documents, content, etc., memory 212 may include or otherwise provide various registers, buffers, caches, queues, and storage cells used by functional blocks of access server 210. For example, memory 212 may comprise one or more system maps that are maintained to keep track of which fragments are stored on which nodes for each source object. Additionally or alternatively, memory 212 may comprise various registers storing operational parameters, such as erasure code parameters, utilized according to embodiments. Likewise, memory 212 may comprise one or more repair queues, such as repair queue 254, providing a hierarchy of source object instances (which represent source objects) for repair processing.

In operation according to embodiments, the source blocks of electronic data are stored in storage system 200 as objects. The source objects utilized herein may, for example, be approximately equal-sized. Source blocks, and thus the corresponding objects stored by the storage system, may comprise individual files, collections of files, data volumes, data aggregations, etc. and may be quite large (e.g., on the order of megabytes, gigabytes, terabytes, etc.). Access server 210 may operate to partition arriving source data into source objects and to maintain mapping of the source data to the source objects (e.g., Map:App-Obj comprising an application or source object map providing mapping of source data to objects). Access server 210 may further operate to erasure encode the source objects, divide the source objects into fragments, store each fragment of a source object at a different storage node, and maintain a source object to fragment map (e.g., Map:Obj-Frag comprising an object fragment map providing mapping of objects to fragments). Accordingly, the objects are partitioned by logic of access server 210 into fragments for storage in the storage system. For example, an object may be partitioned into k fragments for storage in storage system 200. Each of the k fragments may be of equal size according to embodiments. In operation according to embodiments herein the aforementioned fragments may comprise a plurality of symbols.

In implementing such partitioned storage of source data according to embodiments there can be a unique ESI associated with each of the M storage nodes, and all fragments stored on the storage node are generated using the ESI associated with that node. Thus a mapping may be maintained for each storage node indicating the associated ESI and a mapping may be maintained for each source object indicating which fragments are stored on which storage nodes (e.g., a Map:Obj-Frag map indicating the encoded symbol ID (ESI) and the storage node ID for each fragment of each source object). Alternatively, mapping of ESIs to storage nodes may be maintained individually for each object, or for a group of objects and thus a storage node may have a fragment associated with a first ESI for a first object and a fragment associated with a second ESI for a second object. In some embodiments, multiple ESIs may be mapped to the same storage node for an object. For example, the transient ESIs currently assigned to a storage node may be considered to be assigned to that node for at least the fragments stored at that node corresponding to those transient ESIs.

The particular storage nodes upon which the n fragments for any source object are stored may be selected by assigning the source object to a data storage pattern (also referred to as a placement group), wherein each data storage pattern is a set of n preselected storage nodes (e.g., as may be identified by a storage node identifier). That is, a data storage pattern is a set of n storage nodes on which the fragments of a source object are placed. In a typical storage system where n is much smaller than M, the number of patterns t may be approximately a constant multiple of the number of storage nodes M. The number of data storage patterns can vary over time, such as due to storage node failures rendering data storage patterns incident thereon obsolete.

Embodiments herein may for different sets of objects operate to assign ESIs in a different order (e.g., permutation of the ESIs) to the same set of storage nodes of a large/liquid storage system. Furthermore, different sets of ESIs may be assigned to the same set of storage nodes for different sets of objects. In implementing such an ESI pattern for a set of objects (i.e., an ESI pattern is a mapping of a set of ESIs to a set of storage nodes for a given set of objects) technique according to embodiments, a set of ESI patterns is specified to the same set of storage nodes (e.g., the available storage nodes), wherein the ESIs assigned to the same storage node is different across the different ESI patterns. As an example, 100 ESI patterns may be specified that map a given set of 3000 ESIs to the same set of 3000 storage nodes (e.g., where k=2000 and n=3000), wherein the mapping of the ESIs to the storage nodes for each ESI pattern may be specified by choosing independently a random permutation of the ESIs and mapping the permutation to the storage nodes in a fixed order. As source objects are stored in the storage system, they may be assigned to one of the 100 ESI patterns (e.g., in round-robin fashion), whereby the ESI pattern assignments determine which fragments (identified by their ESI) are stored at which storage node for the source object. It should be appreciated that implementation of such ESI pattern embodiments greatly ameliorates the concern that the underlying erasure code, such as RAPTORQ, is not a MDS code, and greatly reduces the risk of having to perform emergency repair at a very high overall peak repair rate.

Irrespective of the particular ESI assignment scheme utilized, the aforementioned mapping information may be updated for source objects indicating which fragments are available when a storage node permanently fails. Access server 210 may operate to determine which source object particular source data (e.g., source data requested by EU device 220) is contained within (e.g., using a Map:App-Obj map) and to read the data from the storage nodes storing the appropriate fragments by determining which of the fragments contain relevant source or repair data (e.g., using a Map:Obj-Frag map).

Figure 2C:
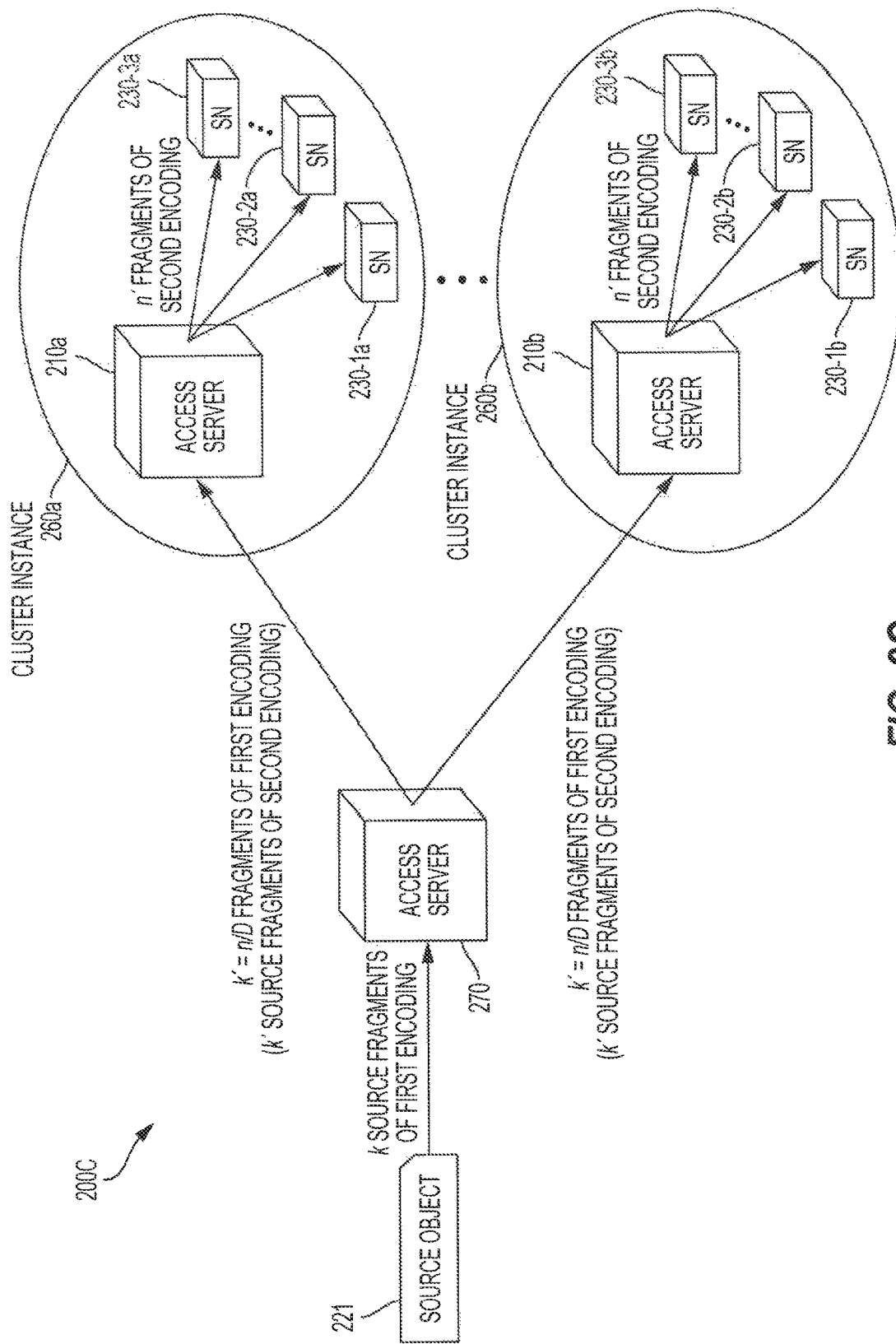
FIG. 2C shows detail with respect to exemplary implementations of a cluster set of a storage system operable to store source objects as fragments spread across multiple cluster instances.

FIG. 2C shows an exemplary implementation of a storage system including cluster set 200C adapted for storing objects as fragments spread across multiple storage system infrastructure cluster instances. In particular, cluster instances 260a and 260b, such as may correspond to different zones (e.g., different geographic zones of a set of geo-distributed locations), are shown in the illustrated configuration of cluster set 200C. It should be appreciated that a cluster set of embodiments may include any number, D, of cluster instances, although only two (D=2) cluster instances are illustrated in FIG. 2C for simplicity. Cluster instances of embodiments herein each provide storage system infrastructure components that operate cooperatively for providing storage of a portion of storage objects stored by cluster set 200C. Accordingly, cluster instances 260a and 260b of the illustrated embodiment include access servers 210a and 210b and storage nodes 230-1a through 230-3a and 230-1b through 230-3b, respectively, as may substantially correspond to the storage system infrastructure components of FIG. 2A having like reference numerals.

The illustrated configuration of cluster set 200C also includes access server 270 in communication with cluster instances of the cluster set (e.g., coupled to access servers 210a and 210b of the illustrated embodiment). Access server 270 of embodiments provides an access server operable to provide encoding, distributed storage and access, etc. with respect to data in a manner similar to that described above with respect to access server 210. However, in operation of access server 270 encoded fragments are stored to and retrieved from a plurality of cluster instances, rather than a plurality of storage nodes, wherein the cluster instances provide storage to and retrieval from a plurality of storage nodes. As will be better understood from the following, access server 270 of embodiments operates to implement a first encoding for fragments of source objects and access servers 210a and 210b of embodiments operate to implement a second encoding for fragments of cluster objects corresponding to the fragments of source objects assigned to the cluster instance.

It should be appreciated that, although the illustrated embodiment shows access servers 210a, 210b and 270 with respect to cluster set 200C, there is no limitation that the functionality described herein be provided by a device or other component referred to as an "access server". Various configurations of functional blocks or storage system nodes (e.g., repair policy logic, storage control logic, etc.) may be utilized according to embodiments in accordance with the concepts herein to provide operation consistent with that described herein. Moreover, there is no limitation to the functionality be distributed within the cluster set as illustrated in the exemplary embodiment of FIG. 2C. For example, in the illustrated embodiment, access server 270 generating the first encoding is different than access servers 260a and 260b generating the second encoding at each cluster instance. In such an embodiment, access servers within cluster instances may be chosen on-the-fly to make up a cluster set for a particular source object, such as depending on how busy the storage system infrastructure components are within the cluster instance, on current network conditions within the cluster instance, etc. In some embodiments, the functionality of access server 270 and access server 210a and/or access server 210b may be combined in the same node (e.g., the node generates the fragments of the first encoding from the source object and all of the sets of fragments of the second encodings from the sets of first encoding of fragments assigned to each geographic location for all of the geographic locations).

In operation according to embodiments, when the fragments for a source object (e.g., source object 221 shown in FIG. 2C, as may be provided by EU device 220 of FIG. 2A) are to be stored across D cluster instances of a cluster set (e.g., cluster instances 260a-260b of FIG. 2C), the source object may be partitioned into k source fragments of a first encoding by operation of access server 270. The first encoding (e.g., as may comprise an MDS code, such as a Reed-Solomon erasure code, a non-MDS code, such as a RAPTOR FEC code, etc.) may be used to generate a total of n first encoding fragments (e.g., generating k source fragments from a source object and generating r repair fragments from the k generated source fragments, wherein n=k+r), wherein any k (or approximately k) of the n fragments of the first encoding are sufficient to recover the k source fragments of the first encoding (and are thus sufficient to recover the source object). The n ESIs of the first encoding associated with the source object may be determined, and the n ESIs of the first encoding may be partitioned into D disjoint sets (i.e., sets having no elements in common) of first encoding fragments (e.g., each set having a plurality of the first encoding fragments) wherein each set is assigned to one of the D cluster instances. For example, the number of the n ESIs of the first encoding assigned to each of the D sets of first encoding fragments may be k'=n/D (e.g., where D=2, set $S_1$ may comprise ESIs 0 through n/2−1 and set $S_2$ may comprise ESIs n/2 through n−1 wherein set $S_1$ may be assigned to cluster instance 260a and set $S_2$ may be assigned to cluster instance 260b). The set of first encoding fragments assigned to a cluster instance are also referred to herein as a "cluster object" (e.g., the fragments corresponding to the ESIs of set $S_1$ being a first "cluster object" and the fragments corresponding to the ESIs of set $S_2$ being a second "cluster object"), in light of that set of fragments being essentially handled as an encoding object at the cluster instance level according to embodiments (e.g., the plurality of fragments of a first encoding set assigned to a particular cluster instance providing a cluster object from which second encoding implemented by the cluster instance generates a plurality of second encoding fragments to be stored by storage nodes of the cluster instance).

When a source object is to be stored, the n fragments of the first encoding associated with the n ESIs of the first encoding can be generated by access server 270 and sent to the respective cluster instances (e.g., cluster instances 260a and 260b of FIG. 2C) according to the assignment of the n ESIs of the first encoding to the D sets (i.e., the cluster objects). The cluster objects (e.g., the k' fragments of a first encoding for an object assigned to a given cluster instance in the above example) may be sent individually to different storage nodes within that cluster instance (e.g., each of the k' fragments of the first encoding may be directly stored at one of storage nodes within the cluster instance). Alternatively, the cluster objects (e.g., the k' fragments of the first encoding for an object assigned to a given cluster instance) may be sent to an access server (e.g., access server 210a or 210b) serving the respective cluster instance, and then this access server may store the k' fragments across the storage nodes at the cluster instance.

In operation according to embodiments, an access server serving a cluster instance (e.g., access servers 260a and 260b of FIG. 2C) considers the received k' fragments of the first encoding as the k' source fragments (e.g., k' source fragments of a cluster object) of a second encoding. Accordingly, an access server operable with respect to a cluster instance may generate additional fragments using the second encoding (e.g., as may comprise an MDS code, such as a Reed-Solomon erasure code, a non-MDS code, such as a RAPTOR FEC code, etc.) from these k' source fragments of the first encoding to generate a total of n'>k' fragments of the second encoding (e.g., generating r' repair fragments from the k' cluster object fragments, wherein n'=k'+r'). The n' second encoding fragments may be stored across the storage nodes of the cluster instance (e.g., storage nodes 230-1a through 230-3a of cluster instance 260a or storage nodes 230-1b through 230-3b of cluster instance 260b) by the access server for the cluster instance. It can be appreciated that in accordance with the foregoing embodiment, the fragments generated for the source object using a decoding corresponding to the first encoding stored by the cluster instance using a second encoding are directly usable interchangeably to recover first encoding fragments of the plurality of first encoding fragments using a decoding corresponding to the second encoding and to recover source fragments of the source object using a decoding corresponding to the first encoding.

Figure 2D:
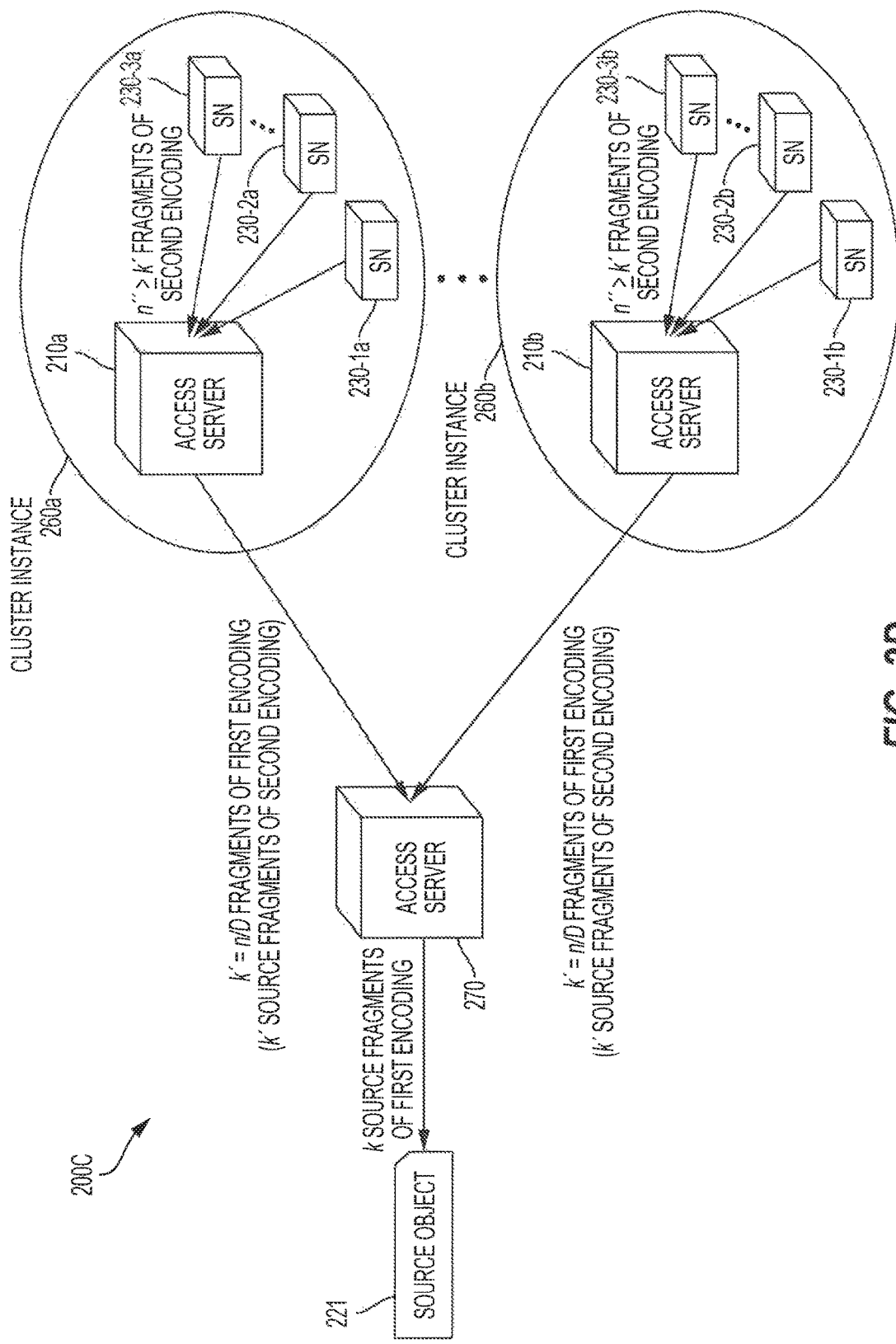
FIGS. 2D and 2E show detail with respect to exemplary implementations of a cluster set operable to access source objects stored by a storage system as fragments spread across multiple cluster instances.

A repair process may be implemented for each of the cluster instances to maintain recoverability of the k' fragments of the first encoding (the "source" fragments, or source object, of the second encoding providing a cluster object for the cluster instance) assigned to the respective cluster instance, such as based on ensuring that there are always at least k' of the n' fragments of the second encoding available at storage nodes within the cluster instance. For example, the access server of each cluster instance (e.g., cluster instances 260a and 260b of FIG. 2C) may autonomously, or semi-autonomously, implement repair process logic, such as may be provided by large erasure code storage control logic 250 shown in FIG. 2B, to provide recovery of lost fragments within the cluster instance and thereby facilitate resilient and reliable storage of the source data. For example, operation of a repair process provided with respect to cluster instances of embodiments may be as described herein with respect to large erasure code storage control 250. Further detail with respect to repair processes as may be utilized with respect to cluster instances of embodiments is shown and described in U.S. patent application Ser. Nos. 14/567,203, 14/567,249, and 14/567,303 each entitled "SYSTEMS AND METHODS FOR RELIABLY STORING DATA USING LIQUID DISTRIBUTED STORAGE," Ser. No. 14/954,877 entitled "CO-DERIVED DATA STORAGE PATTERNS FOR DISTRIBUTED STORAGE SYSTEMS," Ser. Nos. 14/954,609 and 14/954,644 each entitled "SYSTEMS AND METHODS FOR VERIFICATION OF CODE RESILIENCY FOR DATA STORAGE," Ser. No. 14/954,702 entitled "SYSTEMS AND METHODS FOR REPAIR RATE CONTROL FOR LARGE ERASURE CODED DATA STORAGE," Ser. No. 14/954,728 entitled "SYSTEMS AND METHODS FOR REPAIR REDUNDANCY CONTROL FOR LARGE ERASURE CODED DATA STORAGE," Ser. Nos. 14/954,792 and 14/954,814 each entitled "SYSTEMS AND METHODS FOR DATA ORGANIZATION IN STORAGE SYSTEMS USING LARGE ERASURE CODES," and Ser. No. 14/954,855 entitled "SYSTEMS AND METHODS FOR PRE-GENERATION AND PRE-STORAGE OF REPAIR FRAGMENTS IN STORAGE SYSTEMS," the disclosures of which are hereby incorporated herein by reference.

Where each repair process at each cluster instance operates to maintain recoverability of the k' fragments of the first encoding (the k' "source" fragments of the second encoding), access of a source object may be provided as depicted in FIG. 2D. When a source object (e.g., source object 221) is to be accessed, an access server operable with respect to a cluster instance (e.g., access servers 210a and 210b for cluster instances 260a and 260b, respectively) may access at least k' of the n' fragments of the second encoding, and decode the k' source fragments of the second encoding (the cluster object assigned to that cluster instance for the source object) where the accessed k' fragments are not all the "source" fragments of the second encoding (i.e., include repair fragments of the second encoding). The access server may thus provide k' fragments of the first encoding for the source object. In operation, each access server for each cluster instance may thus send its recovered k' fragments of the first encoding to an access server operable with respect to the cluster set (e.g., access server 270), and this access server may use any k of the received fragments of the first encoding (e.g., including any combination of first encoding source fragments and first encoding repair fragments totaling k fragments) to recover the k source fragments of the first encoding (e.g., source object 221).

Figure 2E:
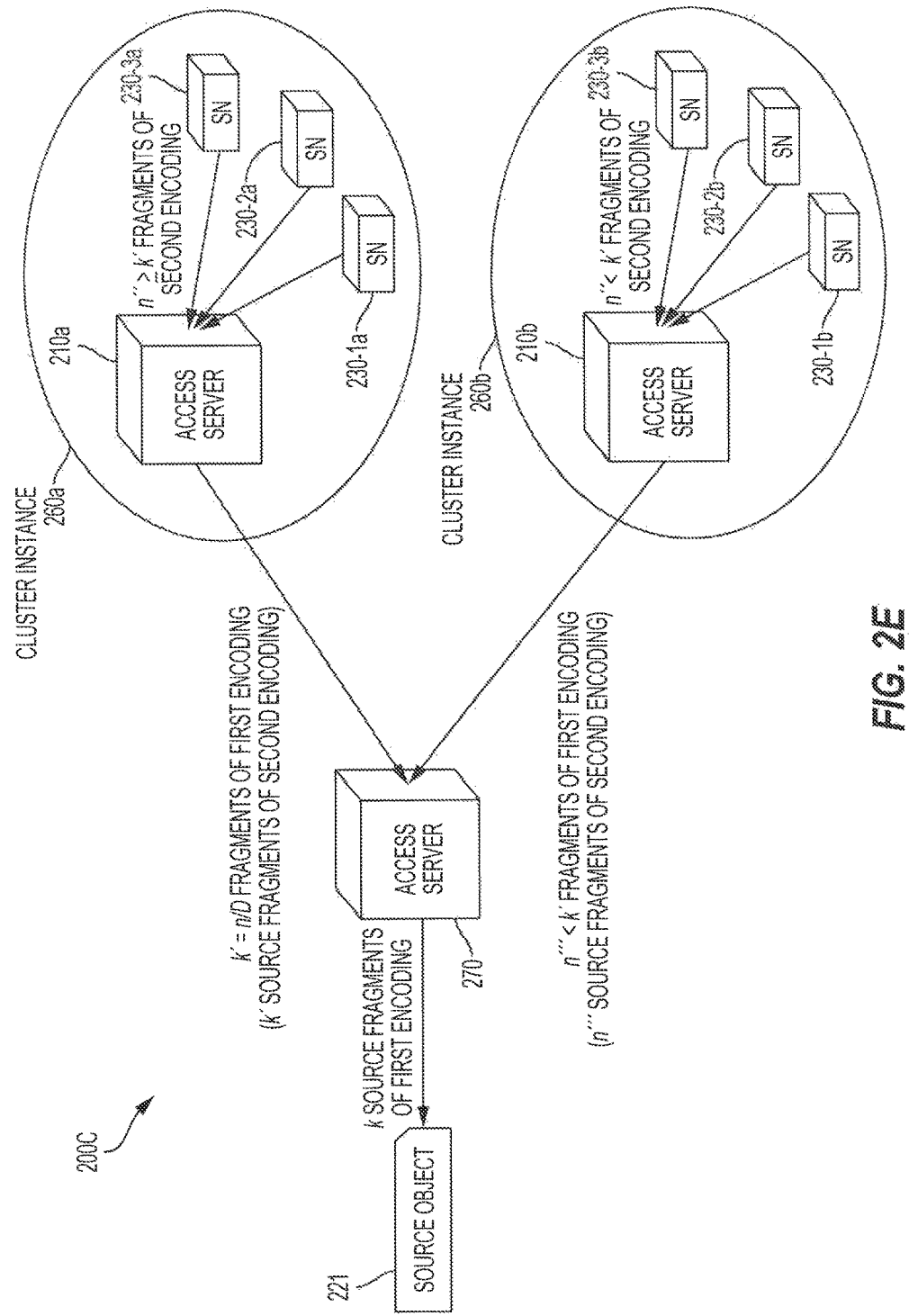

If a repair process for some cluster instance at some point in time fails to maintain recoverability of the k' fragments of the first encoding for a source object (the k' "source" fragments of the second encoding, i.e., the cluster object associated with the source object assigned to the cluster instance), access of the source object may be provided as depicted in FIG. 2E. For example, a repair process of cluster instance 260b may have operated such that only n"<k' of the fragments of the second encoding are available at the cluster instance. In operation according to some embodiments, the second encoding may be designed in such a way that any up to k' of the n' fragments of the second encoding may be used interchangeably to help recover the source object in a decoding corresponding to the first encoding. Accordingly, although a repair process of the foregoing cluster instance may have failed to maintain recoverability of all k' fragments of the first encoding, it still may be the case that at least some of the n" of the available fragments of the second encoding can be used to help recover the source object. For example, a number n'" of the n" of the available fragments of the second encoding may be among the k' fragments of the first encoding (i.e., the original fragments provided to the cluster instance, as opposed to the r' repair fragments generated from the k' fragments by the second encoding). Accordingly, these n'" fragments may be provided by cluster instance 260b of FIG. 2E for use with other fragments of the first encoding from other cluster instances (e.g., cluster instance 260a) to recover the source object using a decoding corresponding to the first encoding at access server 270 of the cluster set. That is, operation for recovery of the source fragments of the source object may use one or more first encoding fragments as recovered by a cluster instance and/or directly using one or more second encoding fragments (e.g., second encoding "source" fragments comprising first encoding fragments) stored by a cluster instance to aggregate k first encoding fragments for use by the decoding corresponding to the first encoding to recover source fragments of the source object.

Figure 7:
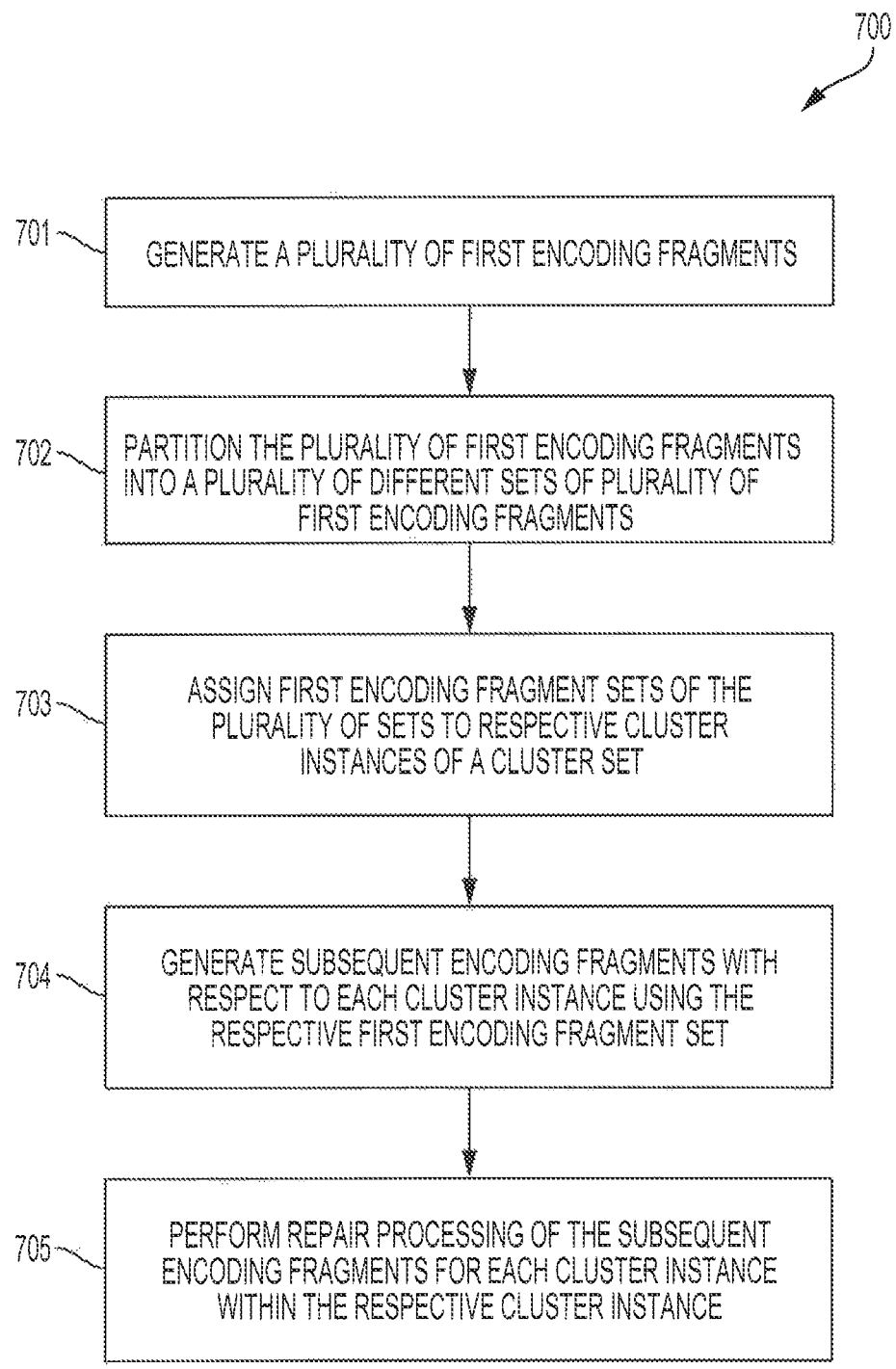
FIG. 7 shows a high level flow diagram of operation with respect to a cluster set storing source objects as fragments spread across multiple cluster instances of a storage system in accordance with embodiments of the present disclosure.

FIG. 7 shows flow 700 illustrating operation of embodiments of cluster set 200C adapted for storing objects as fragments spread across multiple storage system infrastructure cluster instances in accordance with exemplary implementations above. At block 701 of the illustrated embodiment, a plurality of first encoding fragments are generated for a source object. For example, access server 270 may operate to employ a first erasure code to generate a plurality of first encoding fragments from a source object. Thereafter, at block 702 of the illustrated embodiment, the plurality of first encoding fragments are partitioned into a plurality of different sets of a plurality of first encoding fragments. For example, logic of access server 270 may parse the plurality of first encoded fragments into a number of disjoint sets of a plurality of first encoded fragments corresponding to a number of cluster instances in a cluster set. Accordingly, each first encoding fragment set of the plurality of first encoding fragment sets is assigned to a respective cluster instance of the cluster set at block 703 of the illustrated embodiment. Thereafter, at block 704 of flow 700, subsequent encoding fragments are generated (e.g., using one or more of a second, third, etc. encoding) with respect to each cluster instance using the first encoding fragments of the respective first encoding set assigned to the cluster instance. For example, access server 210a of cluster instance 260a may operate to employ a second erasure code to generate a plurality of second encoding fragments from the set of first encoding fragments (e.g., cluster object) assigned thereto and access server 210b of cluster instance 260b may operate to employ a third erasure code to generate a plurality of third encoding fragments from the set of first encoding fragments (e.g., cluster object) assigned thereto, wherein the second and third erasure code may be a same erasure code or different erasure codes. The second encoding fragments may be stored across the storage nodes of the first cluster instance and the third encoding fragments may be stored across the storage nodes of the second cluster instance, according to embodiments. At block 705 of the illustrated embodiment repair processing of the subsequent encoding fragments for each cluster instance is performed by each respective cluster instance. For example, logic of access server 210a may operate to implement a repair process to maintain the recoverability of the fragments stored at that cluster instance using a decoding and encoding corresponding to the second encoding and logic of access server 210b may operate to implement a repair process to maintain the recoverability of the fragments stored at that cluster instance using a decoding and encoding corresponding to the third encoding.

In the foregoing exemplary operation, repair is operated independently at each cluster instance of the cluster set using the aforementioned subsequent encoding without repair traffic associated with such repairs being transported between the cluster instances. In operation according to embodiments, repair may additionally be instituted with respect to a cluster set in some (typically rare) situations, wherein repair traffic associated with such global level repairs is transported between cluster instances of the cluster set. For example, in the case that a repair process operating within a first cluster instance is not able at some point in time to maintain recoverability of the k' fragments of the first encoding assigned to the first cluster instance, a higher level repair may be invoked. Such a higher level repair may be performed by a repair process of access server 270 of the cluster set to provide global level repair operation. In operation of a global level repair, fragments of the first encoding assigned to cluster instances of the cluster set other than the first cluster instance may be accessed (possibly in addition to any remaining fragments of the first encoding still available at the first cluster instance) and used to decode the source object, whereby k' fragments to be assigned to the first cluster instance are generated and generated fragments (e.g., only the fragments that are not among the remaining of the k' fragments of the first encoding still available within the first geographic location are generated and sent to the first geographic location) are sent to the first cluster instance. Thereafter, a repair process operating within the first cluster instance may operate to attempt to maintain recoverability of these k' fragments assigned to the first cluster instance as described elsewhere. Alternatively, instead of completely decoding the source object from fragments of the first encoding before generating additional fragments of the first encoding, fragments of the first encoding may be used to generate additional fragments of the first encoding without completely decoding the source object.

A cluster set embodiment may have the nesting property with respect to fragments of a first encoding for all source objects if every cluster object assigned to every cluster instance can be decoded using a decoding corresponding to a second encoding. The nesting property implies that the set of first encoding fragments available from all cluster instances for a first object with the least number of first encoding fragments available from all cluster instances implicitly determines decodability of all objects. This is because the nesting property implies that the set of first encoding fragments associated with the first object is commonly available for all objects, and thus the decodability of all objects can be implicitly determined based on decodability of the first object from its associated set of first encoding fragments. As another example, a cluster set embodiment may have the nesting property with respect to fragments of a first encoding for all source objects even when for at least some cluster instances not every cluster object assigned to that cluster instance can be decoded using the decoding corresponding to the second encoding. For example, the nesting property can hold for all objects if the repair processes at the cluster instances are coordinated so that for each source object, the cluster objects associated with the source object are repaired at a same or similar time. In general, there will be a large number of commonly available fragments of a first encoding for the source objects for a cluster set embodiment, even when repair processes at different cluster instances operate autonomously or largely autonomously.

In some embodiments, it is advantageous that cluster objects associated with the same source object are repaired at different points in time at different cluster instances, e.g., a first cluster instance repairs its cluster object associated with a source object (generates and stores additional fragments using a second encoding for the cluster object) at a different time than a second cluster instance repairs it cluster object associated with the same source object. This can be advantageous because, the cluster object that is just about to be repaired at a cluster instance is the most vulnerable among all cluster objects assigned to that cluster instance for not being decodable, and thus the cluster objects assigned to the cluster instances for the same object will be vulnerable for decoding failure using the decoding corresponding to the second encoding at different cluster instances at different points in time, instead of all at the same time. This can provide higher overall likelihood of decoding each source object at each point in time. However, when there is a catastrophic failure at a cluster instance, the cluster objects assigned to that cluster instance at the time of the catastrophe may be vulnerable to not being completely recoverable independent of the repair process at that cluster instance.

Embodiments herein may, for different source objects, operate to assign the same ESIs associated with a first encoding to each respective cluster instance of a cluster set. Alternatively, for at least some source objects, at least some different ESIs associated with the first encoding may be assigned to one or more cluster instances for different source objects.

It should be noted that the ESI associated with a fragment of the first encoding may be different than the ESI associated with the same fragment of the second encoding. For example, the first encoding for a source object may operate to assign k' fragments that are repair fragments of the first encoding (e.g., with ESIs greater than k) to a cluster instance. These k' repair fragments of the first encoding are considered as k' "source" fragments of the second encoding within the cluster instance of embodiments, and thus the ESIs of the second encoding associated with these k' repair fragments of the first encoding when considered as k' source fragments of the second encoding may typically be 0, 1, 2, . . . , k'−1.

Although exemplary embodiments have been described above with reference to a same number of fragments being assigned to each cluster instance of a cluster set, it should be appreciated that there is no limitation to assignment of equal numbers of fragments to cluster instances of embodiments. For example, cluster instances of a cluster set may have different attributes (e.g., different storage capacity, different numbers of storage nodes, different communication bandwidth within the cluster instance, different storage node failure rates, different data read/write rates, etc.), whereby the numbers of fragments of a first encoding assigned to the cluster instances may differ based upon one or more such attributes. Moreover, the size of the fragments (e.g., first encoding) provided to various of the cluster instances may differ. For example, the size of fragments provided to a cluster instance may be based upon the particular second encoding used and/or various attributes of the cluster instance (e.g., the number of storage nodes upon which fragments are to be stored).

It should be appreciated that, although exemplary embodiments have been described above with reference to the use of fragments provided by a first encoding of a cluster set being utilized as "source" fragments by a second encoding of a cluster instance (e.g., the fragments provided by the first encoding and the fragments provided by the second, third, etc. encoding may be of a same size), some embodiments may utilize "source" fragments for the second, third, etc. encoding that are of a different size than the first encoding fragments and/or to generate second, third, etc. encoding fragments of a different size than the first encoding fragments. For example, embodiments operate to generate "source" fragments of a different size than provided by the first encoding, such as by an access server of a cluster instance (e.g., access server 210a and/or access server 201b) operating to concatenate the first encoding fragments assigned thereto as a cluster object (e.g., to provide "source" fragments an integer multiple size of the first encoding fragments) and thereafter generate fragments for the second encoding (e.g., generating second encoding fragments an integer multiple size of the first encoding fragments). The foregoing second encoding may, for example, generate k'''' "source" fragments from a concatenated cluster object and generate r'''' repair fragments from the k'''' generated "source" fragments, wherein n''''=k''''+r''''. In operation according to embodiments, since each second encoding source fragment is a concatenation of first encoding fragments, the decoder for the first encoding can directly parse first encoding fragments out of any received second encoding source fragment and use these parsed first encoding fragments in a decoding corresponding to a first encoding.

Cluster instances of cluster sets of embodiments may implement different encoding (second encoding) with respect to each other and/or with respect to a first encoding of the cluster set. For example, each of cluster instances 260a and 260b of cluster set 200C in FIG. 2C may implement different encoding for the fragments stored thereby. Additionally or alternatively, either or both of cluster instances 260a and 260b of cluster set 200C in FIG. 2C may implement different encoding than implemented by access server 270 for the fragments provided to the cluster instances thereby. For example, the number of cluster instances in a cluster set may be relatively small (e.g., 10, 15, etc.), wherein a relatively simple Reed Solomon code may be utilized as a first encoding, whereas the number of storage nodes within a cluster instance may be very large (e.g., 1,000, 10,000, etc.), wherein a large erasure code, such as a RAPTOR FEC code, may be utilized as a second encoding.

Although each of cluster instances 260a and 260b shown in FIGS. 2C-2E are described above as being included in cluster set 200C, not all cluster instances in a storage system need be used in any particular cluster set. For example, some subset of cluster instances implemented in a storage system may be utilized in forming a cluster set with respect to one or more source objects. The particular cluster instances for a cluster set may, for example, be selected on a source object by source object basis, may be selected based upon user attributes, may be selected based on how busy the storage system infrastructure components are within the cluster instance, may be selected based on current network conditions within the cluster instance, etc.

Having described operation of exemplary embodiments of a cluster set adapted for storing objects as fragments spread across multiple storage system infrastructure cluster instances above, additional detail with respect to repair processes as may be implemented within such cluster instances is provided below. It should be appreciated, however, that embodiments herein are not limited to the use of the particular repair processes described in the examples herein. For example, although examples below describe repair processes implementing large erasure codes in liquid storage repair processes, embodiments of a cluster instance may implement small erasure codes, such as in a repair process.

In providing resilient and reliable storage of the data, access server 210 of embodiments utilizes one or more erasure codes with respect to objects (either source objects or cluster objects at the cluster instance level), wherein repair fragments are generated to provide redundant data useful in recovering data of an object. For example, embodiments of large erasure code storage control logic implement erasure codes parameterized as (n, k r), where k is the number of source symbols in a source block, n is the total number of encoded symbols, and r=n−k is the number of repair symbols. In the description below, the term object may refer to either a source object or a cluster object associated with a source object assigned to a cluster instance, or both, depending on the context. The parameters (n, k, r) are generically used below as the parameters associated with the fragments of the first encoding generated from the source object, or as the parameters associated with the fragments of the second encoding generated from a cluster object assigned to a cluster instance.

An (n, k, r) erasure code solution, wherein (n, k, r) are small constants, is said to be a small erasure code solution if $n \ll M$ or if n is small independently of M (e.g. $n < 30$, or $n < 20$). In utilizing such a small erasure code, an object is typically partitioned into k source fragments that are erasure encoded to generate n encoded fragments, wherein r of the n fragments are repair fragments. Of the M storage nodes in the storage system, n storage nodes may then be chosen (e.g., storage nodes chosen randomly, storage nodes having independent failures chosen, etc.) and the n fragments stored to the n chose storage nodes, one fragment per storage node. Maximum Distance Separable (MDS) erasure codes are an example of such small erasure. A repair strategy traditionally implemented with respect to such small erasure codes is a reactive, rapid repair policy.

An (n, k, r) erasure code solution is a large erasure code solution if n=M (i.e., for each object there are fragments stored at all the storage nodes), if n is a significant fraction of M (e.g., $n \geq \frac{1}{2} \cdot M$), or if n is large although perhaps chosen independently of M (e.g., $n \geq 50$, or $n \geq 30$). An exemplary large erasure code such as may be utilized according to embodiments herein include RAPTORQ as specified in IETF RFC 6330, available from Qualcomm Incorporated. Further examples of large erasure codes as may be utilized herein include RAPTOR as specified in IETF RFC 5053, LDPC codes specified in IETF RFC 5170, tornado codes, and Luby transform (LT) codes.

A property of maximum distance separable (MDS) erasure codes is that all k source symbols can be recovered from any k of the n encoded symbols. Particular erasure codes that are not inherently MDS, such as the exemplary large erasure codes herein (e.g., RAPTORQ), provide a high (e.g., 99%) probability that the k source symbols can be recovered from any k of the n encoded symbols and a higher (e.g., 99.99%, 99.9999%, etc.) probability that the k source symbols can be recovered from any k+x (e.g., x=1, 2, etc.) of the n encoded symbols.

In operation, each fragment (i.e., the source fragments and repair fragments) of an object is stored at a different storage node than the other fragments of the object (although multiple fragments are stored at the same storage node in some embodiments). The storage overhead is the ratio of the total target amount of repair data for all objects divided by the total target amount of source and repair data for all objects in the storage system when using a systematic erasure code for storage. Thus, the storage overhead is the target fraction of the used storage that is not for source data.

In some cases, source data is not directly stored in the storage system, only repair data. In this case, there are n repair fragments stored in the storage system for each object, where generally any k (for some erasure codes slightly more than k is sometimes utilized) of the n fragments can be used to recover the original object, and thus there is still a redundant storage of r=n−k repair fragments in the storage system beyond the k needed to recover the object. An alternative type of storage overhead is the ratio of the total target amount of redundant data (r=n−k) divided by the total amount of source data (k), i.e., the storage overhead is r/k for this type. Generally herein r/n is used as the storage overhead, and one skilled in the art can see that there is a conversion from one type of storage overhead to the other type of storage overhead.

In operation according to a reactive, rapid repair policy, repair of missing fragments is implemented at a high bandwidth when a storage node fails. That is, a repair policy causes repair server functionality of an access server to attempt to repair fragments lost on a storage node as soon as possible in order to repair a failed storage node before another storage node fails and in order to avoid objects having more than one missing fragment (as is generally necessary in order to meet reliability targets in light of the small number of repair fragments, or redundant data, available using a small erasure code). Such reactive, rapid repair policies use a large amount of burst repair traffic at times that are dictated by when nodes fail and not at scheduled times. Thus, the burst repair traffic might occur at times when other processes that share the bandwidth are active, such as access processes retrieving data from the storage system or storage processes storing data to the storage system. Thus, if one of these other processes happens to be actively using bandwidth in a period of time that overlaps with the burst repair traffic triggered by a storage node failure, the performance of these other processes can be negatively impacted (e.g., degraded, by the burst repair traffic).

Although small erasure codes, such as those described above (e.g., n<<M), may be utilized in some embodiments, the illustrated embodiment of access server 210 implements (e.g., using large erasure code logic 251) a large erasure code (e.g., n≥½ ·M) solution to provide storing and accessing source data in a reliable and efficient manner within a storage system of unreliable nodes. In utilizing such a large erasure code according to embodiments, an object may be partitioned into k source fragments that are erasure encoded to generate n encoded fragments, wherein in some embodiments r of the n fragments are repair fragments. The n fragments may then be stored to the M storage nodes, one fragment per storage node.

Large erasure code storage control logic 250 of embodiments implements a repair policy in order to provide recovery of lost fragments and thereby facilitate resilient and reliable storage of the source data. For example, a repair policy of large erasure code storage control logic 250 may run in the background (e.g., as a background task to a storage server application) to monitor storage nodes to determine which storage nodes have failed and provide operation to replace fragments stored on the failed storage node. In operation according to embodiments, an object to fragment mapping (e.g., the aforementioned Map:Obj-Frag map) may be utilized to keep track of where fragments are located such that when a storage node is determined to have permanently failed the loss of the fragments stored thereby are identified (e.g., the fragments which are no longer available due to failure of the storage node are determined). These fragments, or some portion thereof, may be tracked in a repair queue for repair operations in accordance with a repair policy.

Although it may be beneficial to use a reactive, rapid repair policy (i.e., when a fragment of an object is lost due to a permanent node failure, a repair policy replaces the lost fragment with another fragment as quickly as possible) for a small erasure code solution, embodiments utilize a lazy repair policy (i.e., objects are allowed to accumulate whereby they may be repaired at a steady repair rate, R), such as through operation of fragment pre-storage repair policy 252. It should be appreciated, however, that embodiments may implement a repair policy other than a lazy repair policy, such as a reactive repair policy.

In implementing a lazy repair policy according to embodiments, a repair rate, R, is designed to ensure a large mean time to loss of any source data (MTTDL). A repair rate may be expressed as the number of bits of objects repaired per second (i.e., the rate in bits per second that objects are processed from a state of missing fragments to a state of having all fragments available). This form of expressing a repair rate is convenient since generally it also corresponds to the rate at which data is read from storage nodes by a repair process. However, there are many other forms of expressing a repair rate. For example, a repair rate may be expressed as the amount of time it takes to repair each object (e.g., in the case when all objects are the same size), or the amount of time per byte of object repair. As one skilled in the art will recognize, any of these forms of expressing a repair rate can be easily converted to another form. Additionally or alternatively, repair bandwidth usage may be scheduled to occur at times that are largely independent of the specific timing of node failures. For example, repair bandwidth may be scheduled to be used for a couple of hours each night when other bandwidth activity, such as access or storage of data, is quiescent. Thus, a repair process may use most or all of the available bandwidth for a short period of time on a regular basis, to avoid interrupting or disrupting other bandwidth intensive activities such as access or storage of data. As another example, a repair process may be scheduled to occur only occasionally when the storage system is powered up, and at other times the storage system is powered down to save on energy consumption and costs. The scheduling of a repair process to use repair bandwidth may also be on an irregular basis (i.e., scheduled when other processes such as reading or writing data to storage are relatively inactive). In every case, a repair bandwidth usage can be crafted to avoid interrupting other processes that send or receive data over some or parts of the same networking paths as used by a repair process, and a repair bandwidth usage can be so crafted independently of the timing of data loss events such as storage node failures. The amount of repair done during these periods may be determined by a repair policy that dictates the desired average rate of repair over longer time periods. Thus, on a longer time scale a repair process is fluid and may be modulated to respond to changing conditions such as node failure rates while on a short time scale a repair may be scheduled for system convenience such as described in the preceding examples.

In operation, logic of a repair policy may, based on the aforementioned system maps, determine which fragments are available and which are missing for each object. Repair processing is performed according to embodiments with respect to those fragments that are determined to be permanently lost, such as due to permanent failure of the storage node upon which the fragment is stored. Permanent failure of the storage nodes is often modeled by a Poisson process parameterized by $\lambda$, which denotes the failure rate of each node according to an exponential distribution. A time varying rate parameter $\lambda$ may be a more suitable model to capture changes in conditions, quality of components, etc.

A repair policy of embodiments maintains a repair queue of object instances (e.g., repair queue 254), which represent objects, wherein an object instance is added to a repair queue for an object when it is possible to generate and store additional fragments for that object (e.g., when storage nodes that store fragments for that object have failed, when new or replacement storage nodes have been added to the storage system, etc.). Embodiments implementing a large erasure code solution using a lazy repair policy may operate to add an object instance to a repair queue when a pre-specified minimum number (e.g., minQ>1, minQ=1, etc.) of fragments for that object are lost due to node storage failures, such as to limit the overall amount of repair traffic. Equivalently, all objects may be in the queue but repair is suspended when no object has more than minQ erased fragments.

Whenever there is at least one object instance in a repair queue that has a sufficient number of missing fragments a repair policy of embodiments works to repair the objects corresponding to object instances in a repair queue. For example, logic implementing a repair policy may linearly cycle through the object instances in a repair queue, read in at least k fragments to recover an object in need of repair, and generate and store additional fragments for the object on one or more replacement storage nodes.

In operation of a lazy repair policy, or other repair policy in which repair of objects is deferred, a repair policy repairs the source data of storage nodes that have failed by writing to them at a relatively slow rate. This results in the storage nodes having available storage space for some significant time. Embodiments herein utilize such available storage space (e.g., as the aforementioned supplemental storage) and/or implement less physical storage space in the storage system (e.g., providing reduced storage overhead) through operation of fragment pre-storage techniques in accordance with the concepts herein. Such fragment pre-storage utilization of the aforementioned available storage space may provide operation emulating larger storage overhead than is actually provided in the storage system, facilitate improved repair rates, and/or facilitate reduced repair bandwidth in the storage system according to embodiments.

Referring again to FIG. 2B, large erasure code storage control logic 250 maintains repair queue 254 that contains a queue of objects for repair. For example, repair queue 254 may comprise representations of objects (e.g., all objects stored by storage system 200) ordered according to their respective missing fragments, whereby objects at the head of a repair queue (e.g., objects having the most missing fragments/least available fragments) are taken up for repair by a repair policy. When an object is repaired by a repair policy, fragments are produced to replace those that have been erased (e.g., due to permanent failure of one or more storage nodes) or otherwise lost. In operation of a fragment pre-storage technique herein (e.g., as implemented by fragment pre-storage repair policy 252), additional fragments (e.g., the aforementioned transient fragments) are produced that can be saved in the storage nodes being repaired while those storage nodes have available space (e.g., the aforementioned supplemental storage). In accordance with embodiments, when a new node is added to replace a storage node that fails, the new node may store different fragments than those stored at the failed node, corresponding to a different ESI than the ESI of the fragments that were lost on the failed node.

The fragment pre-storage repair policy of embodiments may maintain a supplemental queue (e.g., supplemental storage node queue 256, shown as part of repair queue 254) of supplemental storage nodes (e.g., storing code symbols, transient fragments, associated ESIs to be assigned in the supplemental storage node references) indexed by ESIs that will be assigned to storage nodes in the future, wherein the indexing ESIs are hereafter referred to as transient ESIs (i.e., ESIs that are not currently assigned to a storage node). In operation according to embodiments, when a storage node fails the ESI assigned to that storage node enters the tail of the aforementioned supplemental queue (i.e., the ESI is no longer assigned and becomes a transient ESI that will be assigned to a storage node in the future) and transient fragments and code symbols and the like associated with the transient ESI will be generated and stored in transient storage until the time that the transient ESI is assigned to a storage node in the future. Similarly, the transient ESI at the head of the supplemental queue (the transient ESI that has been in the supplemental queue that the longest) is assigned to a new storage node when a new storage node is added to the system. Since the transient ESI assigned to a new storage node at the head of the queue is known prior to its being assigned to the new storage node (at which point that transient ESI becomes a permanent ESI) according to embodiments, transient fragments can be generated (e.g., by generating additional fragments when repair of an object is being performed, during times when the resources of the storage system are not otherwise being used or are under-utilized, etc.) for this transient ESI before it is assigned permanently to a storage node.

The pre-generated transient fragments are stored in the supplemental storage according to embodiments herein, prior to the transient ESI's assignment to a storage node in the future. This pre-generation and pre-storage of fragments may apply to all transient ESIs in the supplemental queue of embodiments. The pre-generated transient fragments for a transient ESI may thus be moved from the supplemental storage to a new storage node added to the storage system when the transient ESI is assigned to the new storage node and becomes the permanent ESI of the new storage node (at which point the transient fragments are permanent fragments associated with the permanent ESI assigned to the new storage node) wherein it is sometimes the case that a new storage node is added to the system to replace a recently failed storage node. It should be appreciated that this process of moving pre-generated transient fragments from supplemental storage to a storage node utilizes less bandwidth than a repair bandwidth utilized by a repair policy in repairing the object (e.g., reading the appropriate number of fragments, decoding the source data, encoding source and/or repair fragments, and writing fragments to the appropriate storage nodes).

Graphical representations of a repair queue for data storage within the storage nodes of a storage system, such as storage system 200, are helpful in understanding the foregoing operation according to embodiments. Accordingly, reference is made to FIGS. 3A-3E which illustrate a repair queue organization of fragments (e.g., including pre-generated and pre-stored transient fragments) stored within the storage system storage nodes (e.g., including supplemental storage, wherein such supplemental storage provides, temporary storage of unassigned pre-generated transient fragments on storage nodes until the pre-generated transient fragments are moved to storage nodes to which they are assigned, at which point they are permanent fragments associated with the permanent ESI assigned to the storage node) according to the concepts herein. It should be appreciated that there are many variants of these methods, including not immediately reusing ESIs assigned to failing storage nodes as transient ESIs, and including determining the timing of when transient ESIs are added to the supplemental storage node queue largely independently of storage node failures, and including determining which values of ESIs are used as transient ESIs largely independently of storage node failures.

Figure 3A:
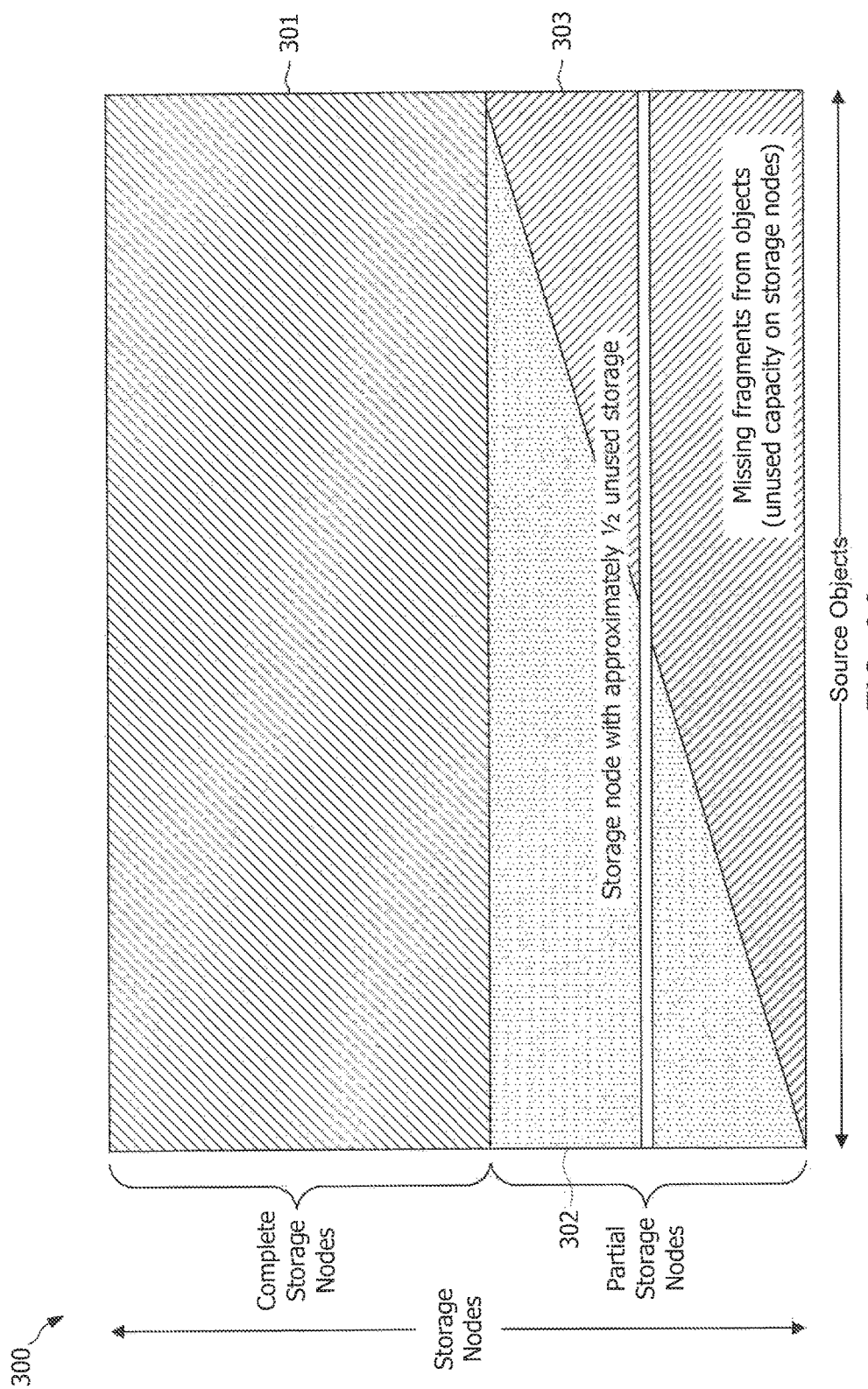

FIG. 3A shows graphical representation (shown as graph 300) of the state of a repair queue with respect to operation of a storage system implementing a lazy repair policy. The storage objects stored by the storage system are represented in the horizontal axis of graph 300 (e.g., each "column" represents an object) while the storage nodes of the storage system are represented in the vertical axis of graph 300 (e.g. each "row" represents a storage node). Graph 300 of the illustrated embodiment includes area 301 corresponding to storage nodes having permanent fragments associated with their permanent ESIs for all objects (referred to herein as complete storage nodes). Graph 300 also includes area 302 (permanent fragments written recently by operation of a repair policy) and area 303 (missing fragments/unused storage space) corresponding to storage nodes having fragments associated with their permanent ESIs for less than all objects (referred to herein as partial storage nodes). Accordingly, the objects towards the right of graph 300 are the objects for which the most fragments are missing, and thus are the objects most in need of repair. It should be appreciated that the areas of graph 300 may not represent the actual scale of storage within a storage system. For example, where a storage system comprises thousands of storage nodes and the storage overhead of the system is a small fraction, area 301 may be significantly larger in proportion to areas 302 and 303.

A lazy repair policy using a large erasure code may, for example, store fragments for each object on each storage node of the storage system (i.e., the number of fragments per object is equal to the number of storage nodes, or n=M). In such a configuration, a storage node may be said to be complete if it has a fragment from every object (i.e., a permanent ESI is assigned to each storage node and a complete storage node stores a permanent fragment for every object associated with its permanent ESI). Accordingly, if such a complete storage node fails, every object loses one fragment. However, it is possible that some storage nodes that fail are not complete (e.g., a storage node recently added to the storage system may fail prior to a repair process repairing all objects, and thus prior to fragments for each object having been stored to the storage node). Such storage nodes may be referred to as partial storage nodes. The failure of a partial storage node results in one or more objects losing a fragment and/or one or more objects not losing a fragment (e.g., objects losing a fragment may change positions in a repair queue with respect to objects not losing a fragment).

Irrespective of whether it is a complete or partial storage node which fails, when a failed storage node is replaced a repair policy may operate to repair the objects for which fragments were lost in the failure of the storage node and to store those fragments on a replacement storage node (i.e., regenerate and store permanent fragments on the replacement storage node with the same permanent ESI as the ESI assigned to the failed storage node). Thus, a repair policy may read fragments corresponding to area 301 (and possibly area 302) of graph 300 and write fragments generated therefrom into storage node portions corresponding to area 303, whereby the associated object logically moves from the right of graph 300 to the left of graph 300. In regulating a repair process (i.e., controlling the rate at which objects are repaired), a system may make use of a repair queue as shown in FIG. 3A (details with respect to providing repair process regulation as may be utilized according to embodiments is provided in U.S. provisional application No. 62/211,303 entitled "SYSTEMS AND METHODS FOR REPAIR RATE CONTROL FOR LARGE ERASURE CODED DATA STORAGE", filed Aug. 28, 2015, the disclosure of which is hereby incorporated herein by reference). In embodiments herein a repair queue is rearranged and repacked for greater storage efficiency. Embodiments described herein nevertheless preserve the properties of a regulated repair process that are used to regulate repair bandwidth, such as the regulated repair processes of the above referenced co-pending patent application. It should be understood that such repair regulation can therefore be used in conjunction with embodiments described herein.

Where a repair policy is a lazy repair policy, or other policy operable to defer repair of objects, an appreciable amount of the storage capacity of many of the storage nodes remains unused for a period of time, awaiting repair of objects by a repair policy. This unused storage is represented by area 303 of graph 300, wherein fragments are to be added (e.g., the recently written fragments of area 302) to the partial storage nodes of FIG. 3A over time. As can be seen in graph 300, half of the storage capacity on average of the partial storage nodes is unused. These partial storage nodes constitute a $\beta$ fraction of the storage nodes in the system (e.g., if the storage system storage overhead or storage redundancy, $\beta$, is 0.33, then approximately 17% (e.g., approximately $\beta/2$) of the overall storage capacity is unused).

Operation of a fragment pre-storage repair policy according to embodiments herein utilizes at least a portion of this otherwise unused storage space as supplemental storage for transient fragments which are pre-generated for use in replacement of fragments to be lost in subsequent storage node failures (or as may otherwise become unavailable or be erased), or more generally transient fragments are pre-generated and eventually moved and assigned permanently to storage nodes added to the system in the future of their generation. Application of the concepts of supplemental storage to implementations of pre-generation and pre-storage of transient fragments not only facilitates reduction in repair rates and/or increased data reliability, embodiments may utilize the supplemental storage to reduce the amount of resources in the storage system (e.g., eliminate some portion of the storage nodes represented in FIG. 3A to thereby reduce the storage overhead).

The implementation of pre-generation and pre-storage of transient fragments according to embodiments facilitates the use of less total storage capacity (e.g., fewer storage nodes in the storage system), while maintaining the performance of a storage system having additional storage. FIGS. 3B-3E illustrate the use of aforementioned supplemental storage to provide operation of a large erasure code, or other deferred repair policy, storage system which uses fewer storage nodes to achieve operation as if a larger number of storage nodes were present in the storage system (i.e., providing supplementation of storage nodes using supplemental storage herein). That is, at least in some embodiments, some portion of the partial storage nodes having relatively few objects with permanent fragments associated with their permanent ESI stored thereon (e.g., the storage nodes towards the bottom of graph 300) may be supplemented by operation of a fragment pre-storage technique of embodiments. It should be appreciated, however, that the concepts described regarding the pre-generation and pre-storage of transient fragments may be applied without the supplementing of storage nodes, if desired. In other embodiments, as described in more detail below, most or all of the storage nodes have a portion of their total available storage space dedicated to supplemental storage and the remaining portion (usually the larger portion) of their total available storage space dedicated to permanent storage of fragments, i.e., storage of permanent fragments associated with the permanent ESI (or ESIs) assigned to the storage node.

Figure 3B:
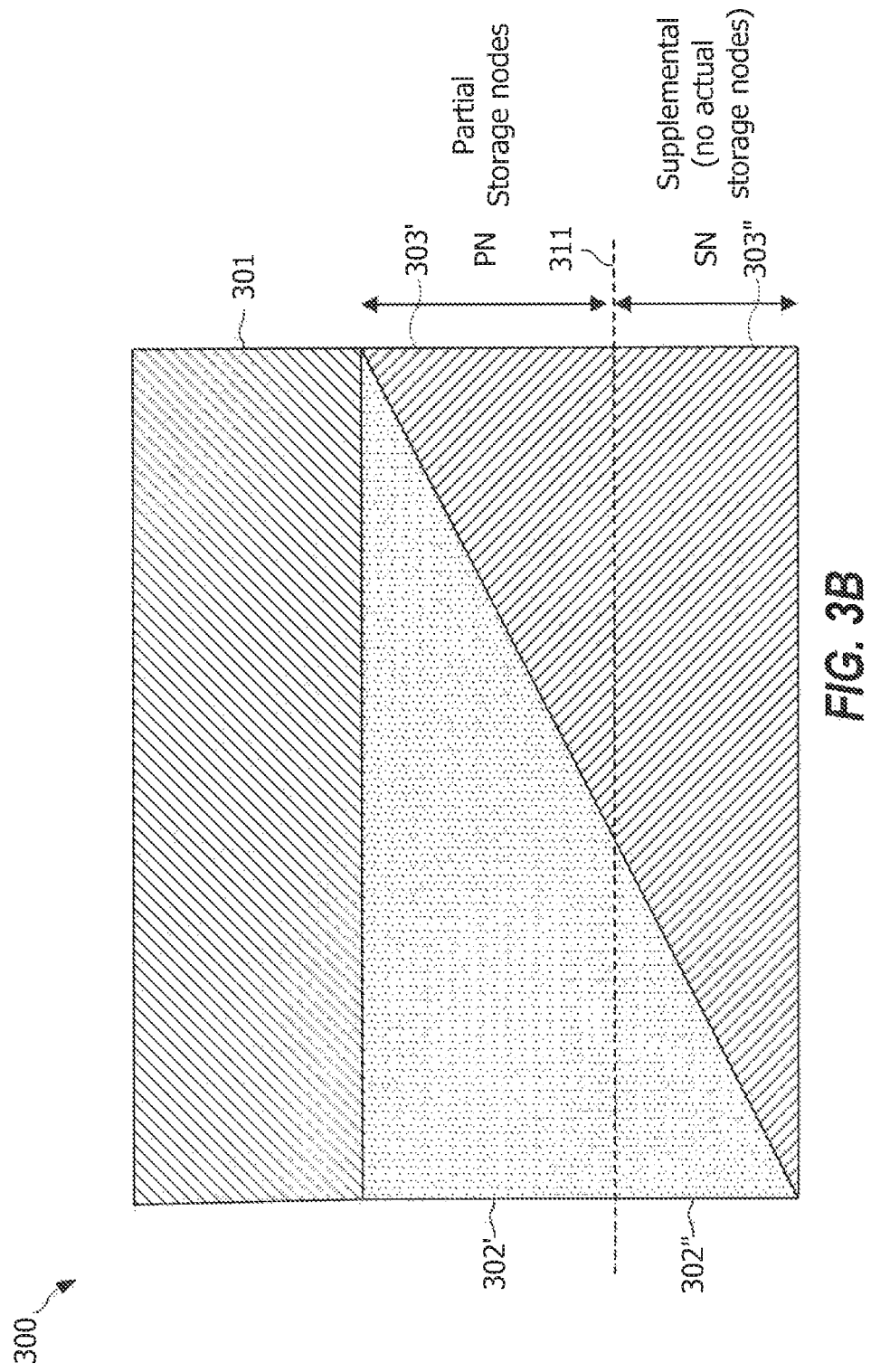

Directing attention to FIG. 3B, line 311 illustrates the portion of the storage nodes that is supplemented according to embodiments herein. The storage nodes represented by the area below line 311 may, for example, be physically absent (e.g., removed or eliminated, or storage nodes that will be added to the system in the future) from the storage system, although operation of the storage system may perform as if those storage nodes were present in the system using a fragment pre-storage technique according to the concepts herein. Alternatively, the storage nodes represented by the area below line 311 may represent additional storage nodes for the storage system (i.e., supplemental storage nodes added to an otherwise full complement of storage nodes, also referred to herein as supplemental storage nodes), such as to provide operation of the storage system as if the storage system has more storage nodes than are physically present, or otherwise having improved performance in one or more aspects. The transient fragments to be stored for the supplemental storage nodes are temporarily stored on existing storage nodes in the system. In selecting the number of supplemental storage nodes for configuring a fragment pre-storage implementation according to embodiments, given a target number of partial nodes (PN), the number of additional supplemental nodes (SN) may be selected such that SN<PN (e.g., the number of supplemental nodes, SN, may be selected such that PN+SN facilitates effective repair meeting one or more performance attributes, such as repair bandwidth, data reliability, repair efficiency, etc.). As one skilled in the art will recognize, there are many variants of these embodiments. For example, as explained in more detail below, in other embodiments the values of PN and SN are largely independent, and in particular SN can be much larger than PN.

As can be appreciated from the discussion of FIG. 3A above, the only portion of the area below line 311 in FIG. 3B for which fragments have been pre-generated and temporarily stored for supplemental storage nodes is represented by the small triangular portion of area 302 below line 311 (designated as area 302" in FIG. 3B). In operation according to embodiments, the fragments corresponding to area 302" will thus be stored in supplemental storage (e.g., some portion of the unused storage of the partial storage nodes above line 311 which are physically present in the storage system, such as a portion of area 303' remaining from area 303) as transient fragments according to the concepts herein. In storing such fragments to supplemental storage of embodiments, the transient fragments may be repacked so as to facilitate their pre-storage (i.e., storage prior to their permanently assigned storage node is added to the storage system) and later moving to an assigned storage node for "permanent" storage thereon (it being understood that "permanent" as used in this context distinguishes over the temporary storage of a transient fragment, and may in fact be erased, altered, modified, deleted, etc. as is common with respect to source data stored in a storage system). For example, the area that is available for supplemental storage according to embodiments is dynamically changing (e.g., as storage nodes fail or fragments are otherwise lost and as storage nodes are added to the storage system, such as to replace a failed storage node, graph 300 shifts up, and as objects are repaired and replacement fragments are generated, graph 300 shifts to the right (while a repaired object moves from the right hand side to the left). Accordingly, the transient fragments stored in supplemental storage according to embodiments are stored in the supplemental storage and oriented in a repair queue (e.g., within supplemental storage node queue 256) in such a way as to facilitate maintaining the proper fragment and storage node correspondence when moved to their permanent storage nodes. For example, the transient fragments may be stored in existing storage nodes in a different organization than is used to store permanent fragments on existing storage nodes. In operation according to embodiments, for each object, all transient fragments for that object are stored in the same existing storage node, whereas each permanent fragment of the object is stored on a different existing storage node. As an example alternative embodiment, the fragments of an object may be organized into batches, wherein each batch of permanent fragments of the object may be stored on a different existing storage node.

Figure 3D:
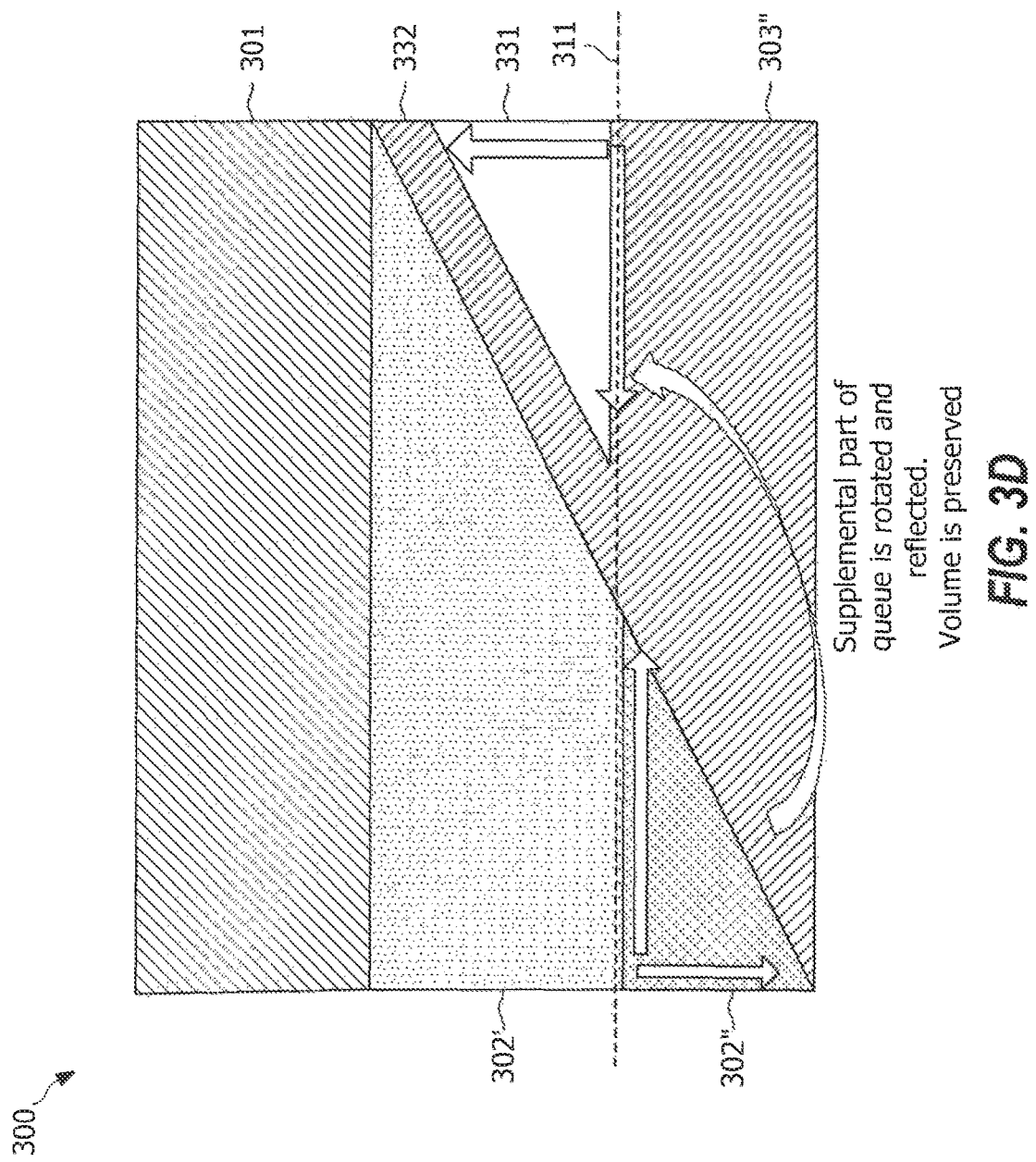

As shown in FIG. 3C, storage nodes being supplemented are oriented horizontally in graph 300 (i.e., each "row" corresponds to a storage node), whereas the objects are oriented vertically (i.e., each "column" corresponds to an object). However, when the storage area represented by area 302" of FIG. 3C is supplemented, the foregoing orientation may be rotated and reflected to facilitate maintaining the proper fragment and storage node correspondence when the transient fragments are moved to their permanent storage nodes, as shown in FIG. 3D. That is, the supplemental storage nodes are oriented vertically in the supplemental storage portion of a repair queue (represented as area 331 in FIG. 3D), whereas the transient fragments for objects are oriented horizontally in the supplemental storage portion of a repair queue. Since in most embodiments the number of stored objects O is much larger than the number of storage nodes M, this reorientation of transient fragments will employ the storage of more than one transient fragment per ESI to be stored in supplemental storage per physical storage node i.e., there will be multiple transient fragments, associated with the same transient ESI but for different objects, stored in supplemental storage on a single physical storage node. In some embodiments the number of objects for which transient fragments associated with the same transient ESI are stored per physical storage node will be at most a value g that depends on the parameters of the storage system.

It should be appreciated that, despite the foregoing remapping of the storage nodes/objects, the volume of the storage area used for storing transient fragments indicated below line 311 is maintained within the supplemental storage provided in the unused storage area above line 311 according to embodiments (e.g., the volume of area 332 is greater or equal to the volume of area 302"). However, some portion of area of unused storage space above line 311 (shown as gap 332 in FIG. 3D) may not be utilized as supplemental storage. For example, a gap between the volume of 332 and 331 may be left in embodiments for efficiency reasons. As objects are repaired the volume in region 302' increases. In the absence of a gap the additional permanent fragments produced would either not be written or would overwrite transient fragments. Since either action represents a loss in efficiency through the loss of the previously produced fragments, it may be desirable to maintain a gap (e.g., to avoid overwriting or dropping fragments). When new storage nodes are added storage volume is added at line 311. Transient fragments would then be moved from region 331 to the now expanded region 302', i.e., transient fragments associated with the transient ESIs assigned permanently to the newly added storage nodes (thus becoming permanent ESIs) would be moved to the newly added storage nodes (thus becoming permanent fragments on these nodes). This process in effect causes the region 331 to shift to the right. If nodes do not fail for an extended period then it is possible that all nodes could be completed by a repair process. In that case, overwriting of the transient fragments would occur. In some embodiments it may be preferable to suspend a repair process when the gap between 332 and 331 is too small to accommodate the fragments produced by an object repair.

In pre-generating transient fragments according to embodiments, wherein the transient fragments are generated for association with, and storage by storage nodes which have not yet been added to the storage system, ESIs (or other information for indicating which fragments are stored on which storage nodes) are utilized which otherwise are not currently in used in the storage system. For example, a permanent ESI (P-ESI) nomenclature may be utilized with respect to ESIs which identify a fragment stream assigned to a particular storage node existing in the storage system (e.g., a fragment stream stored on a storage node when the storage node is fully repaired, such as a fragment stream stored to the complete storage nodes of area 301, or a fragment stream stored on a partial storage node in accordance with a repair policy, such as a fragment stream stored to area 302' of the partial storage nodes), whereas a pre-generated or transient ESI (T-ESI) nomenclature may be utilized with respect to ESIs which identify a fragment stream that is temporarily stored on a particular storage node (e.g., pre-generated and pre-stored transient fragments stored to supplemental storage, such as a fragment stream stored to area 331 of the partial storage nodes) during repair but which are eventually moved to a storage node which replaces a failing storage node in the future to provide that storage node with object fragments. Accordingly, a number of utilized ESIs, i.e., ESIs utilized either as a P-ESI or T-ESI at any point in time, may be greater than the number of storage nodes in the storage system according to embodiments herein. The number of additional ESIs utilized may, for example, correspond to half the storage overhead ($\beta/2$), e.g., the number of ESIs utilized over time may be $M \cdot (1+\beta/2)$, where M in this case is the maximum number of available storage nodes at any point in time. It should be appreciated that the permanent ESIs assigned to failed storage nodes may be ultimately recycled by the system in order to avoid the set of ESIs utilized over the life of a storage system from becoming unmanageably large.

A repair process in which each repair operation generates SN transient fragments is considered as an exemplary embodiment. For simplicity of description, assume that nodes are replaced as soon as they fall. Thus, the total set of ESI's used may be considered invariant. When a node fails its P-ESI appears at the bottom of the supplemental queue, now as a T-ESI, and the replacement node is assigned the T-ESI associated to the uppermost supplemental node in FIG. 3D (i.e., the node located line 311) according to embodiments. The T-ESI that is assigned to the replacement node thereby is promoted to a P-ESI. In this exemplary embodiment it is assumed that all SN transient fragments produced for a given object are stored on a single storage node. This guarantees that when partial storage nodes fail and transient fragments are lost the supplemental queue preserves the nested erased fragment property. This property states that when comparing any two objects in the queue their sets of erased fragments are ordered (i.e., one is a subset of the other). Generally a repair queue of embodiments is ordered so that objects with larger sets of missing fragments are closer to the head of the queue, which in FIG. 3 corresponds to the right hand side. The loss of transient fragments due to the failure of a partial storage node may necessitate a reordering of the queue, but the nested erased fragment property will be preserved in operation according to embodiments. The total number of transient fragments that can be written to a single storage node maybe limited according to embodiments (e.g., an integer g may be introduced which is applied to limit the total number of transient fragments for different objects with the same transient ESI that can be written to a single storage node). In the exemplary embodiment, storage nodes are written with transient fragments in the order in which the nodes are added to the storage system. Accordingly, SN transient fragments continue to be written to a storage node until such time as the node contains g transient fragments with a common ESI which comprises g different objects, or there is insufficient space to write SN fragments without overwriting permanent fragments according to embodiments. Typically g objects will store transient fragments on a single node. Thus, in an efficient use of the transient storage space g will be close to the average number of objects repaired per node failure. The derivation of an effective choice of g will be based on the assumed approximately triangular shape of the (supplemental) repair queue which is a typical steady state shape, but that shape is tied to the ratio of repair rate to the node failure rate. Note that according to the stated policy at most g·SN transient fragments will be stored on any storage node. If there are no storage nodes that can accommodate SN transient fragments according to this rule, then the production of transient fragments is temporarily suspended in operation according to embodiments until such time that there is a storage node that can accommodate SN transient fragments. In the above described embodiment, an assumption of a fixed g is made. Other embodiments may allow g to vary. The variation may be deterministic, e.g. periodic, to achieve an effective fractional g, or it may depend on system conditions such as the supplemental queue. The policy by which at most g fragments from a given ESI are allowed per node may also be relaxed in some aspects of the present disclosure. If, for example, the total number of transient fragments stored on a given node is much less than g·SN but an ESI has g fragments, then alternative embodiments may allow more transient fragments to be written to that node, exceeding g fragments for the otherwise saturated ESI. The embodiment described herein uses a fixed integer g, but it should be appreciated that there are many variations and relaxations of this rule that still achieve on average an appropriate number of transient fragments per storage node.

As can be appreciated from the foregoing, available storage slots (a slot is the space used to store a fragment) of a storage node added to the storage system of embodiments are filled by repairs and storage of pre-generated transient fragments. For example, the next x object repairs may generate x·SN transient fragments, whereby embodiments attempt to store these transient fragments on the partial storage nodes in the order they were added to the system, available space permitting. It should be appreciated, however, that multiple successive object repairs may result in the generated permanent fragments overtaking the residual storage intended for or occupied by the transient fragments. Embodiments may overwrite transient fragments in this case or, alternatively, embodiments may suspend repair until a storage node fails and a new node is added. In an example detailed below, an embodiment that continues to perform repair is assumed. This may necessitate overwriting transient fragments, and thus a method for performing this overwriting while preserving the nested erasure property is also described below.

As previously mentioned, the parameter g may be applied to limit the total number of transient fragments that can be stored on a single storage node. The choice of the parameter g according to embodiments will now be described. The approximate volume (e.g., fragment count) of supplemental storage (e.g., area 331) of embodiments under conditions as shown in FIG. 3, may be give as $\frac{1}{2} \cdot O \cdot SN \cdot (SN/(PN+SN))$, wherein O is the total number of objects, as can be calculated using similar triangles. Accordingly, the base storage node of the supplemental storage nodes (e.g., the base (top) of the triangle of area 302") has $(O \cdot SN)/(PN+SN)$ transient fragments. In repacking according to embodiments, these fragments are spread across PN storage nodes in the supplemental storage (e.g., area 332). On average $(O/PN) \cdot SN/(PN+SN)$ of these transient fragments are stored per node. Thus, in the example embodiment, this number of fragments should be close to g·SN. Since an efficient embodiment may target SN≈PN, for high efficiency, an observation is made that g·SN should be close to O·SN/(PN+SN). Thus, embodiments may choose g as the largest integer such that O/(PN+SN) exceeds g. This gives a typical number of stored transient fragments, of ½ g·SN·PN<½ SN·PN·O/(PN+SN) which is the same as the above calculated transient fragment volume when PN=SN. If the embodiment sought to operate a smaller ratio of SN to PN then a correspondingly smaller g could be selected. Doing so will on average leave a larger gap between area 332 and area 331. This has the advantage of requiring fewer overwrites of transient fragments or fewer suspensions of a repair process while having the disadvantage of lower average utilization of the available storage space. With the stated choice of g then under typical operation as depicted in FIG. 3 with SN=PN the efficiency of the available storage will be high (near 1) while avoiding excessive wasteful overwriting transient fragments. In this analysis, an assumption is made that O is many times larger than (PN+SN), so the rounding of O/(PN+SN) to an integer has small effect.

The basic dynamics of storage of transient fragments in supplemental storage according to embodiments herein is represented in FIG. 3E, wherein areas 302" and 303" associated with the supplemental storage nodes have been omitted from the illustration of graph 300. In operation according to embodiments, upon object repair, area 302' representing the recently written permanent fragments shifts right, as represented by line 321 due to the addition of repair fragments, and transient fragments pre-generated in a repair are written to supplemental storage (represented by area 331) if space is available. Subsequent to a new storage node being added to the storage system (e.g., as represented by row 320 added to the bottom of graph 300 in FIG. 3E), area 331 (supplemental storage) shifts right due to transient fragments being moved to the new node, as permanent fragments, i.e., the transient fragments being assigned to this newly added storage node are moved from the right edge ("column") of area 331 (supplemental storage) to their permanently assigned storage node (e.g., left side of row 320) according to embodiments.

To better aid in understanding operation of a fragment pre-storage technique in accordance with the foregoing, reference is made to FIGS. 4A-4O that illustrate pre-generation and pre-storage of fragments according to an exemplary embodiment. As previously described, the example embodiment will use overwriting of transient fragments by permanent fragments whereas alternative embodiments may choose to suspend repair. In providing the example of overwriting of transient fragments, a technique to preserve the nested erased fragments property according to embodiments is illustrated. In the example illustrated in FIGS. 4A-4O, the total number of objects is 14 (O=14), the target number of partial nodes is 4 (PN=4), the number of additional supplemental nodes is 3 (SN=3), and the transient fragment group size is 2 (g=2). It should be appreciated that in accordance with the transient fragment group size of 2, at most 2 successive fragments with the same ESI from a supplemental storage node are stored per actual node in the supplemental storage area, according to embodiments. For simplicity, the existing storage nodes in the storage system in the example described with reference to FIGS. 4A-4O are assumed to be complete (e.g., area 401 includes all complete storage nodes). It will be readily apparent, however, from the discussion that follows (particularly in light of the discussion of the addition of further new storage nodes below) how the concepts apply to scenarios that include failure of partial storage nodes (e.g., partial storage nodes as discussed above).

FIG. 4A illustrates the addition of a storage node (e.g., replacement storage node for a failed storage node) to the storage system of the example. In particular, the newly added storage node is represented by row 410. As the number of objects in this example is 14, row 410 includes 14 slots (e.g., corresponding to 14 object "columns") for storing fragments, shown as slots 410a-410n.

Figure 4B:
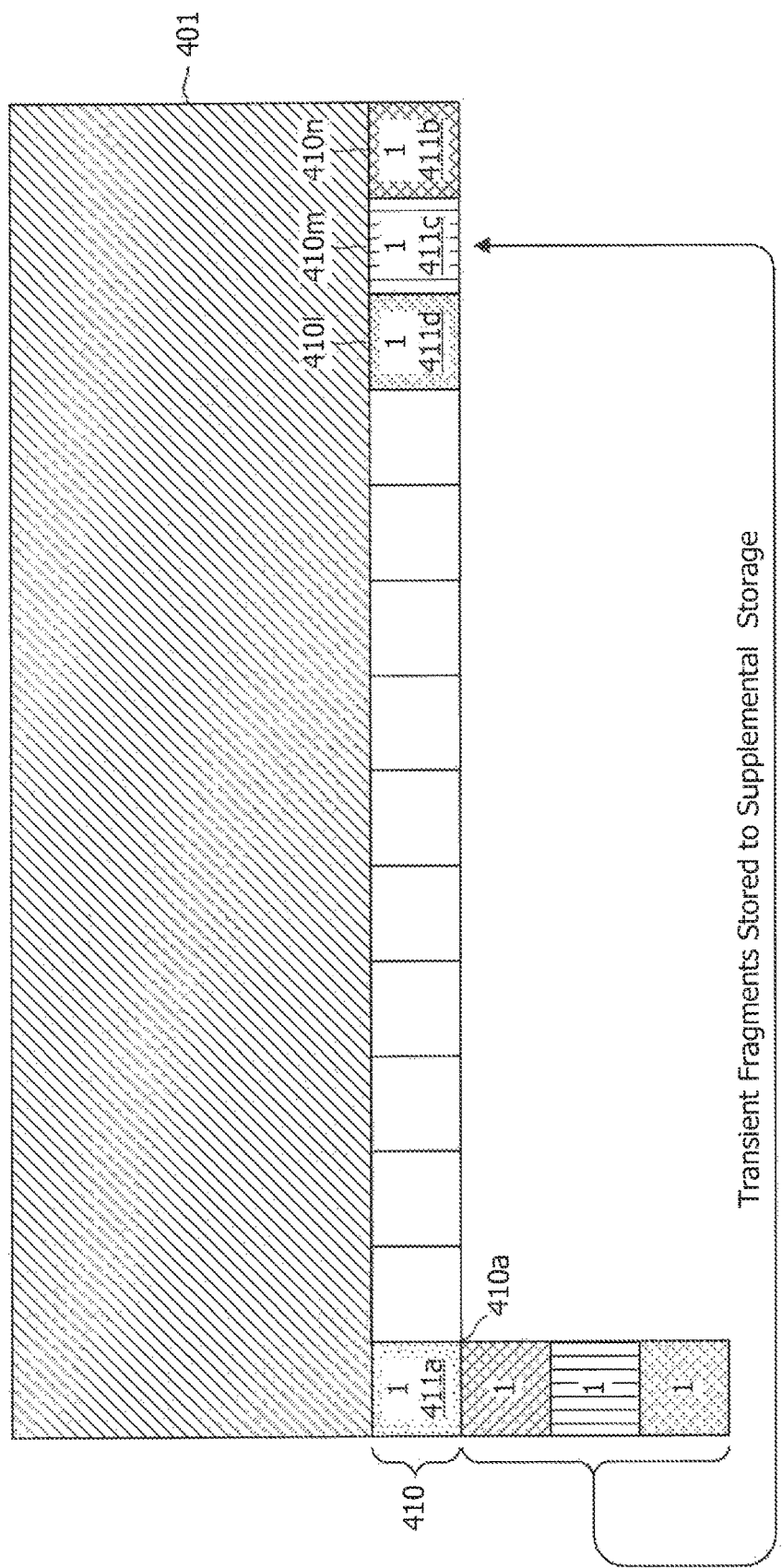
FIGS. 4A-4O show pre-generation and pre-storage of fragments according to embodiments of the present disclosure.

As illustrated in FIG. 4A, the fragment pre-storage repair policy (e.g., fragment pre-storage repair policy 252) of embodiments operates to repair a next object (e.g., designated object "1") in a repair queue (e.g., repair queue 254). However, because the fragment pre-storage repair policy is operable to pre-generate and pre-store fragments, a total number of fragments in excess of the existing storage nodes are provided (e.g., pre-generated fragments for the number of supplemental nodes, SN=3). That is, as shown in the illustration of FIG. 4B, the number of fragments generated (e.g., 4 in the illustrated example) is greater than the number of physical storage nodes missing fragments for that object (e.g., 1 in the illustrated example). For example, the 3 additional fragments pre-generated in the example of FIG. 4B may correspond to up to 3 supplemental storage nodes and/or up to 3 storage nodes of the storage system that will be added to the system upon failure of existing storage nodes. In the embodiment illustrated in FIG. 4B, fragment 411a generated for object 1 is assigned to the newly added storage node of row 410 and is thus "permanently" stored thereon (e.g., as represented by the fragment at slot 410a). Thus, the 'a' in 411a is associated to the P-ESI associated to this node. However, fragments 411b-411d pre-generated for object 1 are stored as transient fragments on the newly added storage node of row 410 (e.g., as represented by the fragments at slots 4101-410n of the supplemental storage).

Figure 4C:
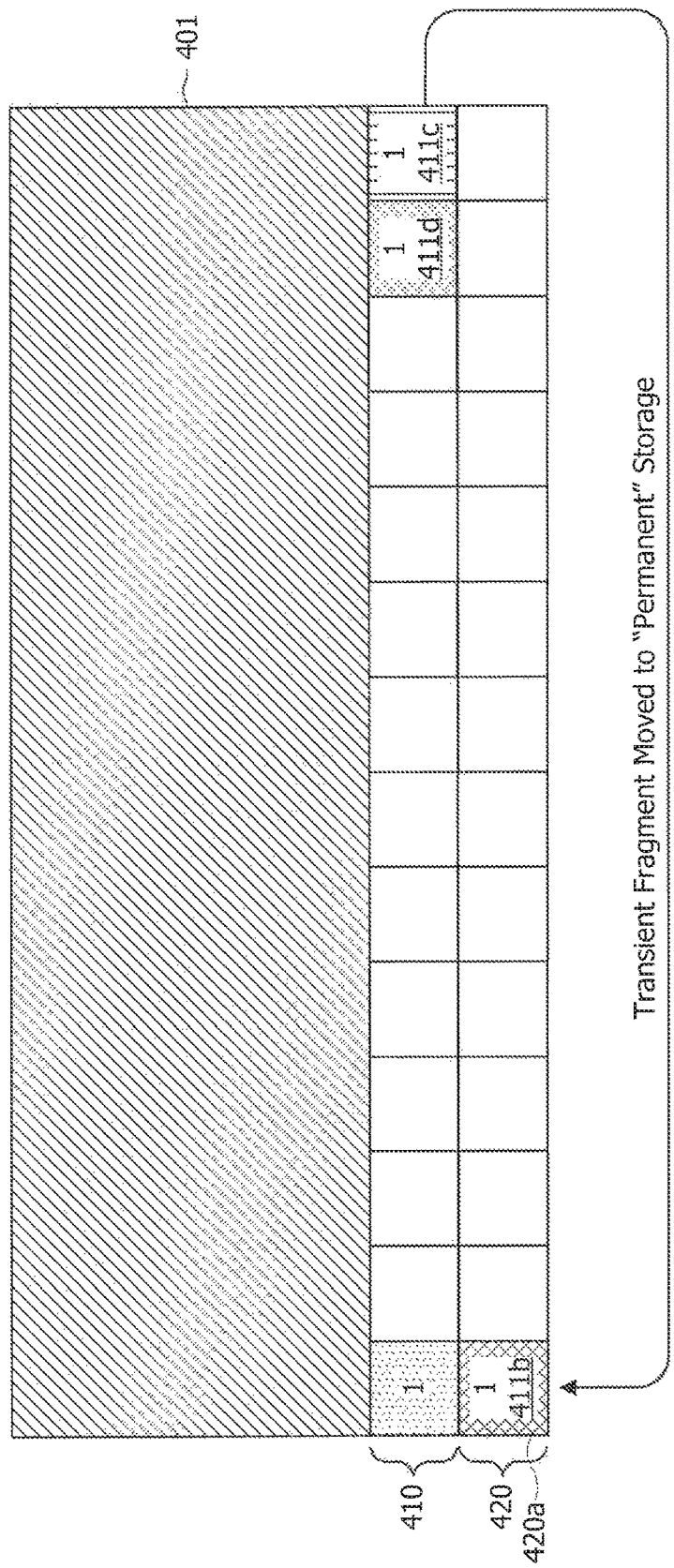

FIG. 4C illustrates the addition of another storage node (e.g., a replacement for another failed storage node) to the storage system of the example. In particular, this added storage node is represented by row 420. It should be appreciated that in operation of the exemplary fragment pre-storage technique, fragments have been pre-generated and pre-stored for later association with and storage to such added storage nodes. Accordingly, in the embodiment illustrated in FIG. 4C, one of the transient fragments (e.g., fragment 411b) is moved to prefill slot 420a of the storage node of row 420 with a fragment for object 1. Correspondingly, the new storage node has a P-ESI corresponding to the 'b' in 411b. It should be appreciated that moving of this transient fragment to permanent storage causes the supplemental queue (e.g., supplemental storage node queue 256) to shift to the right in the illustrated example. It should be appreciated that this movement is for illustration of the concept only and no physical movement of the data corresponding to these fragments takes place. It should also be appreciated that, although the "permanently" stored fragments for the objects are not individually designated in area 401, all the fragments in a column of a repair queue for an object are shifted or otherwise moved in accordance with the shifting or moving of respective "permanently" stored fragments described in the example of FIGS. 4A-4O.

Figure 4D:
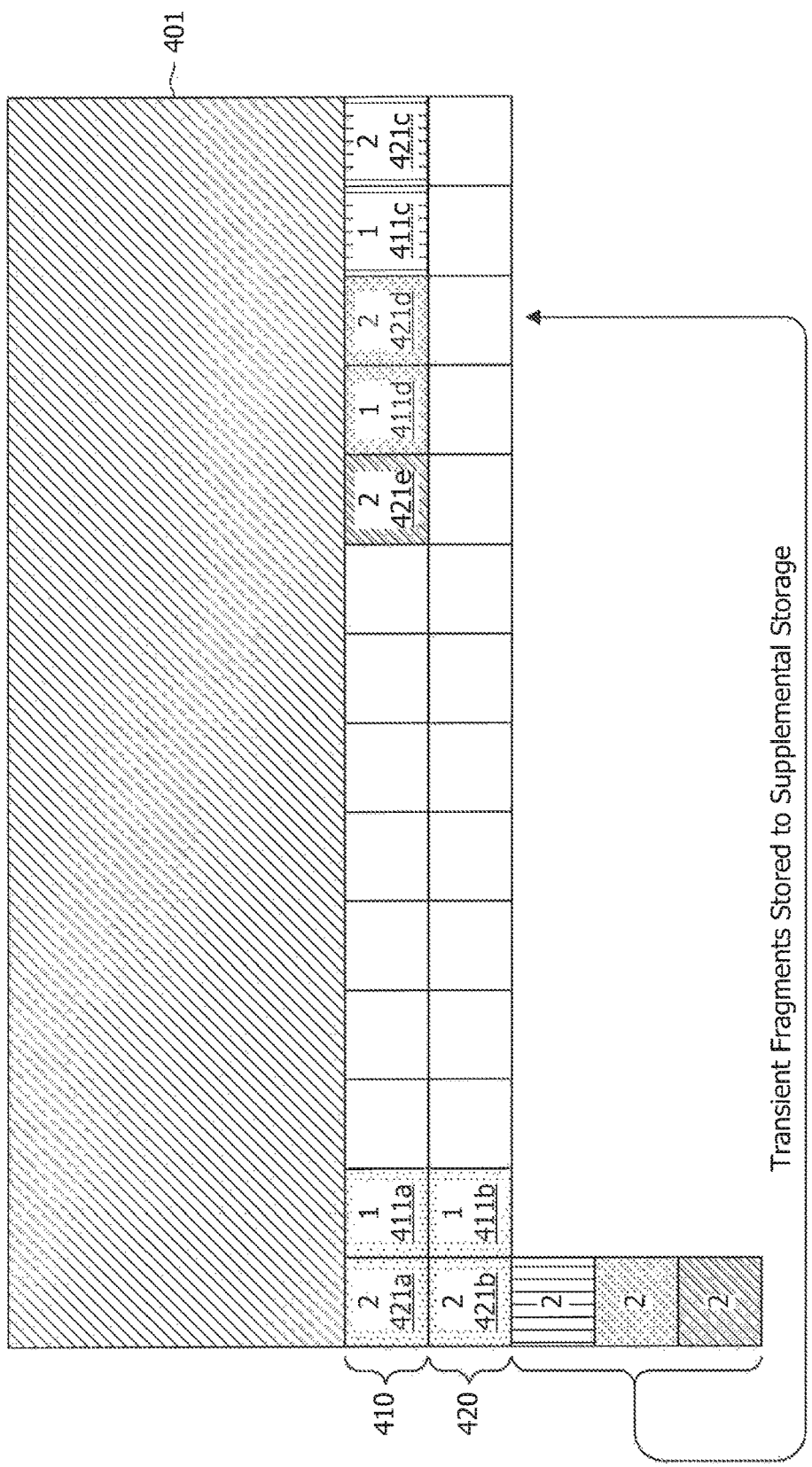

As shown in FIG. 4D, the fragment pre-storage repair policy (e.g., fragment pre-storage repair policy logic 252) of embodiments operates to repair a next object (e.g., designated object "2") in a repair queue (e.g., repair queue 254). However, because the fragment pre-storage repair policy is operable to pre-generate and pre-store fragments, a total number of fragments in excess of the existing storage nodes are again provided as shown in FIG. 4D. For example, 3 additional fragments, corresponding to the number of additional supplemental nodes is 3 (SN=3) in this example, are shown as having been pre-generated in FIG. 4D. In the embodiment illustrated in FIG. 4D, fragments 421$a$ and 421$b$ are generated for object 2 and are assigned to the newly added storage nodes (e.g., represented by rows 410 and 420) added since any previous repair of object 2 and are thus "permanently" stored thereon (e.g., as represented by fragments in the left most slots in a repair queue corresponding to their having been the most recently written fragments). However, fragments 421$c$-421$e$ are pre-generated for object 2 and are stored as transient fragments on the newly added storage node of row 410 (e.g., in slots at the left of the row corresponding to supplemental storage). Row 410 is chosen because the group limit g, which is 2 in this example, has not been reached for any ESI (or supplemental node).

It should be appreciated that pre-generated fragments 411$c$ and 421$c$, although being for different objects (i.e., object 1 and object 2, respectively), correspond to a same supplemental storage node (e.g., these fragments may have a same T-ESI). Similarly, pre-generated fragments 411$d$ and 421$d$, although being for different objects, correspond to a same supplemental storage node, wherein this supplemental storage node is a different supplemental storage node than corresponds to pre-generated fragments 411$c$ and 421$c$ (e.g., fragments 411$d$ and 421$d$ may have a same T-ESI, and that T-ESI may be different than a T-ESI for fragments 411$c$ and 421$c$). It should also be appreciated that the transient fragment group (i.e., group size g=2 in this example) has been achieved for the supplemental storage node corresponding to fragments 411$c$ and 421$c$ as well as for the supplemental storage node corresponding to fragments 411$d$ and 421$d$. However, the transient fragment group for the supplemental storage node corresponding to fragment 421$e$ has not been achieved. In FIG. 4D transient fragments corresponding to the same T-ESI for different objects have been depicted as adjacent. The T-ESIs are ordered from right to left in the order in which the T-ESI's will be promoted to P-ESIs. Thus, the next new node will be assigned the P-ESI associated to the 'c' in 411$c$ and 421$c$. This is only for illustration purposes, no rearranging of fragments is actually performed. This ordering corresponds to the intuitive picture that upon the introduction of a new storage node the set of transient fragments (331 in FIG. 3D) shifts right when the appropriate transient fragments are moved to the new storage node.

Figure 4E:
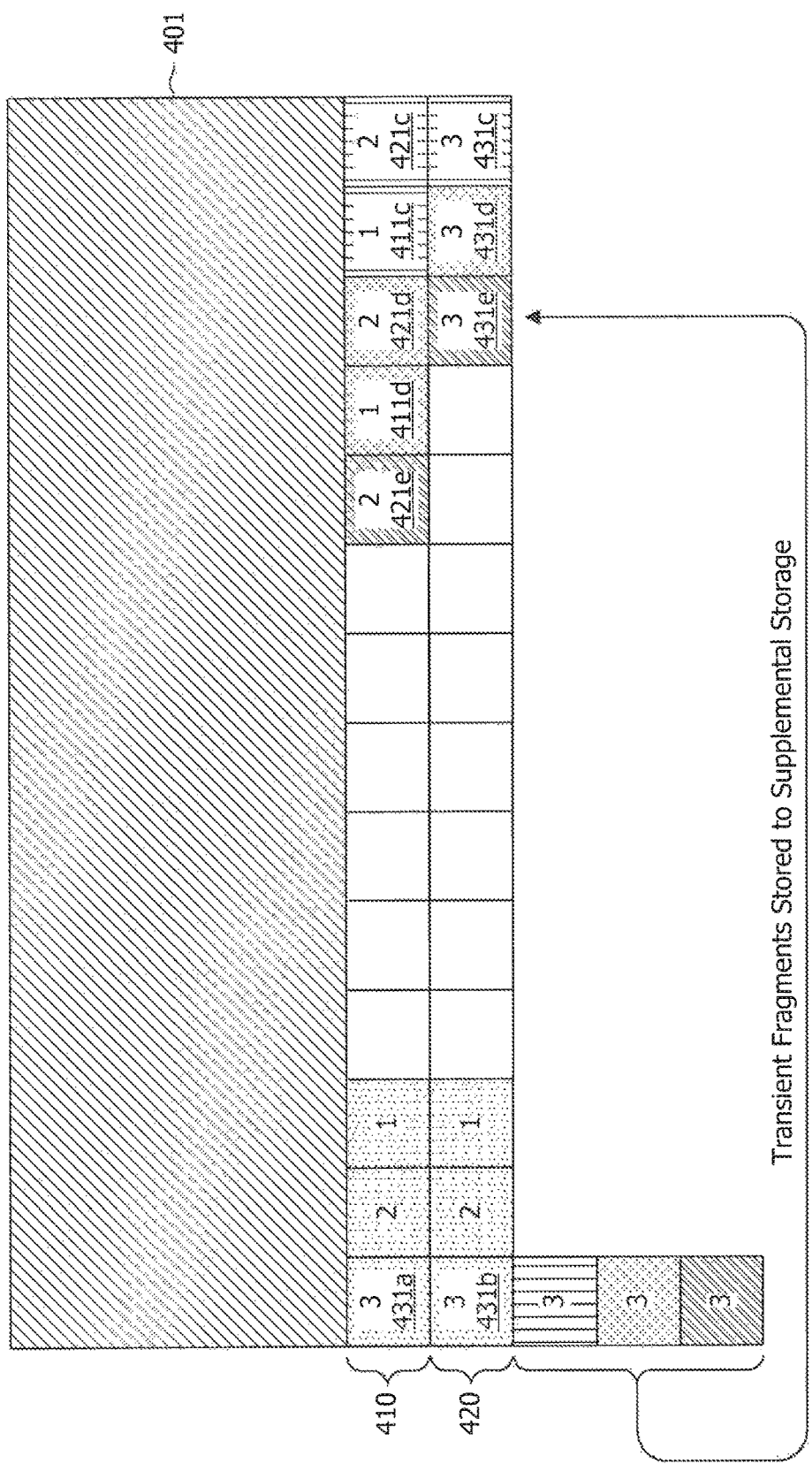

As shown in FIG. 4E, the fragment pre-storage repair policy (e.g., fragment pre-storage repair policy logic 252) of embodiments operates to repair a next object (e.g., designated object "3") in a repair queue (e.g., repair queue 254). However, because the fragment pre-storage repair policy is operable to pre-generate and pre-store fragments, a total number of fragments in excess of the existing storage nodes are again provided as shown in FIG. 4E. For example, 3 additional fragments, corresponding to the number of additional supplemental nodes is 3 (SN=3) in this example, are shown as having been pre-generated in FIG. 4E. In the embodiment illustrated in FIG. 4E, fragments 431$a$ and 431$b$ are generated for object 3 and are assigned to the newly added storage nodes (e.g., represented by rows 410 and 420) added since any previous repair of object 3 and are thus "permanently" stored thereon (e.g., as represented by fragments in the right most slots in a repair queue corresponding to their having been the most recently written fragments). However, fragments 431$c$-431$e$ are pre-generated for object 3 and are stored as transient fragments on the newly added storage node of row 420 (e.g., in slots at the right of the row corresponding to supplemental storage).

It should be appreciated that in the example of FIG. 4E, fragments 431$c$-431$e$ are stored in slots of storage node 420 that form part of the supplemental storage of the illustrated embodiment. This is because a threshold for the fill of transient fragments in the newly added storage node corresponding to row 410 has been met. Accordingly, fragments 431$c$-431$e$ are shown as stored in slots of the newly added storage node corresponding to row 420. Here, according to embodiments, the policy that no more than g=2 fragments corresponding to a single transient ESI may be stored on a partial node necessitates that fragments indicated by 431$b$ and 431$c$ be stored on the second partial storage node, 420. Fragment 431$e$ could be stored on partial storage node 410 without violating this policy but in this example the additional constraint that all transient fragments associated to a given object should be written to a single partial storage node is imposed. This constraint simplifies the organization of the transient fragments according to embodiments. In particular upon failure of a partial storage node the transient fragments lost comprise the bottom most set of transient fragments for the associated objects. These, objects may then need to be moved closer to the head in the queue, but it is clear that the nested erased fragment property is preserved. Another advantage of this constraint is that storage node 420 may coincide with the processor being used to perform a repair of object 3 and that having all transient fragments written to that node reduces usage of network bandwidth.

Figure 4F:
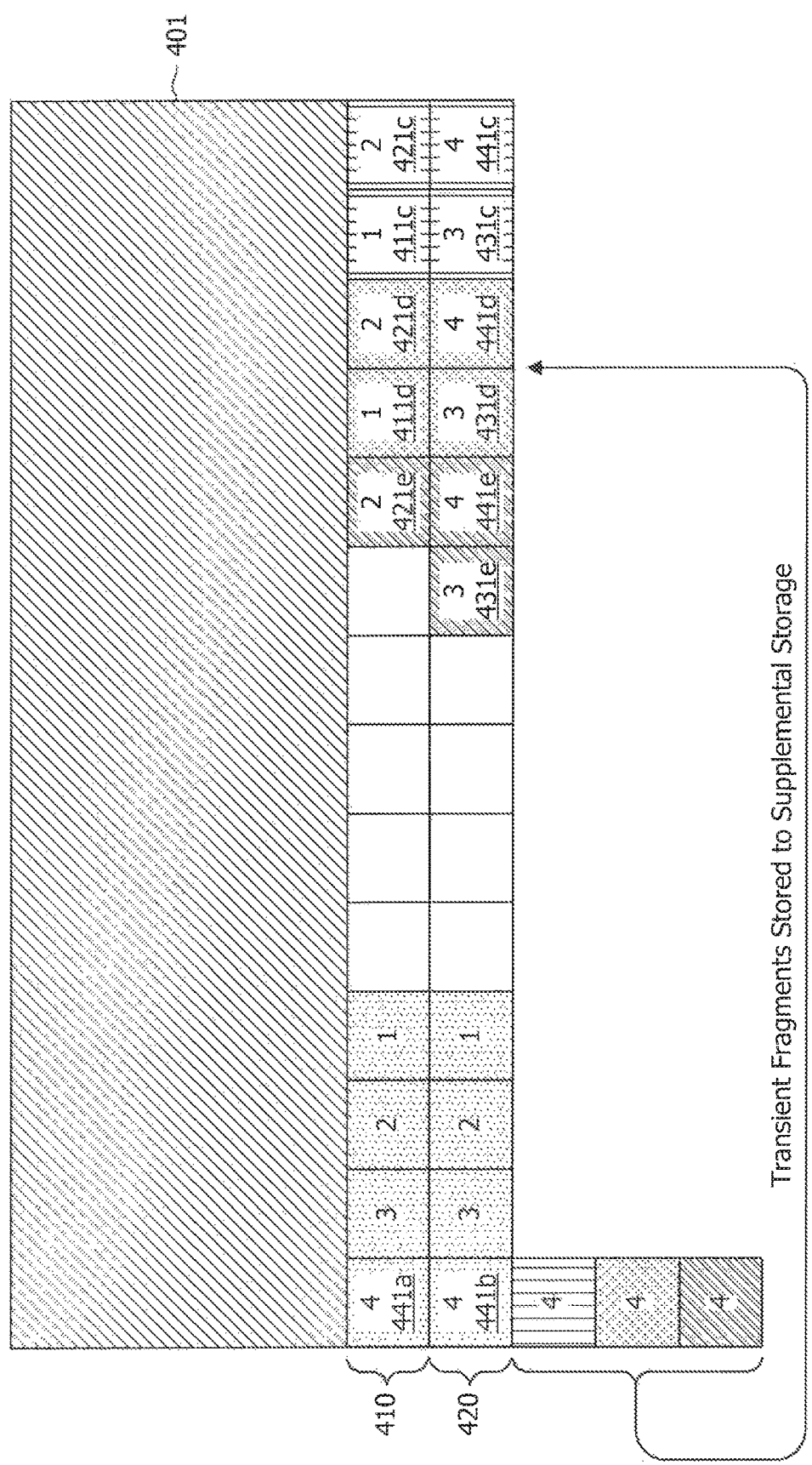

As shown in FIG. 4F, the fragment pre-storage repair policy (e.g., fragment pre-storage repair policy logic 252) of embodiments operates to repair a next object (e.g., designated object "4") in a repair queue (e.g., repair queue 254). However, because the fragment pre-storage repair policy is operable to pre-generate and pre-store fragments, a total number of fragments in excess of the existing storage nodes are again provided as shown in FIG. 4F. For example, 3 additional fragments, corresponding to the number of additional supplemental nodes is 3 (SN=3) in this example, are shown as having been pre-generated in FIG. 4F. In the embodiment illustrated in FIG. 4F, fragments 441$a$ and 441$b$ are generated for object 4 and are assigned to the newly added storage nodes (e.g., represented by rows 410 and 420) added since any previous repair of object 4 and are thus "permanently" stored thereon (e.g., as represented by fragments in the right most slots in a repair queue corresponding to their having been the most recently written fragments). However, fragments 441$c$-441$e$ are pre-generated for object 4 and are stored as transient fragments on the newly added storage node of row 420 (e.g., in slots at the right of the row corresponding to supplemental storage).

Figure 4G:
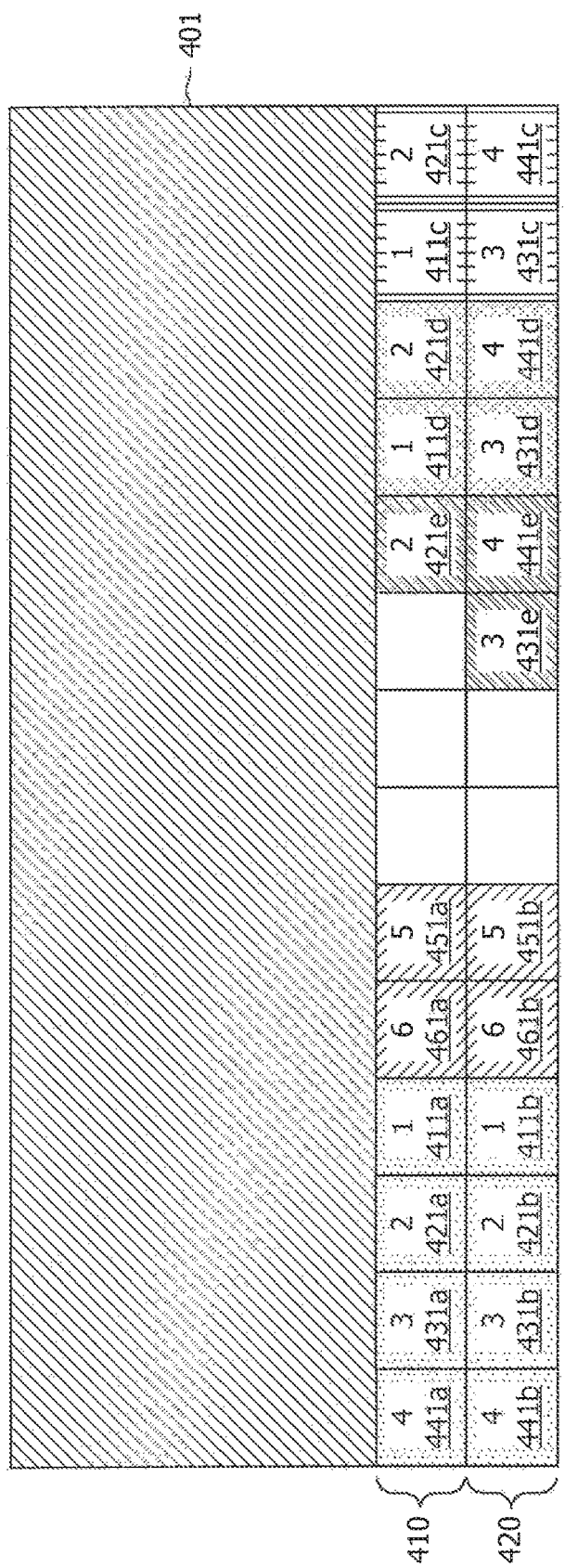

Operation according to embodiments wherein the supplemental storage is essentially filled with pre-generated, pre-stored transient fragments (e.g., fragments 411$c$, 411$d$, 421$c$-421$e$, 431$c$-431$e$, and 441$c$-441$e$) is shown in FIG. 4G. In the example, the maximum group size g has been reached for T-ESI c, d, and e in storage node 420. It has also been reached in storage node 410, with the exception for T-ESI e discussed previously. The reason for these constraints is to avoid in the inefficiency of overwriting transient fragments in typical operation. In such a situation, when transient storage is saturated, embodiments may suspend repair until another node fails and a replacement node is added, or proceed with repair potentially overwriting transient fragments. In the example of FIG. 4G the system proceeds with repair. In accordance with this embodiment, when the fragment pre-storage repair policy (e.g., fragment pre-storage repair policy 252) operates to repair the next object(s) (e.g., designated objects "5" and "6" in the example of FIG. 4G) in a repair queue (e.g., repair queue 254) and the storage node space utilized for supplemental storage is filled, embodiments of the fragment pre-storage repair policy do not pre-generate and pre-store fragments for these objects. Thus, fragments 451a and 451b may be generated for object 5 and assigned to the newly added storage nodes (e.g., represented by rows 410 and 420) added since any previous repair of object 5, and thus "permanently" stored thereon, without the pre-generation and pre-storage of additional fragments described with respect to the object repair operations above. Similarly, fragments 461a and 461b may be generated for object 6 and assigned to the newly added storage nodes (e.g., represented by rows 410 and 420) added since any previous repair of object 6 and are thus "permanently" stored thereon, without pre-generation and pre-storage of additional fragments.

It should be appreciated that objects 5 and 6, having been repaired without additional pre-generated and pre-stored fragments, have fewer fragments available than other recently repaired objects (e.g., objects 1-4). Thus, objects 5 and 6 of the embodiment illustrated in FIG. 4G are moved more towards the head of a repair queue (e.g., rather than fragments 451a and 451b for object 5 and fragments 461a and 461b for object 6 being represented in the left most slots in a repair queue, these fragments are represented in a repair queue more towards the right than fragments 411a and 411b of object 1, fragments 421a and 421b of object 2, fragments 431a and 431b of object 3, and fragments 441a and 441b of object 4 in the illustrated embodiment).

Figure 4H:
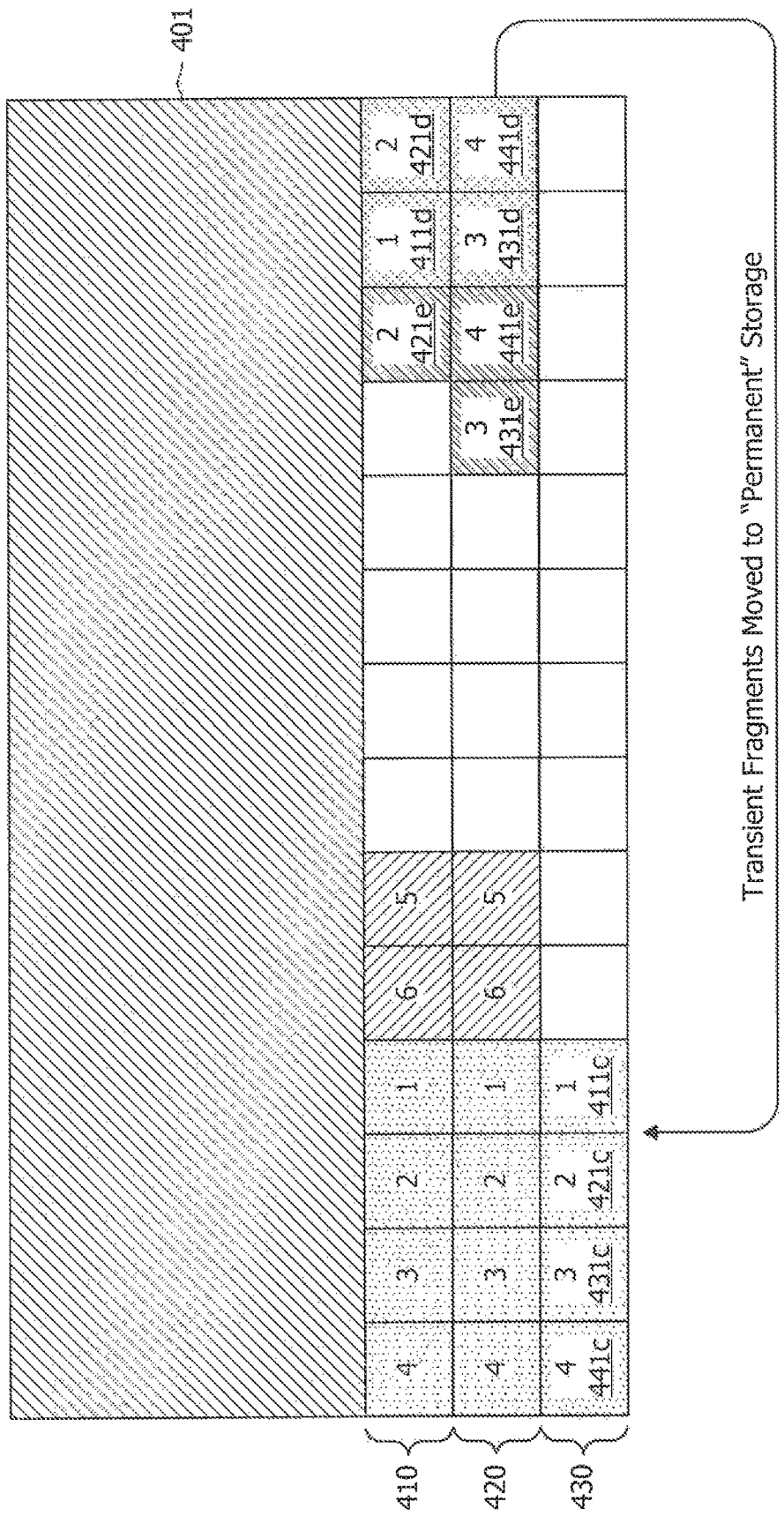

FIG. 4H illustrates the addition of another storage node (e.g., a replacement for another failed storage node) to the storage system of the example. In particular, this added storage node is represented by row 430. It should be appreciated that in operation of the exemplary fragment pre-storage technique, fragments have been pre-generated and pre-stored for later association with and storage to such added storage nodes. Accordingly, in the embodiment illustrated in FIG. 4H, four of the transient fragments (e.g., fragments 411c, 421c, 431 c, and 441c) corresponding to T-ESI 'c' that is now a P-ESI, are moved to prefill slots of the storage node of row 420 with fragments for objects 1-4. It should be appreciated that moving of these transient fragments to permanent storage causes the supplemental queue (e.g., supplemental storage node queue 256) to shift to the right in the illustrated example.

Figure 4I:
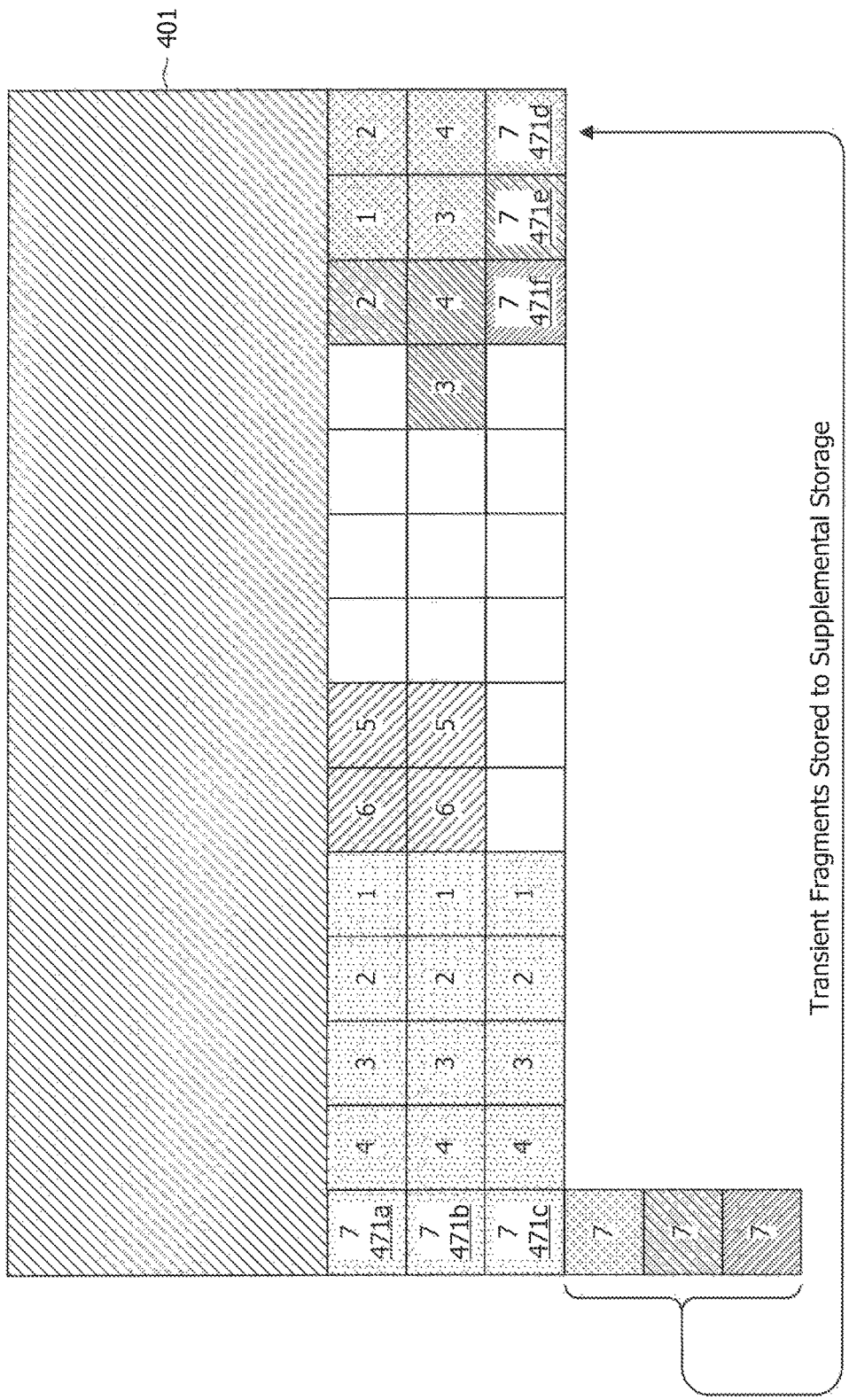

As shown in FIG. 4I, the fragment pre-storage repair policy (e.g., fragment pre-storage repair policy 252) of embodiments operates to repair a next object (e.g., designated object "7") in a repair queue (e.g., repair queue 254). However, because the fragment pre-storage repair policy is operable to pre-generate and pre-store fragments, a total number of fragments in excess of the existing storage nodes are again provided as shown in FIG. 4I. For example, 3 additional fragments, corresponding to the number of additional supplemental nodes is 3 (SN=3) in this example, are shown as having been pre-generated in FIG. 4I. In the embodiment illustrated in FIG. 4I, fragments 471a, 471b, and 471c are generated for object 7 and are assigned to the newly added storage nodes (e.g., represented by rows 410, 420, and 430) added since any previous repair of object 7 and are thus "permanently" stored thereon (e.g., as represented by fragments in the right most slots in a repair queue corresponding to their having been the most recently written fragments). However, fragments 471d-471 fare pre-generated for object 7 and are stored as transient fragments on the newly added storage node of row 430 (e.g., in slots at the right of the row corresponding to supplemental storage). Note that row 420 was considered saturated with transient fragments because it contained g=2 fragments for the same T-ESI, in fact it contains 2 fragments for both T-ESI 'd' and T-ESI 'e'.

Figure 4J:
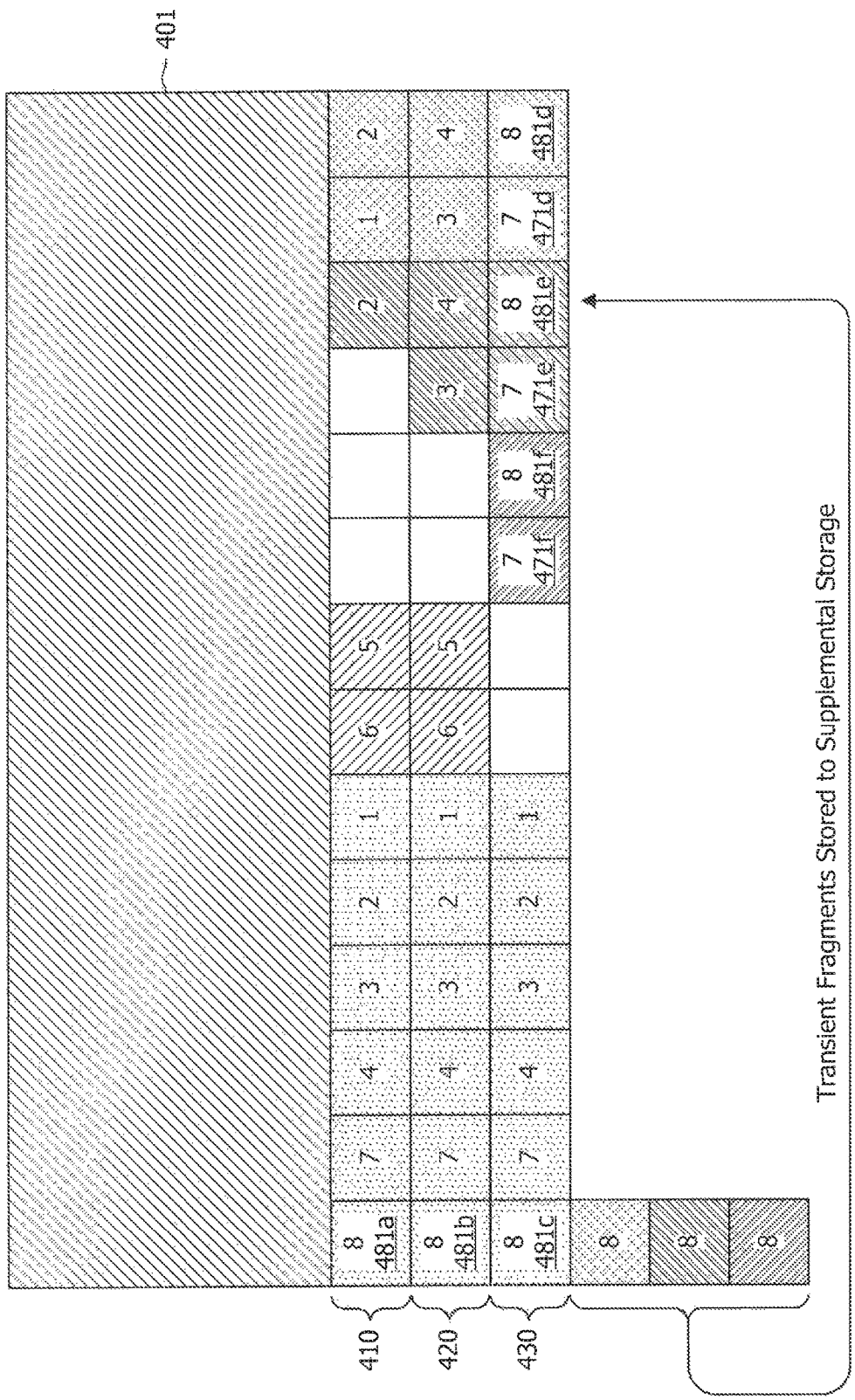

As shown in FIG. 4J, the fragment pre-storage repair policy (e.g., fragment pre-storage repair policy 252) of embodiments operates to repair a next object (e.g., designated object "8") in a repair queue (e.g., repair queue 254). However, because the fragment pre-storage repair policy is operable to pre-generate and pre-store fragments, a total number of fragments in excess of the existing storage nodes are again provided as shown in FIG. 4J. For example, 3 additional fragments, corresponding to the number of additional supplemental nodes is 3 (SN=3) in this example, are shown as having been pre-generated in FIG. 4J. In the embodiment illustrated in FIG. 4J, fragments 481a, 481b, and 481c are generated for object 8 and are assigned to the newly added storage nodes (e.g., represented by rows 410, 420, and 430) added since any previous repair of object 8 and are thus "permanently" stored thereon (e.g., as represented by fragments in the left most slots in a repair queue corresponding to their having been the most recently written fragments). However, fragments 481d-431f are pre-generated for object 8 and are stored as transient fragments on the newly added storage node of row 430 (e.g., in slots at the right of the row corresponding to supplemental storage). Note that row 430 is now deemed saturated with transient fragments.

Figure 4K:
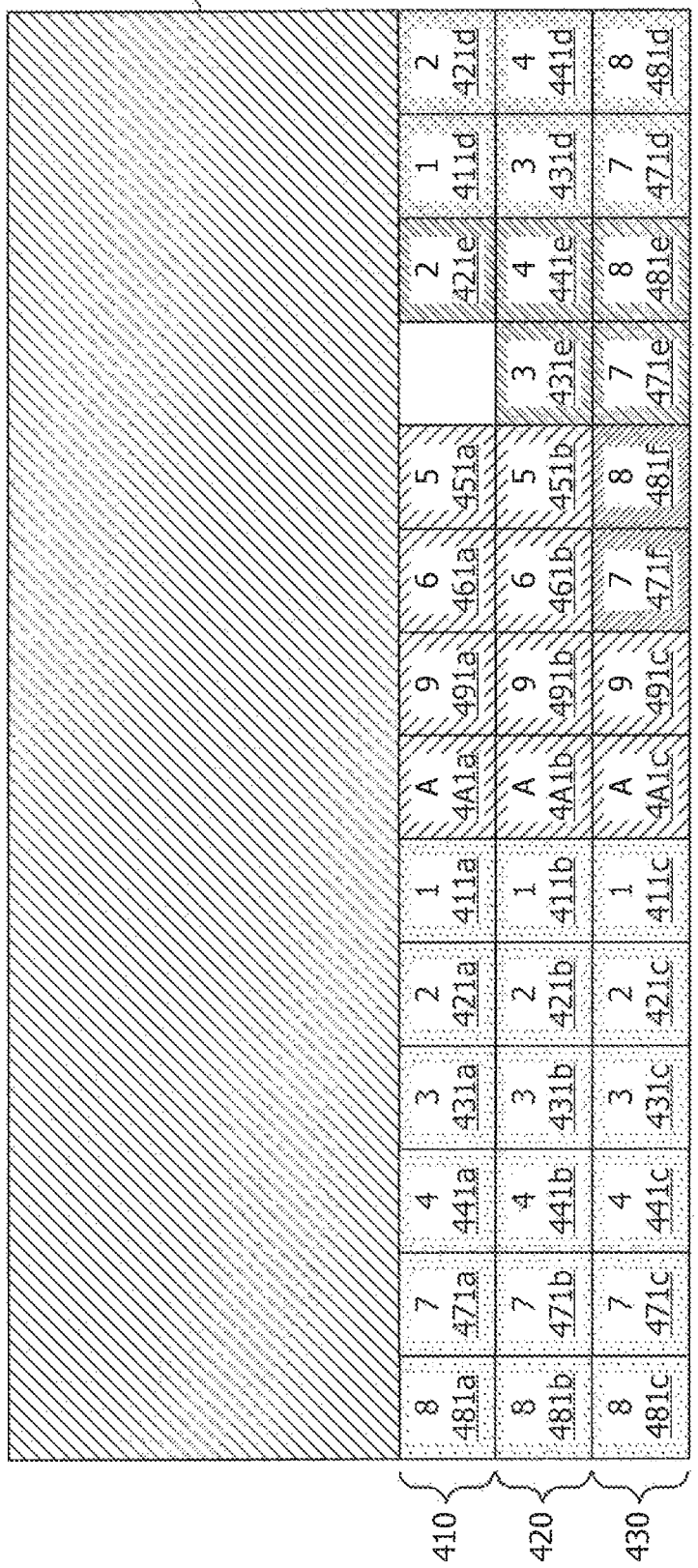

Operation according to embodiments wherein the supplemental storage is essentially filled with pre-generated, pre-stored transient fragments (e.g., fragments 411d, 421d-421e, 431d-431e, 441d-441e, 471d-471f, and 481d-481f) is again shown in FIG. 4K. When the fragment pre-storage repair policy (e.g., fragment pre-storage repair policy 252) operates to repair the next object(s) (e.g., designated objects "9" and "A" in the example of FIG. 4K) in a repair queue (e.g., repair queue 254) and the storage node space utilized for supplemental storage is filled, embodiments of the fragment pre-storage repair policy do not pre-generate and pre-store fragments for these objects. Thus, fragments 491a, 491b, and 491c may be generated for object 9 and assigned to the newly added storage nodes (e.g., represented by rows 410, 420, and 430) added since any previous repair of object 9, and thus "permanently" stored thereon, without pre-generation and pre-storage of additional fragments. Similarly, fragments 4A1a, 4A1b, and 4A1c may be generated for object A and assigned to the newly added storage nodes (e.g., represented by rows 410, 420, and 430) added since any previous repair of object A and are thus "permanently" stored thereon, without pre-generation and pre-storage of additional fragments.

It should be appreciated that, after a repair of objects 9 and A in the foregoing example, the storage space of the newly added storage nodes (e.g., the storage nodes represented by rows 410-430) is essentially filled (e.g., with "permanently" stored fragments 411a-411c, 421a-421c, 431a-431c, 441a-441c, 451a, 451b, 461a, 461b, 471a-471c, 481a-481c, 491a-491c, and 4A1a-4A1c and "supplementally" stored fragments 411d, 421d, 421e, 431d, 431e, 441d, 441e, 471d-471f, and 481d-481f). As discussed previously, in the example embodiment, repair continues even though space for transient fragments is saturated. Other embodiments may choose to suspend repair until another node failure occurs. Accordingly, in the example embodiment, without the addition of more storage space (e.g., adding another storage node to the storage system), further repair of objects according to embodiments is presented with a challenge with respect to storage of the fragments generated by a repair policy. For example, the supplemental storage space in the example of FIG. 4K has been filled and thus embodiments may omit the pre-generation and pre-storage of transient fragments with respect to repair of a next object (e.g., as described above with reference to FIGS. 4G and 4K). Moreover, in this case the storage space not used for "permanently" storing fragments is essentially filled with storing pre-generated transient fragments.

Accordingly, embodiments of a fragment pre-storage repair policy may operate to cease, or temporarily cease, further object repair until additional storage space becomes available, such as to avoid overwriting of pre-stored transient fragments stored in supplemental storage. For example, a fragment pre-storage repair policy may, during times where the storage space is filled or nearly filled with permanently stored fragments and transient fragments, operate to monitor the available fragments for objects (particularly the objects most at risk of data loss, such as the objects having the fewest available fragments), and defer further repair of objects where fragments sufficient for a high probability of data recovery remain available. Embodiments may operate to verify decodability of one or more objects, whereby a determination is made that the available fragments can be used to decode of all objects in a set of objects. Where the risk of data loss is determined to be imminent or otherwise unacceptable, embodiments may nevertheless proceed to repair one or more objects (e.g., overwriting transient fragments stored in supplemental storage with "permanently" stored fragments for these repaired objects, such as described below). Such embodiments may be implemented to avoid loss of the pre-generated fragments while maintaining the reliability of the source data.

Figure 4L:
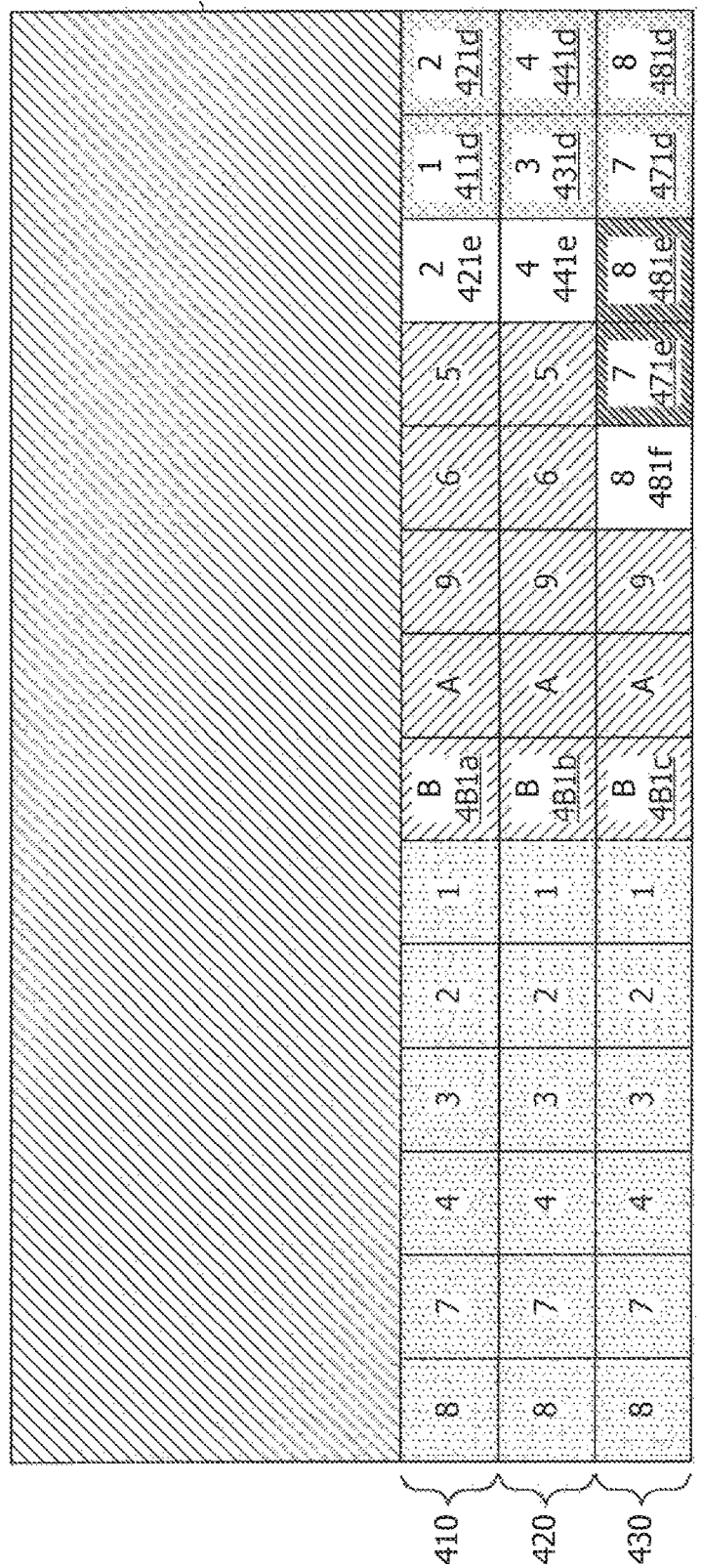

Embodiments of a fragment pre-storage repair policy may, however, operate to provide further repair of objects even where the storage space is filled or nearly filled with permanently stored fragments and transient fragments. For example, as shown in FIG. 4L, when the fragment pre-storage repair policy (e.g., fragment pre-storage repair policy 252) operates to repair the next object (e.g., designated object "B" in the example of FIG. 4L) in a repair queue (e.g., repair queue 254) and the storage node space utilized for both permanent storage and supplemental storage is filled. Accordingly, embodiments of the fragment pre-storage repair policy do not pre-generate and pre-store fragments for this object. Fragments 4B1a, 4B1b, and 4B1c are, however, generated for object B and assigned to the newly added storage nodes (e.g., represented by rows 410, 420, and 430) added since any previous repair of object B, and thus "permanently" stored thereon. However, because the storage space was being used for supplemental storage according to embodiments herein, some pre-stored transient fragments (e.g., no fragments from row 410 since there is a free fragment slot, and fragment 431e from row 420 and fragment 471f from row 430 shown in FIG. 4K are disposed at the left most edge of the supplemental storage in a repair queue) have been erased and/or overwritten. The foregoing object repair operation may be provided with respect to object repairs deferred until it is determined that object repair is desired to avoid risk of data loss (as described above), in accordance with embodiments which a repair policy proceeds with repairs irrespective of the filling of the storage space with permanently stored and supplementally stored fragments, etc.

In operation according to embodiments, if any transient fragment for an object stored in a row (a particular storage node) is overwritten, then the transient fragments for that object should be overwritten in order of newest T-ESI to oldest T-ESI. In the example shown in FIG. 4K, T-ESI f is newer than T-ESI e, and thus transient fragments for objects associated with T-ESI f will be overwritten before transient fragments for objects associated with T-ESI e. This overwriting rule, combined with the rule that all transient fragments for an object are to be stored in the same row (on the same particular storage node), are used in the example embodiment to preserve the nested erased fragment property. From the supplemental queue perspective it can be seen that the removal (or overwriting) of transient fragments in accordance with this rule corresponds to the removal of the right-most portion of the corresponding fragments in the supplemental repair queue. In general, the nested erased fragment property holds if there is an ordering of the ESIs such that the fragments available for an object are associated with a consecutive prefix of the ESIs for every object, and these two rules described above ensure that this property holds for the ordering of the ESIs from oldest to newest. Thus, the nested erased fragment property is preserved when transient fragments are overwritten. Generally, if multiple transient fragments stored in a row (particular storage node) are to be overwritten then generally the transient fragments for objects in the row corresponding to the newest T-ESI should be overwritten, then the transient fragments for objects in the row corresponding to the second newest T-ESI, etc.

Figure 4M:
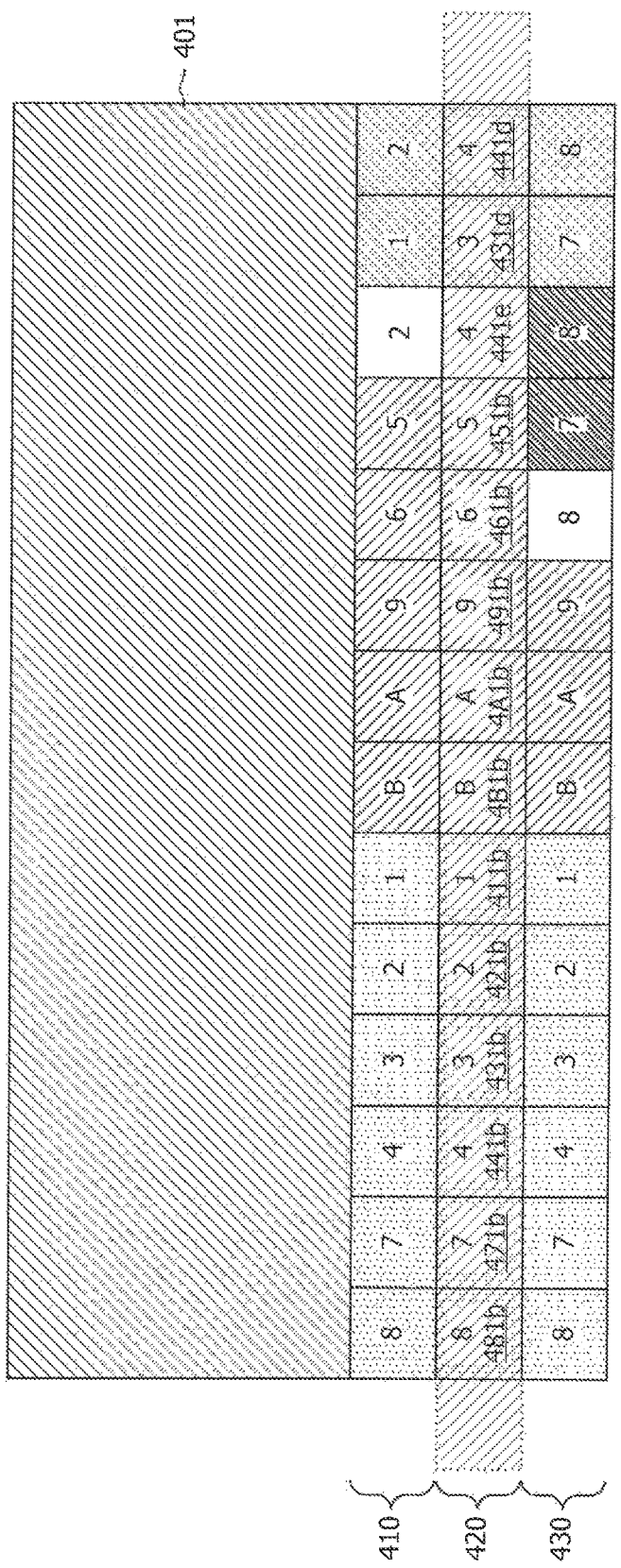
Figure 4N:
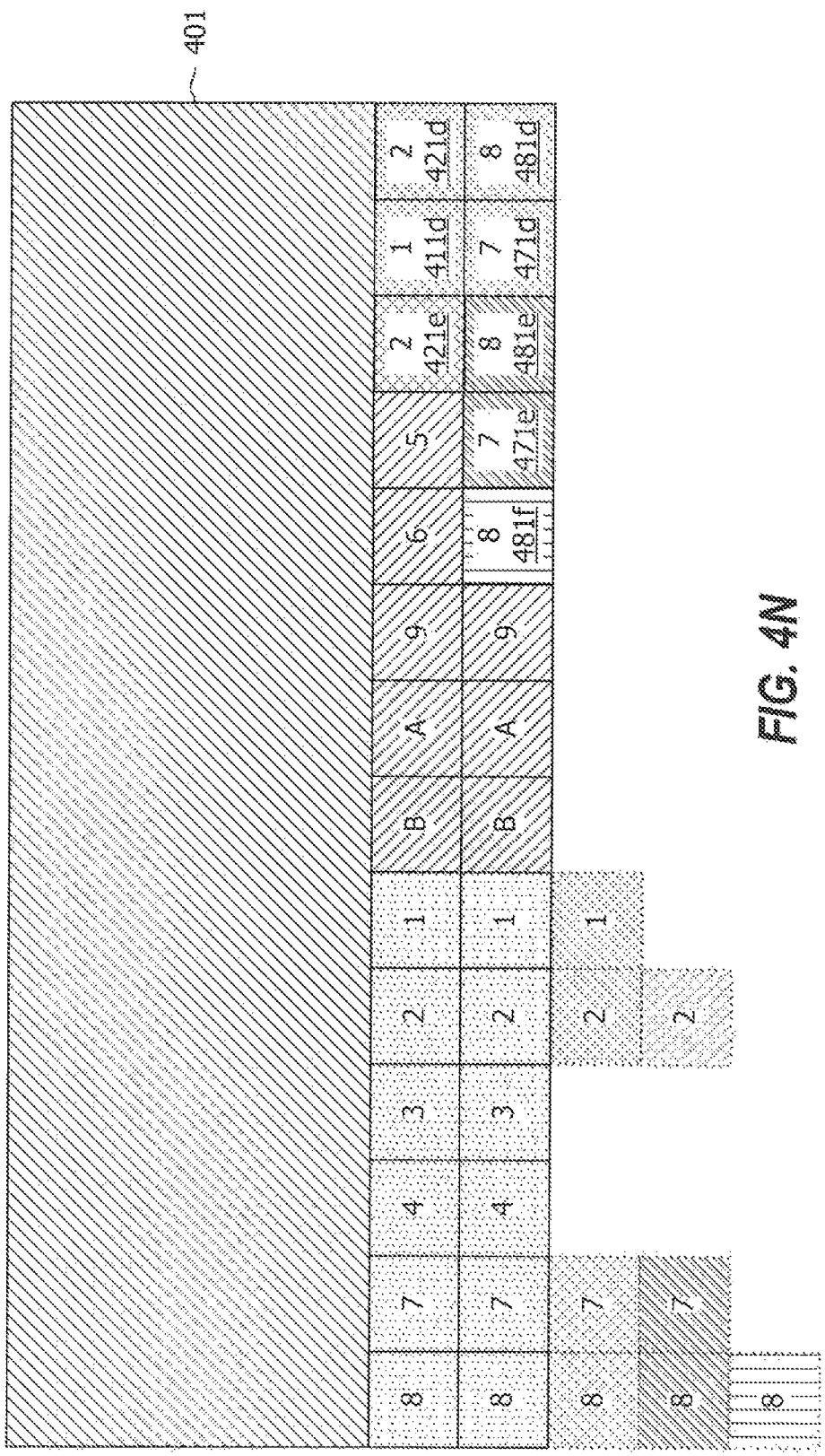
Figure 40:
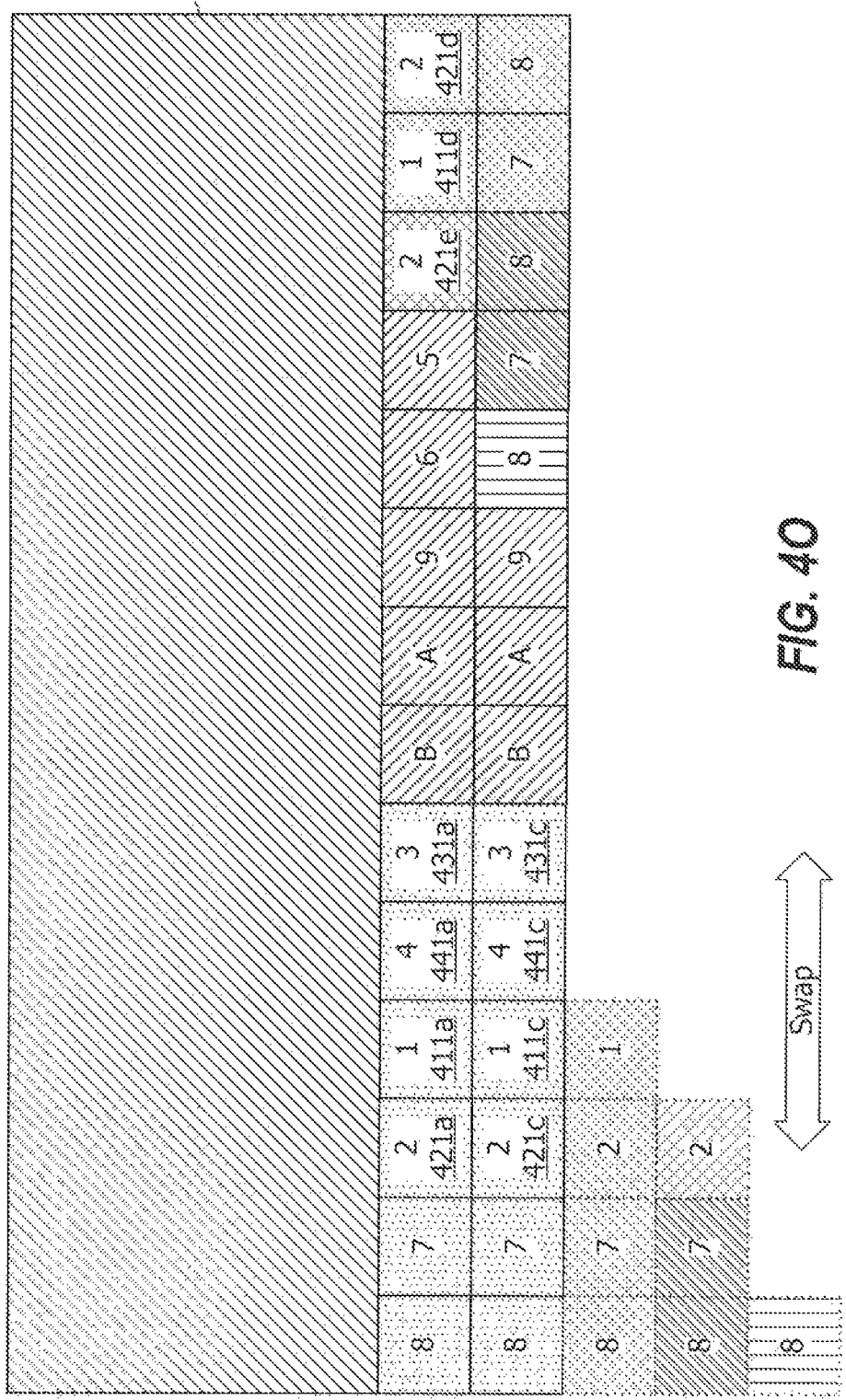

FIG. 4M illustrates the failure of the storage node associated with row 420 of a repair queue. It should be appreciated that row 420 of the example includes both fragments permanently stored to the storage node (e.g., fragments 411b-4B1b) and transient fragments pre-stored to the storage node (e.g., fragments 431d, 441d and 441e). The result of the loss of this storage node is illustrated in FIG. 4N, wherein the pre-stored transient fragments of the example (i.e., fragments 411d, 421d, 421e, 471d, 471e, 481d, 481e and 481f) are also shown in dotted lines to correspond with their respective objects. As can readily be seen from FIG. 4N, objects 3 and 4 have fewer available fragments than do objects 1 and 2 due to the loss of the storage node, despite objects 1 and 2 being disposed in a repair queue more towards the right (toward the head of a repair queue) than objects 3 and 4. In operation according to embodiments, the objects in a repair queue are ordered according to their respective missing fragments, whereby objects at the head of the repair queue (e.g., objects having the most missing fragments/least available fragments) are taken up for repair by a repair policy. Accordingly, operation of a fragment pre-storage repair policy of embodiments provides for the reorganization of repair queue to provide for reordering objects according to their respective missing fragments after the source node loss. Note that this is possible in this case because of the constraints on the writing of transient fragments. In particular, the constraint that all transient fragments from an object should be written to a single node implies that when such a storage node is lost only transient fragments corresponding to that object that are at the bottom of the supplemental queue are lost. Thus the nested erased fragment property is preserved, even though some reordering of the queue may be needed. Recording of the example repair queue is shown in FIG. 4O, wherein the fragments associated with objects 1 and 2 (e.g., fragments 411a, 411 c, 421a, and 421c) have essentially swapped positions with the fragments associated with objects 3 and 4 (e.g., fragments

431*a*, 431 *c*, 441*a*, and 441*c*). Accordingly, the objects are again ordered in a repair queue according to their respective missing fragments according to the illustrated embodiment. It should be understood that such reordering does not involve any actual moving of the fragments but is only a movement of the representation of the fragments in a repair queue that is used to help administer a repair policy.

As shown in the foregoing exemplary operation, a fragment pre-storage repair policy of embodiments provides additional fragments with respect to a repair of objects wherein those additional fragments may temporarily be stored (e.g., as transient fragments) in otherwise unused storage space (e.g., storage space utilized as supplemental storage space in accordance with the concepts herein). In particular, a fragment pre-storage repair policy of embodiments generates fragments in addition to the number of storage nodes in the storage system, whereby the additional fragments are for supplemental storage nodes (e.g., storage nodes which will be added to the storage system at some point in the future after some portion of their respective fragments have been generated). The pre-generation of these additional fragments facilitates greater repair efficiency and higher data redundancy than would typically be present with respect to a storage system implementing a same number of storage nodes as a storage system adapted according to embodiments herein. For example, a repair process generally consumes appreciable bandwidth in reading the requisite number of available fragments for generating additional fragments, whereas moving transient fragments to permanent storage consumes far less bandwidth. Moreover, the generation of a larger number of fragments during a repair process (e.g., the additional pre-generated fragments of embodiments in addition to the fragments generated for existing storage nodes) provides for higher repair efficiency. Although the additional pre-generated and pre-stored fragments provide redundancy with respect to the data of their respective objects, such fragments (e.g., fragments stored as transient fragments) are not utilized for typical data access due to their supplemental storage organization in the storage nodes. However, as storage nodes are added to the storage system, these transient fragments are moved from supplemental storage to the later added storage node for "permanent" storage in accordance with the erasure code object fragment storage organization protocol, to thereby provide the fragments for use in data access and data recovery operation of the storage system.

As can be appreciated from the foregoing exemplary operation of a fragment pre-storage repair policy of embodiments, particularly with reference to FIGS. 3C and 3D above, the storage system may operate as if the storage system had a larger storage overhead ($\beta$) than is physically implemented (e.g., by almost a factor of 2). A lazy repair policy, or other repair policy implementing deferred repair of objects, may implement object repairs more slowly in a storage system having larger storage overhead because the number of nodes that can fail before an object repair is needed to ensure source data recovery is increased. Embodiments may utilize the effectively larger storage overhead to provide improved data reliability without the expense of some portion of the storage nodes typically needed for the level of data redundancy implemented. Additionally or alternatively, embodiments may utilize the effectively larger storage overhead to implement a repair bandwidth (R) providing higher a repair efficiency.

Although the foregoing exemplary operation has been described with respect to situations in which the storage space designated as supplemental storage space is filled and thus the additional fragments (e.g., a number of additional fragments corresponding to the number of additional supplemental nodes, such as SN=3 in the above example) were not pre-generated, embodiments may operate to provide for pre-generation of a partial number of additional fragments (e.g., <3 additional fragments in the above example). For example, where storage space remains available in the supplemental storage designated according to embodiments, some partial portion of the additional fragments that can be accommodated by this available supplemental storage may be pre-generated and pre-stored as transient fragments herein.

Flow 500 provides an example of operation of a simple fragment pre-storage repair policy for one of the M storage nodes of the system, hereinafter referred to as the current storage node. Flow 500 may, for example, be implemented by fragment pre-storage repair policy 252 in accordance with embodiments herein.

At block 501 of the illustrated embodiment of flow 500 a determination is made as to whether a storage node is added to the storage system. For example, a storage node may be added in response to a storage node that has been determined to fail. It is assumed in the illustrated example that a storage node contains no data when it is added. If no storage node is added then processing according to the illustrated embodiment returns to block 501. However, if a storage node is added to the storage system then processing, according to the illustrated embodiment proceeds to block 502.

At block 502, let I be an ESI assigned to the added storage node. In operation according to the illustrated embodiment, all transient fragments associated with ESI I in supplemental storage of the current storage node are moved to permanent storage of the added storage node. The processing according to block 502 of embodiments frees up an amount of space that is approximately the size of all transient fragments stored in the supplemental storage of the current storage node associated with ESIs assigned to the added storage node.

At block 503 of the illustrated embodiment, a list of transient ESIs and a set of objects for which to generate transient fragments are determined.

Correspondingly, at block 504, transient fragments associated with the list of transient ESIs and the set of objects, determined at block 503, are pre-generated and stored in supplemental storage of the current storage node in operation according to embodiments.

At block 505 of the illustrated embodiment, a set of objects for which to generate fragments associated with the ESI (or ESIs) assigned to the current storage node are determined. In operation according to embodiments, the fragments for the determined set of objects are generated and stored in permanent storage at the current storage node.

Figure 5:
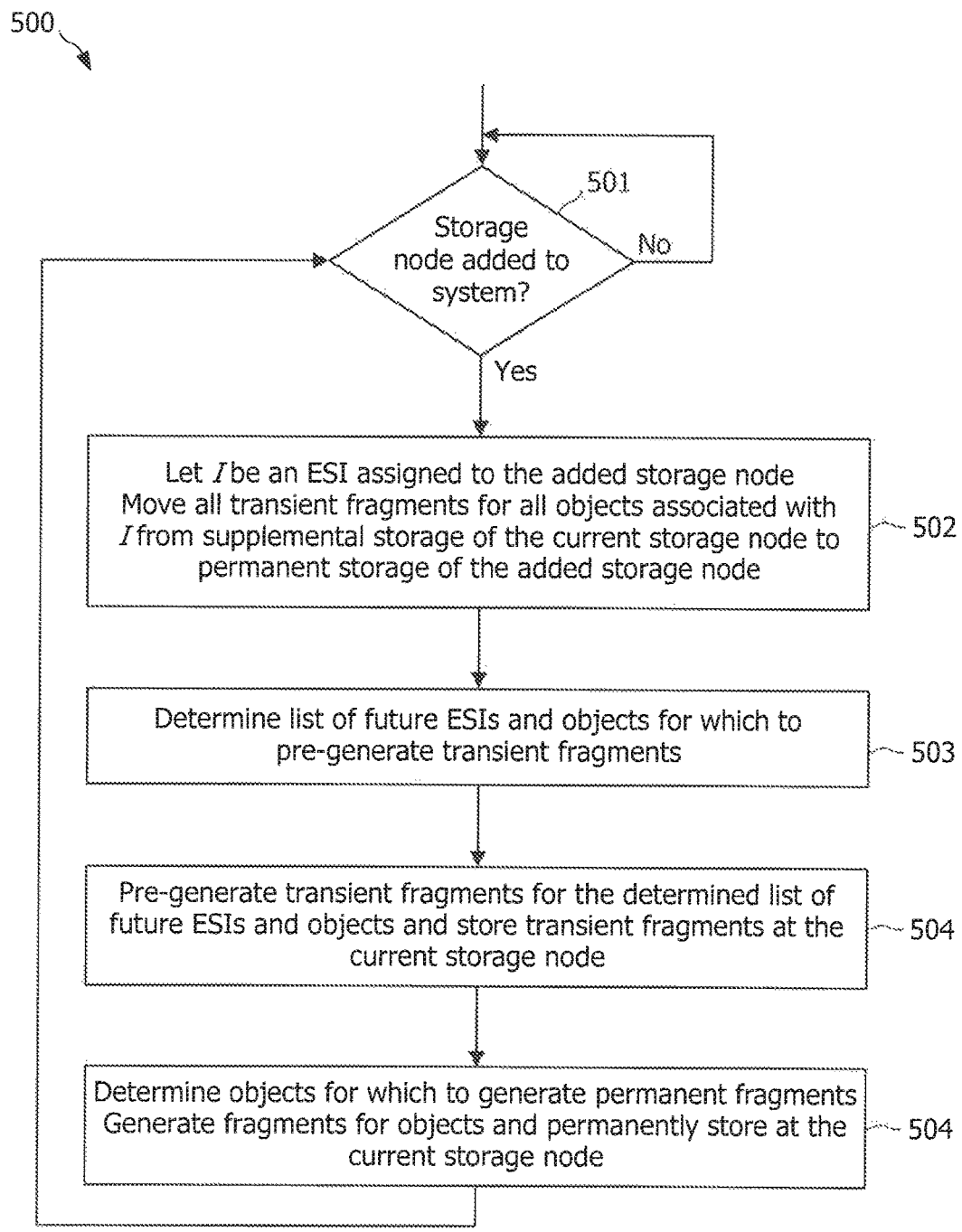
FIG. 5 shows a high level flow diagram of operation according to a fragment pre-storage repair technique of embodiments of the present disclosure.

An advantage of the exemplary embodiment described above with reference to FIG. 5 is that when transient fragments are pre-generated at a current storage node and stored on the current storage node in supplemental storage (block 504), the only repair traffic that travels over the network (from one node to the other) is the traffic to read fragments for an object to pre-generate transient fragments. The transient fragments so pre-generated do not travel over the network at this point but instead are stored locally at the current storage node. Eventually (in block 502), the transient fragments so pre-generated are transferred over the network to a permanent storage node. Thus, overall, each fragment read by the pre-storage repair policy and each transient fragment pre-generated by the pre-storage repair policy is moved over the network at most once.

There are many variants of the fragment pre-storage repair policy described above that provide additional benefits. For example, instead of triggering repair of objects (block 504) based on adding a storage node to the system (block 501), the repair traffic can be smoothed out. An embodiment adapted to provide such smoothed repair traffic may, for example, use a leaky bucket implementation wherein an added storage node count c is maintained to indicate the amount of repair work that has been triggered by added storage nodes that has not yet been executed. Thus, when a storage node is added, the added storage node count c is incremented by one to indicate a storage node has been added but the corresponding repair has not been performed. Then, repair can proceed at a regular rate, and as repair occurs the added storage node count c can be decremented (including fractional decrements), wherein the decrement is by an amount of one when an aggregate of O/SN objects have been repaired. Then, a repair rate can be smoothly moderated by basing a repair rate on the value of c so that c maintains a value between zero and a predetermined upper bound B while at the same time maintaining a relative smooth rate of decrease of c (where the rate of decrease of c is determined by the repair rate). As another variant, there may be a target value for c, i.e., a positive value T, wherein the current read rate R of the pre-storage repair policy is set to $e^{\Psi(c-T)} \cdot L \cdot O/SN$, where $\Psi$ is a fixed positive value, and L is a current average rate at which fragment data is lost from the system due to failing nodes. A potential cost of providing smoothness in the repair rate is slightly additional space for transient fragments in supplemental storage, wherein the additional space depends on B. An advantage is that the peak read repair rate can be smoothed to essentially equal the average read repair rate, wherein the smoothness depends on B.

As another variant, the transient fragments in supplemental storage on the current storage node can be moved at a smoother rate to permanent storage on the added storage node assigned their associated ESI (block 502), using methods similar to those described above for smoothing the read repair rate of the pre-storage repair policy. For example, instead of immediately moving the transient fragments to permanent storage on the added storage node, the movement of transient fragments can be performed at a smooth rate. A potential cost of providing smoothness is that slightly more storage overhead may be required, in order to ensure that there are enough complete storage nodes at all points in time, as an added storage node is not complete until all fragments for all objects have been received. An advantage is that the peak repair bandwidth used for moving transient fragments to permanent storage on added storage nodes can be much lower, approaching the average repair bandwidth for this movement.

As another variant, the fragments associated with the ESI (or ESIs) assigned to the current storage node can be generated at a smoother rate (block 505), using methods similar to those described above for smoothing the read repair rate of the pre-storage repair policy. For example, instead of immediately generating the fragments and storing them in permanent storage on the current storage node, the generation of fragments can be performed at a smooth rate. A potential cost of providing smoothness is that slightly more storage overhead may be required, in order to ensure that there are enough complete storage nodes at all points in time, as the current storage node is not complete until all fragments for all objects have been received. An advantage is that the peak read repair bandwidth used for generating fragments and storing them to permanent storage on the current storage node can be much lower, approaching the average read repair bandwidth for this generation.

As another variant, when a current storage node fails, all of the transient fragments stored in supplemental storage are lost (as well as the fragments stored in permanent storage associated with the ESI assigned to the current storage node). Thus, when a current storage node fails, the pre-generation of the transient fragments lost due to the failure can be reassigned to other current storage nodes according to this variant. As still another variant, as the pre-storage repair policy is being executed on a current storage node, the transient fragments assigned to be pre-generated by that current storage node may be re-assigned to other storage nodes. For example, a current storage node that is currently responsible for pre-generation of a larger than average number of transient fragments may re-assign a fraction of these transient fragments to other nodes as the transient fragments become ready for pre-generation.

As other variants, there are many different alternatives for deciding which transient ESIs, and how many transient ESIs, to add to the future repair queue. For example, one alternative is to have an ordered pool of potential ESIs P, where the number of ESIs in P is at least the maximum of the number of transient ESIs and permanent ESIs at any point in time for the system. Each time a transient ESI is to be added to the future repair queue, the smallest ESI in the pool P that is not either a transient ESI or a permanent ESI is used. As another variant, the pool of potential ESIs P may exclude any ESI that corresponds to a source fragment. As another variant, the next ESI added to the list of transient ESIs may be selected to be a source ESI whenever there is a source ESI that is not currently in the list of transient ESIs and not a permanent ESI. Which ESIs to add to the list of transient ESIs may also be determined, at least in part, based on the set of currently permanent ESIs and current list of transient ESIs and which combinations of additional ESIs would most improve the reliability of decoding, for example when using an FEC code that is not a priori known to be MDS, such as the RAPTORQ code.

As another variant, the set of current storage nodes that are responsible for executing the pre-storage repair policy may not be the set of all currently active storage nodes, but instead may be restricted to a subset. For example, such current storage nodes may be restricted to those storage nodes that are partial storage nodes, i.e., storage nodes that are not complete.

It should be appreciated that the concepts herein are not limited to application with respect to implementing supplemental storage with respect to storage space remaining unused awaiting fragment generation by a repair policy implementing deferred object repair. Accordingly, embodiments may establish some portion of storage space as supplemental storage overhead that is reserved for the pre-storage of pre-generated fragments (referred to herein as a reserved supplemental storage implementation). For example, in a reserved supplemental storage implementation of embodiments, some portion of storage capacity may be reserved on each storage node as supplemental storage overhead (A) for repair functionality. In accordance with embodiments, there may thus be two types of reserved repair capacity including the per storage node supplemental storage overhead, wherein an A fraction (e.g., A≈0.2 of the storage capacity according to embodiments) of capacity per storage node is reserved for repair, and the additional storage node overhead, wherein a β (e.g., β≈0.1 of the storage capacity according to embodiments) fraction of the storage nodes are redundant (e.g., a fragment for each object is stored on each of M storage nodes, wherein any $k=M \cdot (1-\beta)$ fragments of an object are sufficient to recover the object).

The amount of storage that is set aside for supplemental storage according to embodiments of reserved supplemental storage implementations may be fixed or dynamically changed. For example, a storage system implementing reserved supplemental storage according to concepts herein may comprise an amount of reserved storage capacity that can be changed dynamically as the system progresses over time. As an example of such dynamically changed reserved storage capacity, less dedicated supplemental storage space may be needed if the amount of used repair bandwidth is substantially less than the available bandwidth, and thus a reserved supplemental storage implementation may operate to dynamically reduce the amount of space dedicated to supplemental storage to the point where the repair bandwidth increases but is still below the available bandwidth. The amount of storage dedicated to supplemental storage can be implemented according to embodiments by dynamically altering the value of SN (i.e., the number of supplemental storage nodes), wherein SN is reduced at some point and thus transient fragments generated for object from the point of reduction on will have less transient fragments generated and stored.

In operation according to embodiments of a reserved supplemental storage implementation, the fragment pre-storage repair policy may operate such that each of the M storage nodes pre-generates repair for a 1/M fraction of the objects, wherein the A fraction of capacity per storage node is used to store this pre-generated repair. Thus, the fragment pre-storage repair policy is distributed smoothly among the M storage nodes. For example, the fragment pre-storage repair policy of a reserved supplemental storage implementation may pre-generate, for each storage node, $SN \approx 2 \cdot A \cdot M$ (for small A, for larger A a more precise estimate is $SN \approx 2 \cdot A \cdot M/(1-A)$) fragments associated with transient ESIs that will be assigned to storage nodes added to the system in the future (e.g., added in response to storage nodes that fail in the future), wherein a repair process operates similar to a lazy repair with $2 \cdot A$ redundancy. Thus, embodiments may make redundant (e.g., a fragment for each object is stored on each of M storage nodes, wherein any $k=M \cdot (1-\beta)$ fragments of an object are sufficient to recover the object fragments available for all objects.

In operation, each storage node of embodiments carries a fragment for each object with an ESI assigned to that storage node. The number of fragments needed to recover an object (k) may be defined as $k=M \cdot (1-\beta)$, where M is the number of storage nodes and $\beta$ is the fraction of additional storage nodes reserved for repair functionality and let $RN=M \cdot \beta$ be the number of storage nodes beyond k in the system. However, SN fragments are pre-generated for future storage nodes added to the system (often in response to storage nodes failing in the future), and stored in the A fraction of storage capacity designated for supplemental storage overhead (e.g., associated with SN, or approximately $2 \cdot A \cdot M$, transient ESIs for supplemental storage nodes). When an additional storage node is added to the storage system, the next transient ESI may be assigned to the storage node (e.g., assigned as a permanent ESI) and the transient fragments with permanent ESI may be moved to the storage node. There are many ways to determine which storage nodes perform repair for which objects. For example, the objects may be round robin distributed to the storage nodes. As another example, there may be a higher-level process that dynamically assigns (and possibly re-assigns) objects to storage nodes based on how a repair processes for each storage node are progressing globally. Furthermore, there are many ways to determine which set of transient ESIs are used by each of the storage nodes. For example, a pre-determined set of transient ESIs may be cycled through and used by the storage nodes, in which case the sets of transient ESIs used by each of the storage nodes for the objects assigned to those storage nodes may be largely similar. As another example, each storage node may independently determine the set of transient ESIs for which to pre-generate transient fragments for the objects assigned to that storage node.

Figure 6:
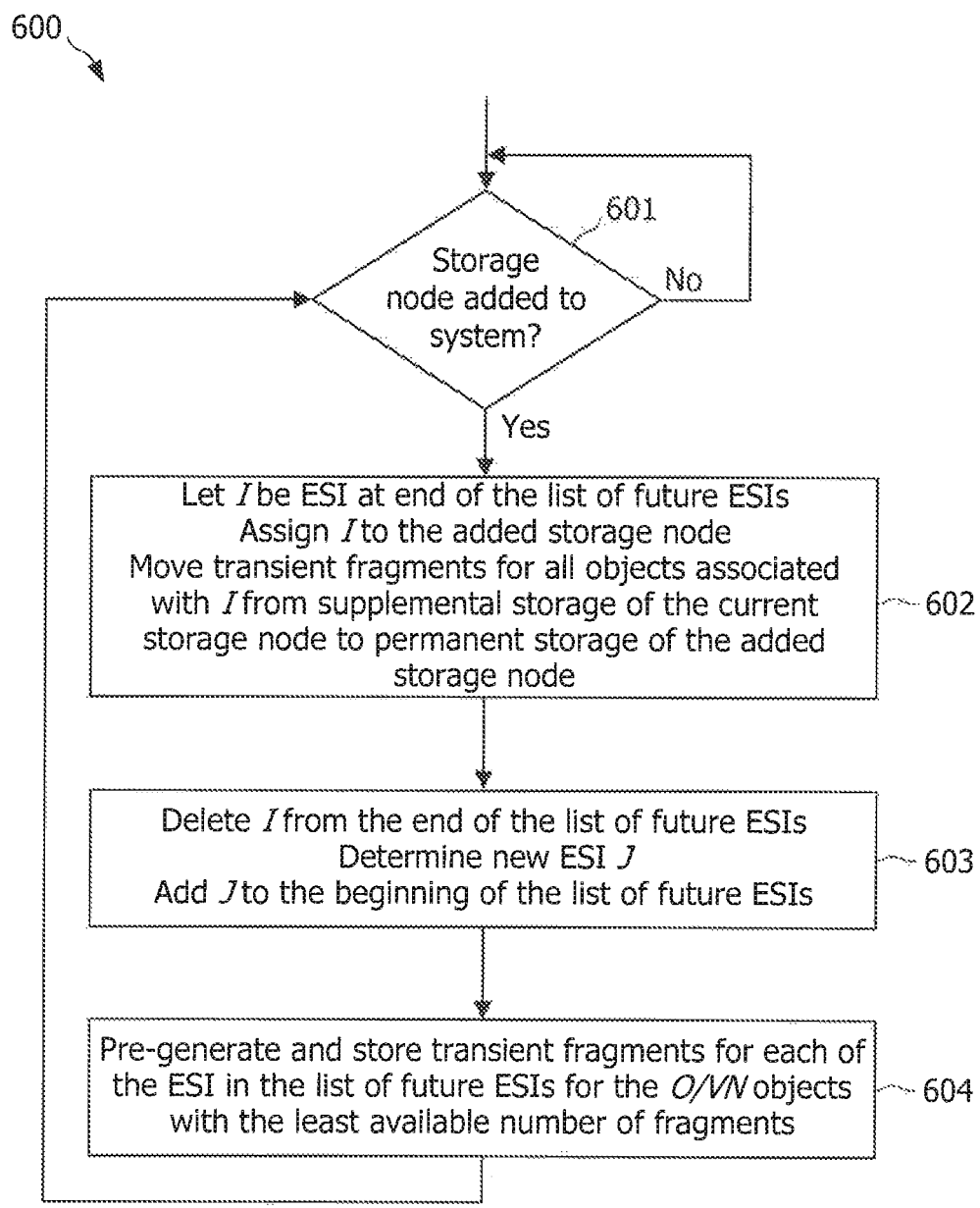
FIG. 6 shows a high level flow diagram of operation according to a reserved supplemental storage implementation of embodiments of the present disclosure.

Having described embodiments of a reserved supplemental storage implementation above, attention is directed to FIG. 6 wherein operation according to a reserved supplemental storage implementation of embodiments is shown as flow 600. Flow 600 may, for example, be implemented by fragment pre-storage repair policy 252 in accordance with embodiments herein.

Flow 600 provides an example of a simple fragment pre-storage repair policy for one of the M storage nodes of the system, hereinafter referred to as the current storage node. In operation according to embodiments of flow 600, an ordered list of the objects assigned to the current storage node is maintained, wherein the ordering of the objects are according to the number of available transient fragments for the object in supplemental storage at the current storage node. It is assumed for simplicity of description that a fixed number O of objects are assigned to the current storage node to repair, and that all objects are the same size, although these assumptions are not restrictions of embodiments as one skilled in the art will recognize. In understanding operation according to flow 600 of embodiments, assume that there are SN ESIs in the transient ESI list, and that there are no ESIs in common between the transient ESI list and the set of ESIs assigned to the M storage nodes.

At block 601 of the illustrated embodiment of flow 600 a determination is made as to whether a storage node is added to the storage system. For example, a storage node may be added in response to a storage node that has been determined to fail. It is assumed that a storage node contains no data when it is added. If no storage node is added then processing according to the illustrated embodiment returns to block 501. However, if a storage node is added to the storage system then processing, according to the illustrated embodiment proceeds to block 602.

At block 602, the ESI I at the end of the list of transient ESIs is assigned to the added storage node, and all transient fragments associated with ESI I in supplemental storage of the current storage node are moved to permanent storage of the added storage node. In general, the ESI at the end of the list of transient ESIs will be the ESI that has been on the list the longest, and thus is the ESI for which the maximal number of transient fragments for objects have been pre-generated and stored in supplemental storage of the current storage node. The processing according to block 602 of embodiments frees up an amount of space that is up to O fragments in size in the supplemental storage of the current storage node, i.e., up to one transient fragment for each of the O objects may be moved to permanent storage and thus the freed supplemental space on the current storage node is up to O fragments in size. Furthermore, if transient fragments associated with ESI I have been pre-generated and stored in supplemental storage of the current storage node for all objects assigned for repair to the current storage node, and if this is true for each possible current storage nodes to which objects are assigned for repair, then the added storage node will be complete after processing of block 602 finishes for all the possible current storage nodes to which objects are assigned for repair.

At block 603 of the illustrated embodiment, the ESI I is deleted from the end of the list of transient ESIs (since it is assigned to the added storage node). Further, at block 603 of the illustrated embodiment a new ESI J is added to the beginning of the list of transient ESIs, where preferably ESI J is different from all ESIs in the list of transient ESIs and all ESIs assigned to storage nodes.

At block 604, all missing transient fragments associated with all SN ESIs in the list of transient ESIs are pre-generated and stored in supplemental storage of the current storage node for the next O/SN objects in the ordered list of objects. The amount of space used by the transient fragments pre-generated and stored in supplemental storage in block 604 is at most O fragments in size, i.e., up to SN transient fragments for each of O/SN objects may be pre-generated and stored in the supplemental space of the current storage node.

The following highlights some advantages of the exemplary embodiment described above with reference to FIG. 6. In operation of flow 600, suppose at some point in time that the ith object in the ordered list of objects has ceiling (i·SN/O) transient fragments stored in supplemental storage of the current storage node, where ceiling(x) indicates the smallest integer greater than or equal to x. Then, it is straightforward to argue that at any later point in time: (1) there will be a transient fragment associated with ESI I for all O objects stored in supplemental storage of the current storage node at the start of execution of block 602; (2) the total amount of space used to store transient fragments in supplemental storage on the current storage node is approximately the size of SN·O/2 fragments; and (3) on average, the amount of read repair bandwidth used to pre-generate transient fragments is $\lambda \cdot O \cdot Osize/SN$, where $\lambda$ is the rate at which storage nodes are added to the system (which typically is the same rate at which nodes fail), and where Osize is the size of each object. Note that the amount of space used for storing transient fragments in supplemental storage is approximately one-half that of previously described liquid systems using the same amount of read repair bandwidth when RN is relatively small compared to M (in preferred embodiments, RN is relatively small compared to M).

Another advantage of the exemplary embodiment described above with reference to FIG. 6 is that when transient fragments are pre-generated at a current storage node and stored on the current storage node in supplemental storage (block 604), the only repair traffic that travels over the network (from one node to the other) is the traffic to read fragments for an object to pre-generate transient fragments, and the transient fragments so pre-generated transient fragments do not travel over the network at this point but instead are stored locally at the current storage node. Eventually (in block 602), the transient fragments so pre-generated are transferred over the network to a permanent storage node. Thus, overall, each fragment read by the pre-storage repair policy and each transient fragment pre-generated by the pre-storage repair policy is moved over the network at most once.

There are many variants of the fragment pre-storage repair policy described above that provide additional benefits. For example, instead of triggering repair of objects (block 604) based on adding a storage node to the system (block 601), the repair traffic can be smoothed out. An embodiment adapted to provide such smoothed repair traffic may, for example, use a leaky bucket implementation wherein an added storage node count c is maintained to indicate the amount of repair work that has been triggered by added storage nodes that has not yet been executed. Thus, when a storage node is added, the added storage node count c is incremented by one to indicate a storage node has been added but the corresponding repair has not been performed. Then, repair can proceed at a regular rate, and as repair occurs the added storage node count c can be decremented (including fractional decrements), wherein the decrement is by an amount of one when an aggregate of O/SN objects have been repaired. Then, a repair rate can be smoothly moderated by basing the repair rate on the value of c so that c maintains a value between zero and a predetermined upper bound B while at the same time maintaining a relative smooth rate of decrease of c (where the rate of decrease of c is determined by the repair rate). As another variant, there may be a target value for c, i.e., a positive value T, wherein the current read rate R of the pre-storage repair policy is set to $e^{\Psi(c-T)} \cdot L \cdot O/SN$, where $\Psi$ is a fixed positive value, and L is a current average rate at which fragment data is lost from the system due to failing nodes. A potential cost of providing smoothness in the repair rate is slightly additional space for transient fragments in supplemental storage, wherein the additional space depends on B. An advantage is that the peak read repair rate can be smoothed to essentially equal the average read repair rate, wherein the smoothness depends on B.

As another variant, the transient fragments in supplemental storage on the current storage node can be moved at a smoother rate to permanent storage on the added storage node assigned their associated ESI (block 602), using methods similar to those described above for smoothing the read repair rate of the pre-storage repair policy. For example, instead of immediately moving the transient fragments to permanent storage on the added storage node, the movement of transient fragments can be performed at a smooth rate. A potential cost of providing smoothness is that the value of RN may be larger, in order to ensure that there are enough complete storage nodes at all points in time, as an added storage node for which all fragments have not been moved for all objects is not complete. An advantage is that the peak repair bandwidth used for moving transient fragments to permanent storage on added storage nodes can be much lower, approaching the average repair bandwidth for this movement.

As another variant, when a current storage node fails, all of the transient fragments stored in supplemental storage are lost (as well as the fragments stored in permanent storage associated with the ESI assigned to the current storage node). Thus, when a current storage node fails, all objects assigned for repair to the current storage node are reassigned to other current storage nodes for repair according to this variant. As still another variant, as the pre-storage repair policy is being executed on a current storage node, the objects assigned to that current storage node for repair may be re-assigned to other storage nodes for repair. For example, a current storage node that is currently responsible for a larger than average number of objects (or a larger than average amount of data of objects if objects are not equal-sized) may re-assign a fraction of the objects to other nodes for repair as the objects arrive at the head of a repair queue.

As other variants, there are many different alternatives for deciding which transient ESIs, and how many transient ESIs, to add to the future repair queue. For example, one alternative is to have an ordered pool of potential ESIs P, where the number of ESIs in P is at least the maximum of the number of transient ESIs and permanent ESIs at any point in time for the system. Each time a transient ESI is to be added to the future repair queue, the smallest ESI in the pool P that is not either a transient ESI or a permanent ESI is used. As another variant, the pool of potential ESIs P may exclude any ESI that corresponds to a source fragment. As another variant, the next ESI added to the list of transient ESIs may be selected to be a source ESI whenever there is a source ESI that is not currently in the list of transient ESIs and not a permanent ESI. Which ESIs to add to the list of transient ESIs may also be determined, at least in part, based on the set of currently permanent ESIs and current list of transient ESIs and which combinations of additional ESIs would most improve the reliability of decoding, for example when using an FEC code that is not a priori known to be MDS, such as the RAPTORQ code.

As another variant, the set of current storage nodes that are responsible for executing the pre-storage repair policy may not be the set of all currently active storage nodes, but instead may be restricted to a subset. For example, such current storage nodes may be restricted to those storage nodes that are partial storage nodes, i.e., storage nodes that are not complete.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method, implemented by processor-based logic of a storage system storing source objects as a plurality of fragments upon storage nodes of a plurality of cluster instances of storage system infrastructure components comprising a cluster set, wherein each cluster instance of the plurality of cluster instances operates as a unit for providing reliable storage of a different portion of a source object stored by the storage system, the method comprising:

generating a plurality of first encoding fragments from the source object using a first encoding;

partitioning the plurality of first encoding fragments into a plurality of disjoint sets of first encoding fragments, wherein each set of first encoding fragments of the plurality of disjoint sets of first encoding fragments includes a plurality of first encoding fragments;

assigning a first set of first encoding fragments of the plurality of disjoint sets of first encoding fragments to a first cluster instance of the plurality of cluster instances, wherein the first set of first encoding fragments comprise a portion of the plurality of first encoding fragments of the source object to be stored upon the storage nodes of the first cluster instance of the plurality of cluster instances;

assigning a second set of first encoding fragments of the plurality of disjoint sets of first encoding fragments to a second cluster instance of the plurality of cluster instances, wherein the second set of first encoding fragments comprise a different portion of the plurality of first encoding fragments of the source object to be stored upon the storage nodes of the second cluster instance of the plurality of cluster instances;

generating a plurality of second encoding fragments from the first set of first encoding fragments using a second encoding, wherein the plurality of second encoding fragments include the plurality of first encoding fragments of the first set of first encoding fragments and one or more repair fragments generated from the first encoding fragments of the first set of encoding fragments; and generating a plurality of third encoding fragments from the second set of first encoding fragments using a third encoding, wherein the plurality of third encoding fragments include the plurality of first encoding fragments of the second set of first encoding fragments and one or more repair fragments generated from the first encoding fragments of the second set of encoding fragments.

2. The method of claim 1, wherein the plurality of first encoding fragments included in the plurality of second encoded fragments are directly usable interchangeably to recover first encoding fragments of the plurality of first encoding fragments using a decoding corresponding to the second encoding and to recover source fragments of the source object using a decoding corresponding to the first encoding, and wherein the plurality of first encoding fragments included in the plurality of third encoded fragments are directly usable interchangeably to recover first encoding fragments of the plurality of first encoding fragments using a decoding corresponding to the third encoding and to recover source fragments of the source object using the decoding corresponding to the first encoding.

3. The method of claim 1, further comprising:

performing repair processing to regenerate one or more source fragments of the source object using second encoding fragments stored upon storage nodes of the first cluster instance and third encoding fragments stored upon storage nodes of the second cluster instance.

4. The method of claim 3, wherein the at least one of the second encoding fragments and the third encoding fragments used to regenerate the one or more source fragments are used directly as stored by storage nodes of a respective one of the first or second cluster instance in performing the repair processing.

5. The method of claim 3, further comprising:

independently performing repair processing for each cluster instance of the plurality of cluster instances to regenerate one or more first encoding fragments of a respective set of first encoding fragments assigned to each cluster instance of the plurality of cluster instances.

6. The method of claim 5, wherein the performing repair processing to regenerate the one or more source fragments of the source object comprises a secondary repair process, and wherein the independently performing repair processing for each cluster instance comprises a primary repair process.

7. The method of claim 5, wherein the independently performing repair processing for each cluster instance comprises:

performing repair processing of one or more first encoding fragment of the first set of first encoding fragments assigned to the first cluster instance using second encoding fragments of the plurality of second encoding fragments stored by storage nodes of the first cluster instance; and performing repair processing of one or more first encoding fragment of the second set of first encoding fragments assigned to the second cluster instance using third encoding fragments of the plurality of third encoding fragments stored by storage nodes of the second cluster instance.

8. The method of claim 1, further comprising:
regenerating the source object using second encoding fragments stored upon storage nodes of the first cluster instance and third encoding fragments stored upon storage nodes of the second cluster instance, wherein at least a portion of the second encoding fragments used in the regenerating the source object are used directly as stored by storage nodes of the first cluster instance and at least a portion of the third encoding fragments used in the regenerating the source object are used directly as stored by storage nodes of the second cluster instance.

9. The method of claim 8, wherein the regenerating the source object comprises:
regenerating one or more source fragments from one or more of the second encoding fragments and the third encoding fragments using a decoding corresponding to the first encoding.

10. The method of claim 1, wherein the second encoding and the third encoding are a same erasure code.

11. The method of claim 1, wherein the second encoding and the third encoding are different erasure codes.

12. The method of claim 1, wherein at least one of the second encoding or the third encoding are a large erasure code.

13. The method of claim 1, wherein the first encoding and at least one of the second encoding or the third encoding are a same erasure code.

14. The method of claim 1, wherein the first encoding and at least one of the second encoding or the third encoding are different erasure codes.

15. The method of claim 1, wherein the first encoding is a small erasure code, and wherein the second encoding and the third encoding are large erasure codes.

16. An apparatus of a storage system storing source objects as a plurality of fragments upon storage nodes of a plurality of cluster instances of storage system infrastructure components comprising a cluster set, wherein each cluster instance of the plurality of cluster instances operates as a unit for providing reliable storage of a different portion of a source object stored by the storage system, the apparatus comprising:
one or more data processors; and
one or more non-transitory computer-readable storage media containing program code configured to cause the one or more data processors to perform operations including:
generate a plurality of first encoding fragments from the source object using a first encoding;
partition the plurality of first encoding fragments into a plurality of disjoint sets of first encoding fragments, wherein each set of first encoding fragments of the plurality of disjoint sets of first encoding fragments includes a plurality of first encoding fragments;
assign a first set of first encoding fragments of the plurality of disjoint sets of first encoding fragments to a first cluster instance of the plurality of cluster instances, wherein the first set of first encoding fragments comprise a portion of the plurality of first encoding fragments of the source object to be stored upon the storage nodes of the first cluster instance of the plurality of cluster instances;
assign a second set of first encoding fragments of the plurality of disjoint sets of first encoding fragments to a second cluster instance of the plurality of cluster instances, wherein the second set of first encoding fragments comprise a different portion of the plurality of first encoding fragments of the source object to be stored upon the storage nodes of the second cluster instance of the plurality of cluster instances;
generate a plurality of second encoding fragments from the first set of first encoding fragments using a second encoding, wherein the plurality of second encoding fragments include the plurality of first encoding fragments of the first set of first encoding fragments and one or more repair fragments generated from the first encoding fragments of the first set of encoding fragments; and
generate a plurality of third encoding fragments from the second set of first encoding fragments using a third encoding, wherein the plurality of third encoding fragments include the plurality of first encoding fragments of the second set of first encoding fragments and one or more repair fragments generated from the first encoding fragments of the second set of encoding fragments.

17. The apparatus of claim 16, wherein the plurality of first encoding fragments included in the plurality of second encoded fragments are directly usable interchangeably to recover first encoding fragments of the plurality of first encoding fragments using a decoding corresponding to the second encoding and to recover source fragments of the source object using a decoding corresponding to the first encoding, and wherein the plurality of first encoding fragments included in the plurality of third encoded fragments are directly usable interchangeably to recover first encoding fragments of the plurality of first encoding fragments using a decoding corresponding to the third encoding and to recover source fragments of the source object using the decoding corresponding to the first encoding.

18. The apparatus of claim 16, wherein the program code is further configured to cause the one or more data processors to perform operations including:
perform repair processing to regenerate one or more source fragments of the source object using second encoding fragments stored upon storage nodes of the first cluster instance and third encoding fragments stored upon storage nodes of the second cluster instance.

19. The apparatus of claim 18, wherein the at least one of the second encoding fragments and the third encoding fragments used to regenerate the one or more source fragments are used directly as stored by storage nodes of a respective one of the first or second cluster instance in performing the repair processing.

20. The apparatus of claim 18, wherein the program code is further configured to cause the one or more data processors to perform operations including:
independently perform repair processing for each cluster instance of the plurality of cluster instances to regenerate one or more first encoding fragments of a respective set of first encoding fragments assigned to each cluster instance of the plurality of cluster instances.

21. The apparatus of claim 20, wherein operation of the one or more data processors to perform repair processing to regenerate the one or more source fragments of the source object comprises a secondary repair process, and wherein operation of the one or more data processors to independently perform repair for each cluster instance comprises a primary repair process.

22. The apparatus of claim 20, wherein operation of the one or more data processors to independently perform repair processing for each cluster instance comprises performing operations including:
  perform repair processing of one or more first encoding fragment of the first set of first encoding fragments assigned to the first cluster instance using second encoding fragments of the plurality of second encoding fragments stored by storage nodes of the first cluster instance; and
  perform repair processing of one or more first encoding fragment of the second set of first encoding fragments assigned to the second cluster instance using third encoding fragments of the plurality of third encoding fragments stored by storage nodes of the second cluster instance.

23. The apparatus of claim 16, wherein the program code is further configured to cause the one or more data processors to perform operations including:
  regenerate the source object using second encoding fragments stored upon storage nodes of the first cluster instance and third encoding fragments stored upon storage nodes of the second cluster instance, wherein at least a portion of the second encoding fragments used in the regenerating the source object are used directly as stored by storage nodes of the first cluster instance and at least a portion of the third encoding fragments used in the regenerating the source object are used directly as stored by storage nodes of the second cluster instance.

24. The apparatus of claim 23, wherein operation of the one or more data processors to regenerate the source object comprises performing operations including:
  regenerate one or more source fragments from one or more of the second encoding fragments and the third encoding fragments using a decoding corresponding to the first encoding.

25. An apparatus of a storage system storing source objects as a plurality of fragments upon storage nodes of a plurality of cluster instances of storage system infrastructure components comprising a cluster set, wherein each cluster instance of the plurality of cluster instances operates as a unit for providing reliable storage of a different portion of a source object stored by the storage system, the apparatus comprising:
  means for generating a plurality of first encoding fragments from the source object using a first encoding;
  means for partitioning the plurality of first encoding fragments into a plurality of disjoint sets of first encoding fragments, wherein each set of first encoding fragments of the plurality of disjoint sets of first encoding fragments includes a plurality of first encoding fragments;
  means for assigning a first set of first encoding fragments of the plurality of disjoint sets of first encoding fragments to a first cluster instance of the plurality of cluster instances, wherein the first set of first encoding fragments comprise a portion of the plurality of first encoding fragments of the source object to be stored upon the storage nodes of the first cluster instance of the plurality of cluster instances;
  means for assigning a second set of first encoding fragments of the plurality of disjoint sets of first encoding fragments to a second cluster instance of the plurality of cluster instances, wherein the second set of first encoding fragments comprise a different portion of the plurality of first encoding fragments of the source object to be stored upon the storage nodes of the second cluster instance of the plurality of cluster instances;
  means for generating a plurality of second encoding fragments from the first set of first encoding fragments using a second encoding, wherein the plurality of second encoding fragments include the plurality of first encoding fragments of the first set of first encoding fragments and one or more repair fragments generated from the first encoding fragments of the first set of encoding fragments; and
  means for generating a plurality of third encoding fragments from the second set of first encoding fragments using a third encoding, wherein the plurality of third encoding fragments include the plurality of first encoding fragments of the second set of first encoding fragments and one or more repair fragments generated from the first encoding fragments of the second set of encoding fragments.

26. The apparatus of claim 25, wherein the plurality of first encoding fragments included in the plurality of second encoded fragments are directly usable interchangeably to recover first encoding fragments of the plurality of first encoding fragments using a decoding corresponding to the second encoding and to recover source fragments of the source object using a decoding corresponding to the first encoding, and wherein the plurality of first encoding fragments included in the plurality of third encoded fragments are directly usable interchangeably to recover first encoding fragments of the plurality of first encoding fragments using a decoding corresponding to the third encoding and to recover source fragments of the source object using the decoding corresponding to the first encoding.

27. The apparatus of claim 25, further comprising:
  means for performing repair processing to regenerate one or more source fragments of the source object using second encoding fragments stored upon storage nodes of the first cluster instance and third encoding fragments stored upon storage nodes of the second cluster instance; and
  means for independently performing repair processing for each cluster instance of the plurality of cluster instances to regenerate one or more first encoding fragments of a respective set of first encoding fragments assigned to each cluster instance of the plurality of cluster instances.

28. A non-transitory computer-readable medium comprising codes for a storage system storing source objects as a plurality of fragments upon storage nodes of a plurality of cluster instances of storage system infrastructure components comprising a cluster set, wherein each cluster instance of the plurality of cluster instances operates as a unit for providing reliable storage of a different portion of a source object stored by the storage system, the codes causing the one or more computers to:
  generate a plurality of first encoding fragments from the source object using a first encoding;
  partition the plurality of first encoding fragments into a plurality of disjoint sets of first encoding fragments, wherein each set of first encoding fragments of the plurality of disjoint sets of first encoding fragments includes a plurality of first encoding fragments;

assign a first set of first encoding fragments of the plurality of disjoint sets of first encoding fragments to a first cluster instance of the plurality of cluster instances, wherein the first set of first encoding fragments comprise a portion of the plurality of first encoding fragments of the source object to be stored upon the storage nodes of the first cluster instance of the plurality of cluster instances;

assign a second set of first encoding fragments of the plurality of disjoint sets of first encoding fragments to a second cluster instance of the plurality of cluster instances, wherein the second set of first encoding fragments comprise a different portion of the plurality of first encoding fragments of the source object to be stored upon the storage nodes of the second cluster instance of the plurality of cluster instances;

generate a plurality of second encoding fragments from the first set of first encoding fragments using a second encoding, wherein the plurality of second encoding fragments include the plurality of first encoding fragments of the first set of first encoding fragments and one or more repair fragments generated from the first encoding fragments of the first set of encoding fragments; and generate a plurality of third encoding fragments from the second set of first encoding fragments using a third encoding, wherein the plurality of third encoding fragments include the plurality of first encoding fragments of the second set of first encoding fragments and one or more repair fragments generated from the first encoding fragments of the second set of encoding fragments.

29. The non-transitory computer-readable medium of claim 28, wherein the plurality of first encoding fragments included in the plurality of second encoded fragments are directly usable interchangeably to recover first encoding fragments of the plurality of first encoding fragments using a decoding corresponding to the second encoding and to recover source fragments of the source object using a decoding corresponding to the first encoding, and wherein the plurality of first encoding fragments included in the plurality of third encoded fragments are directly usable interchangeably to recover first encoding fragments of the plurality of first encoding fragments using a decoding corresponding to the third encoding and to recover source fragments of the source object using the decoding corresponding to the first encoding.

30. The non-transitory computer-readable medium of claim 28, wherein the codes further cause the one or more computers to:
perform repair processing to regenerate one or more source fragments of the source object using second encoding fragments stored upon storage nodes of the first cluster instance and third encoding fragments stored upon storage nodes of the second cluster instance; and
independently perform repair processing for each cluster instance of the plurality of cluster instances to regenerate one or more first encoding fragments of a respective set of first encoding fragments assigned to each cluster instance of the plurality of cluster instances.

* * * * *